US008787082B2

(12) United States Patent
Son et al.

(10) Patent No.: US 8,787,082 B2
(45) Date of Patent: *Jul. 22, 2014

(54) SEMICONDUCTOR MEMORY DEVICE COMPRISING THREE-DIMENSIONAL MEMORY CELL ARRAY

(75) Inventors: Byoungkeun Son, Suwon-si (KR); Hansoo Kim, Suwon-si (KR); Youngsoo An, Yongin-si (KR); Mingu Kim, Yongin-si (KR); Jinho Kim, Hwaseong-si (KR); Jaehyoung Choi, Hwaseong-si (KR); Sukhun Choi, Suwon-si (KR); Jae-Joo Shim, Suwon-si (KR); Wonseok Cho, Suwon-si (KR); Sunil Shim, Seoul (KR); Ju-Young Lim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/594,102

(22) Filed: Aug. 24, 2012

(65) Prior Publication Data

US 2012/0322252 A1      Dec. 20, 2012

Related U.S. Application Data

(63) Continuation of application No. 12/752,485, filed on Apr. 1, 2010, now Pat. No. 8,284,601.

(30) Foreign Application Priority Data

Apr. 1, 2009    (KR) .................. 10-2009-0028159
Aug. 26, 2009   (KR) .................. 10-2009-0079243

(51) Int. Cl.
    *G11C 16/04*    (2006.01)

(52) U.S. Cl.
    USPC ............ 365/185.05; 365/185.17; 365/185.26; 365/185.27

(58) Field of Classification Search
    USPC .............. 365/185.05, 185.17, 185.26, 185.27
    See application file for complete search history.

(56) References Cited

U.S. PATENT DOCUMENTS

| 4,124,900 A | 11/1978 | Smith et al. |
| 4,160,291 A | 7/1979 | Smith |
| 5,321,646 A | 6/1994 | Tomishima et al. |
| 6,362,994 B1 | 3/2002 | Raad |

(Continued)

FOREIGN PATENT DOCUMENTS

| CN | 101499320 | 8/2009 |
| JP | 2008103429 | 5/2008 |

(Continued)

*Primary Examiner* — Pho M Luu
(74) *Attorney, Agent, or Firm* — F. Chau & Associates, LLC

(57) ABSTRACT

A semiconductor memory device includes a substantially planar substrate; a memory string vertical to the substrate, the memory string comprising a plurality of storage cells; and a plurality of elongated word lines, each word line including a first portion substantially parallel to the substrate and connected to the memory string and a second portion substantially inclined relative to the substrate and extending above the substrate, wherein a first group of the plurality of word lines are electrically connected to first conductive lines disposed at a first side of the memory string, and a second group of the plurality of word lines are electrically connected to second conductive lines disposed at a second side of the memory string.

9 Claims, 52 Drawing Sheets

(56) References Cited

U.S. PATENT DOCUMENTS

| | | |
|---|---|---|
| 7,361,951 B2 | 4/2008 | Shirota et al. |
| 7,545,672 B2 | 6/2009 | Ueda et al. |
| 7,560,386 B2 * | 7/2009 | Cha et al. ................ 438/700 |
| 7,663,247 B2 | 2/2010 | Hara |
| 7,736,972 B2 * | 6/2010 | Eun ........................ 438/255 |
| 8,048,798 B2 | 11/2011 | Kidoh et al. |
| 8,284,601 B2 * | 10/2012 | Son et al. ............... 365/185.05 |
| 8,409,977 B2 * | 4/2013 | Shim et al. ................ 438/589 |
| 2006/0073658 A1 * | 4/2006 | Ljungcrantz et al. ......... 438/240 |
| 2006/0087005 A1 | 4/2006 | Herner |
| 2008/0099819 A1 | 5/2008 | Kito et al. |
| 2008/0253183 A1 | 10/2008 | Mizukami et al. |
| 2009/0001419 A1 | 1/2009 | Han et al. |
| 2009/0146206 A1 | 6/2009 | Fukuzumi et al. |
| 2009/0180339 A1 | 7/2009 | Kim et al. |
| 2010/0254191 A1 * | 10/2010 | Son et al. ............... 365/185.05 |

FOREIGN PATENT DOCUMENTS

| | | |
|---|---|---|
| JP | 2008-192857 | 8/2008 |
| JP | 2008244485 | 10/2008 |
| JP | 2008263029 | 10/2008 |
| JP | 2009-135324 A | 6/2009 |
| KR | 100855990 B1 | 8/2006 |
| KR | 1020080034816 A | 4/2008 |
| KR | 1020080092290 A | 10/2008 |

* cited by examiner

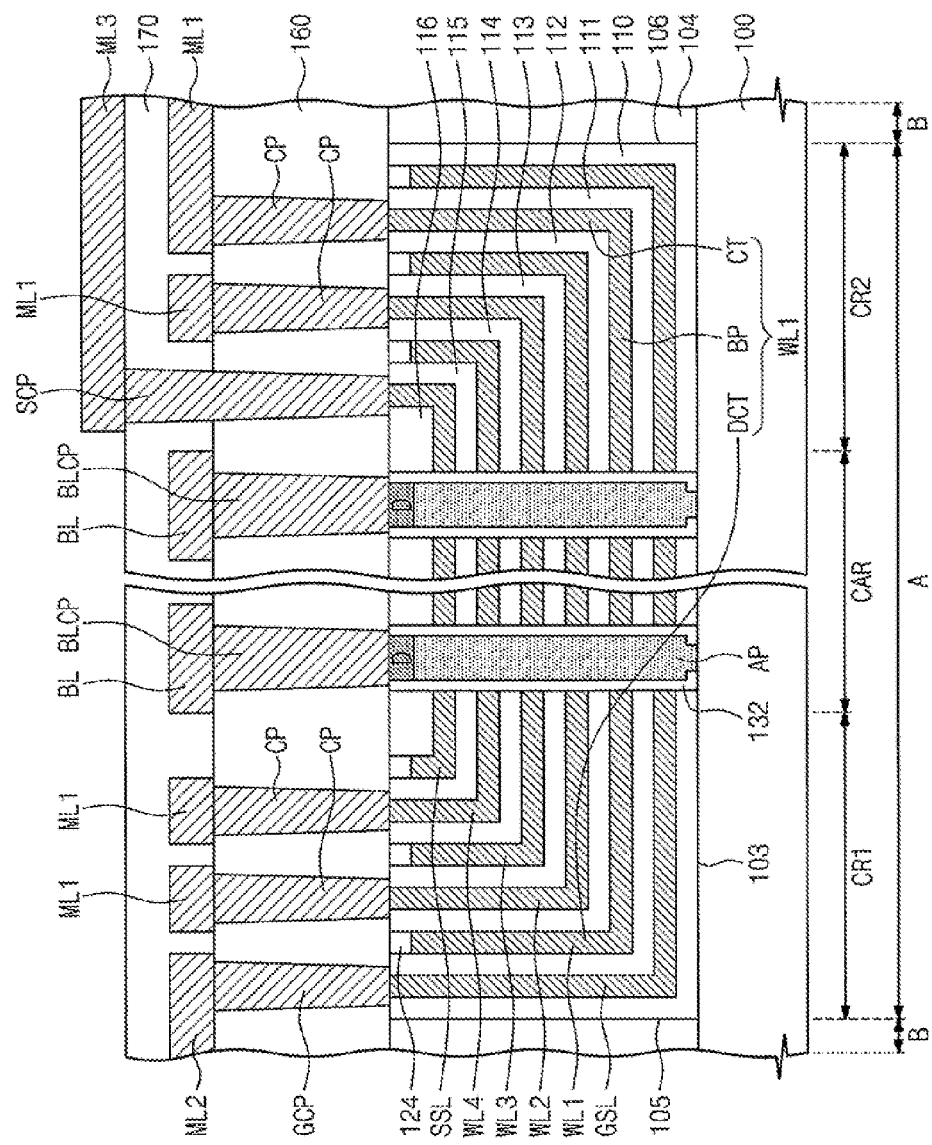

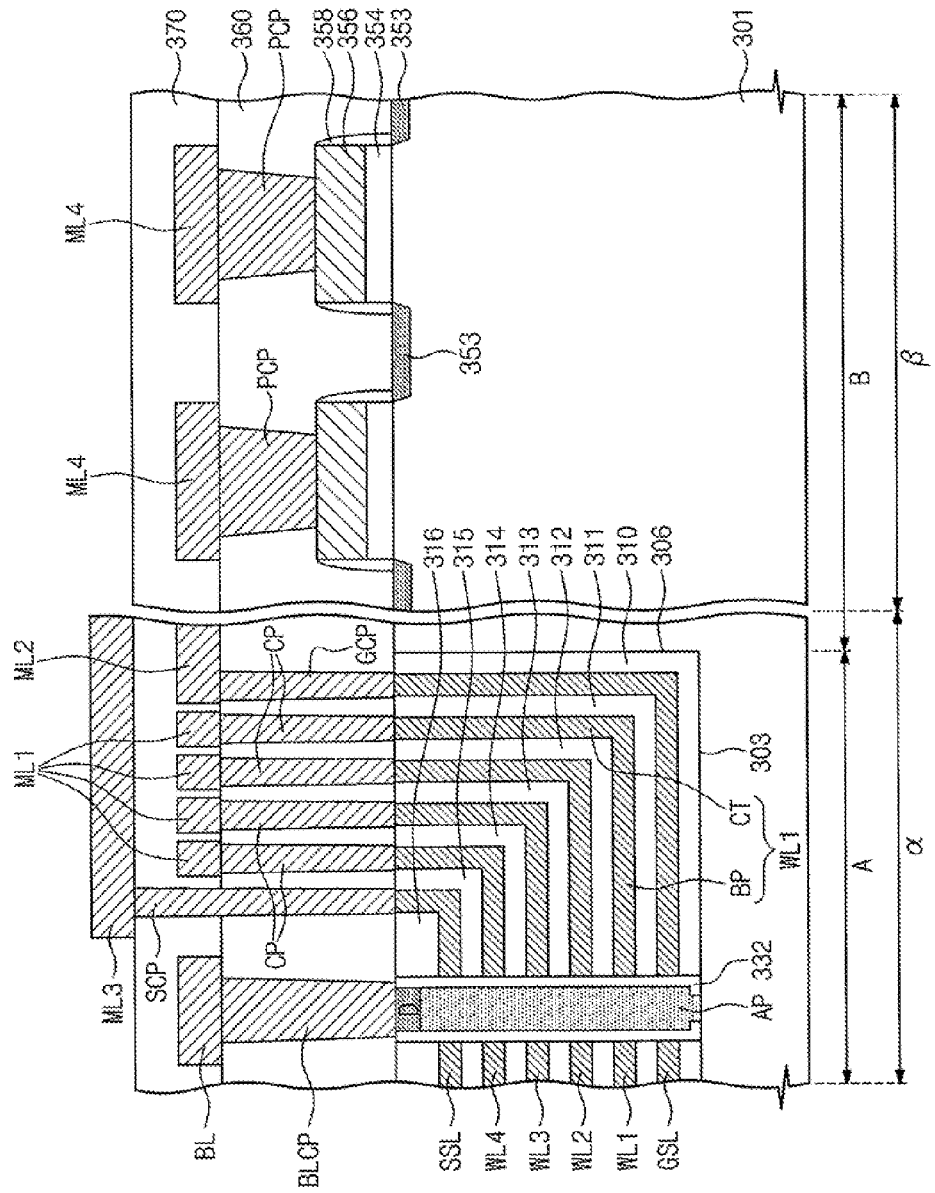

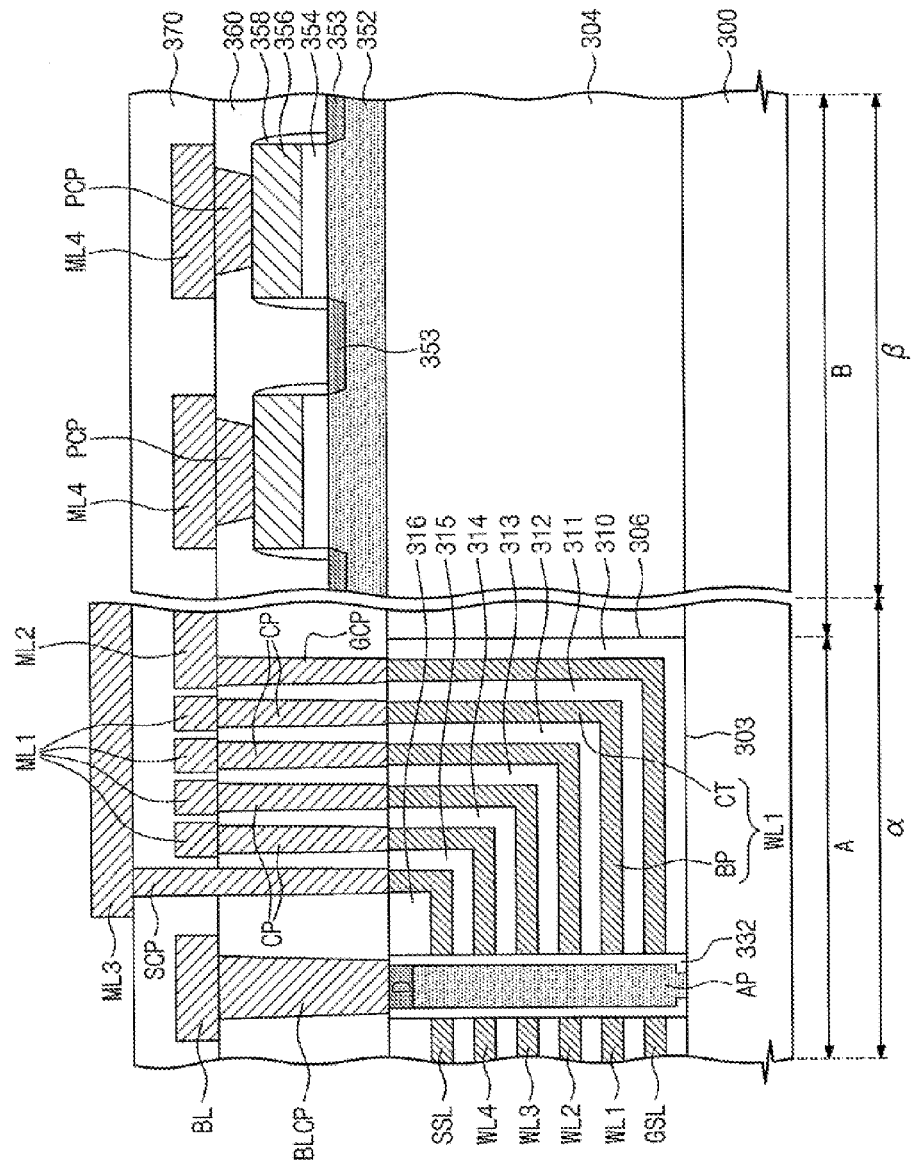

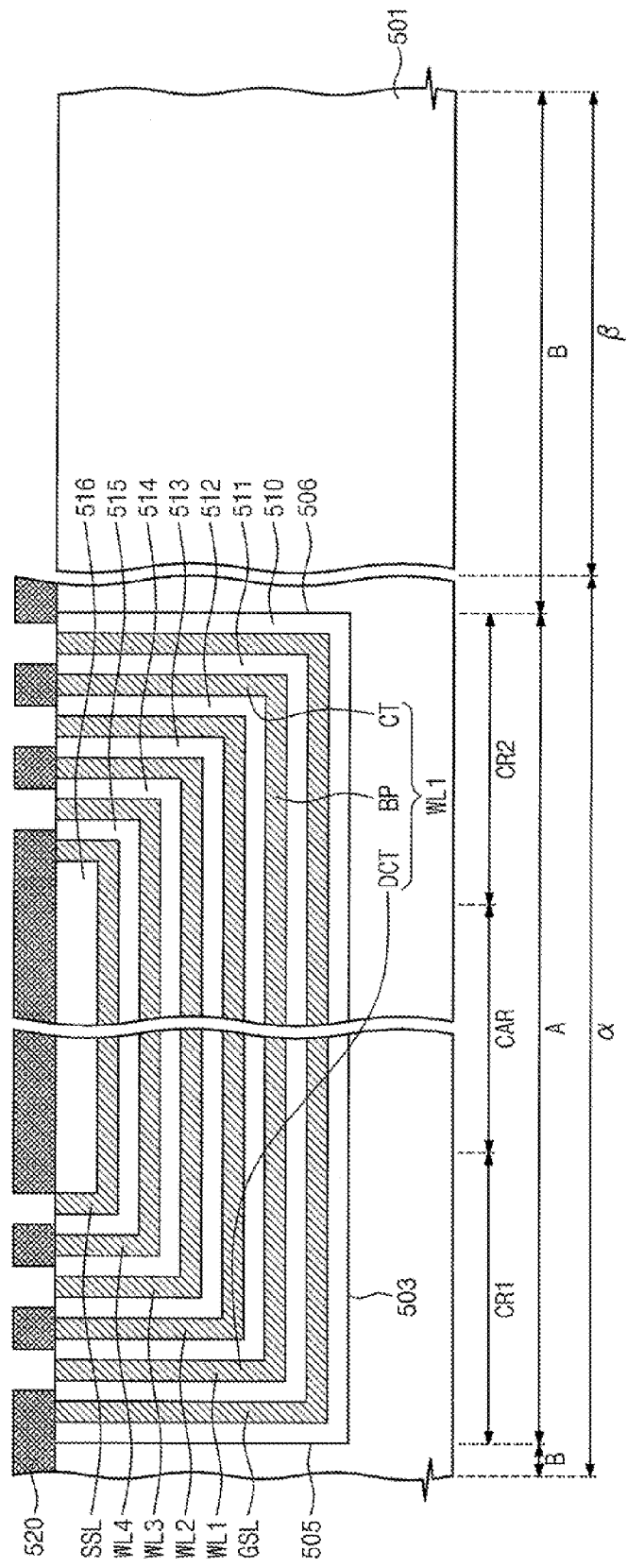

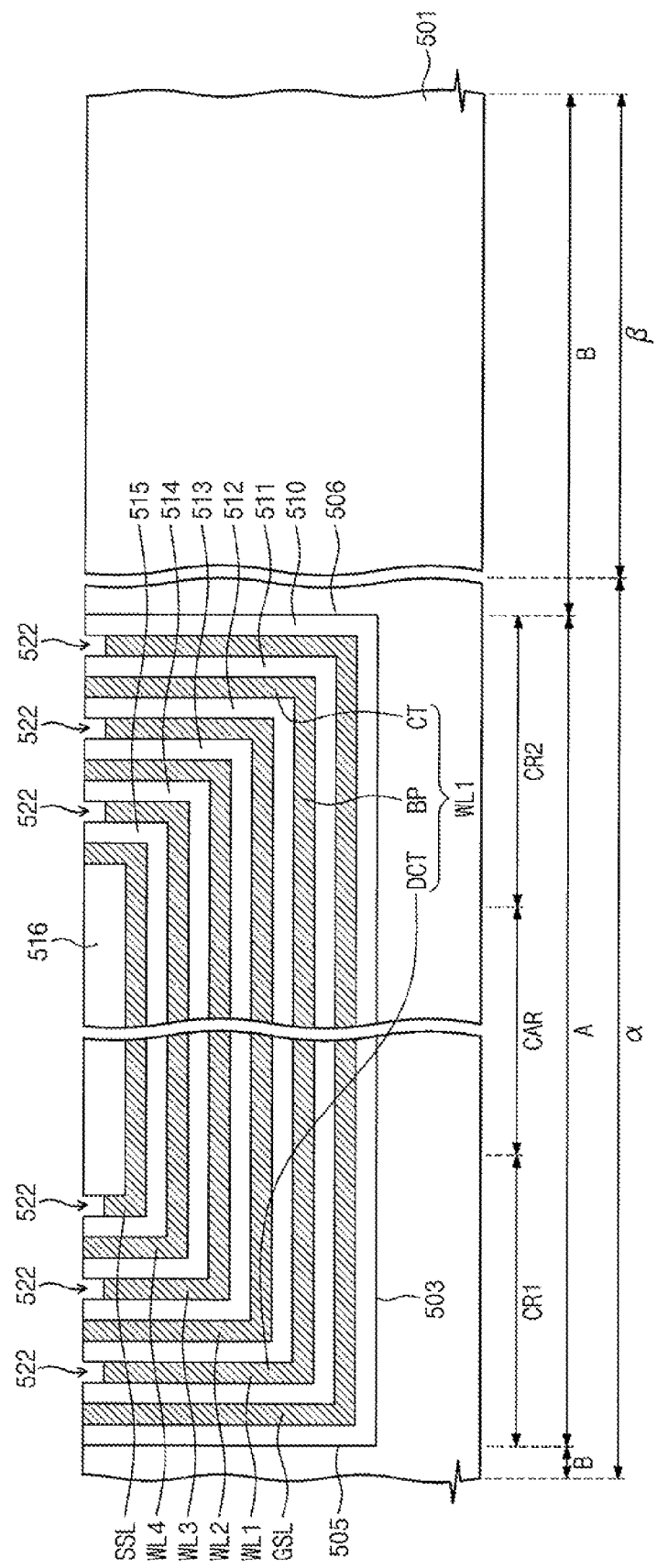

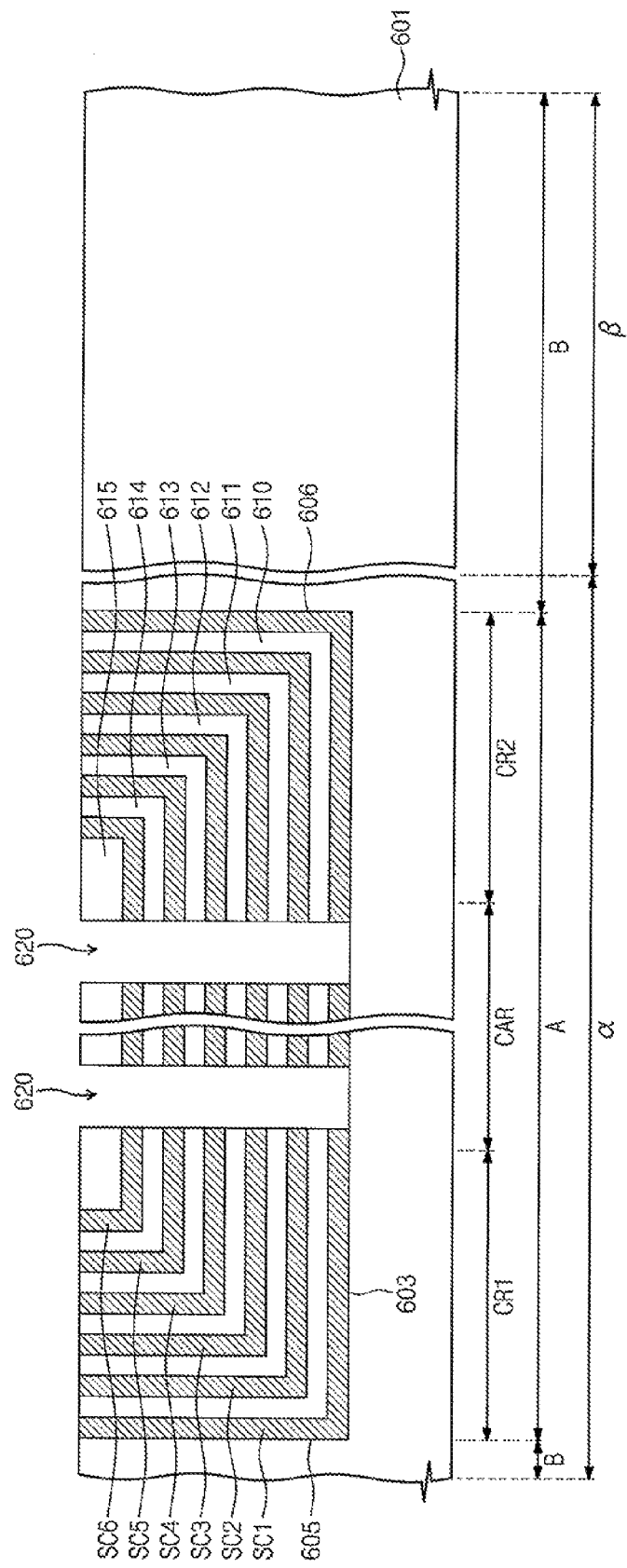

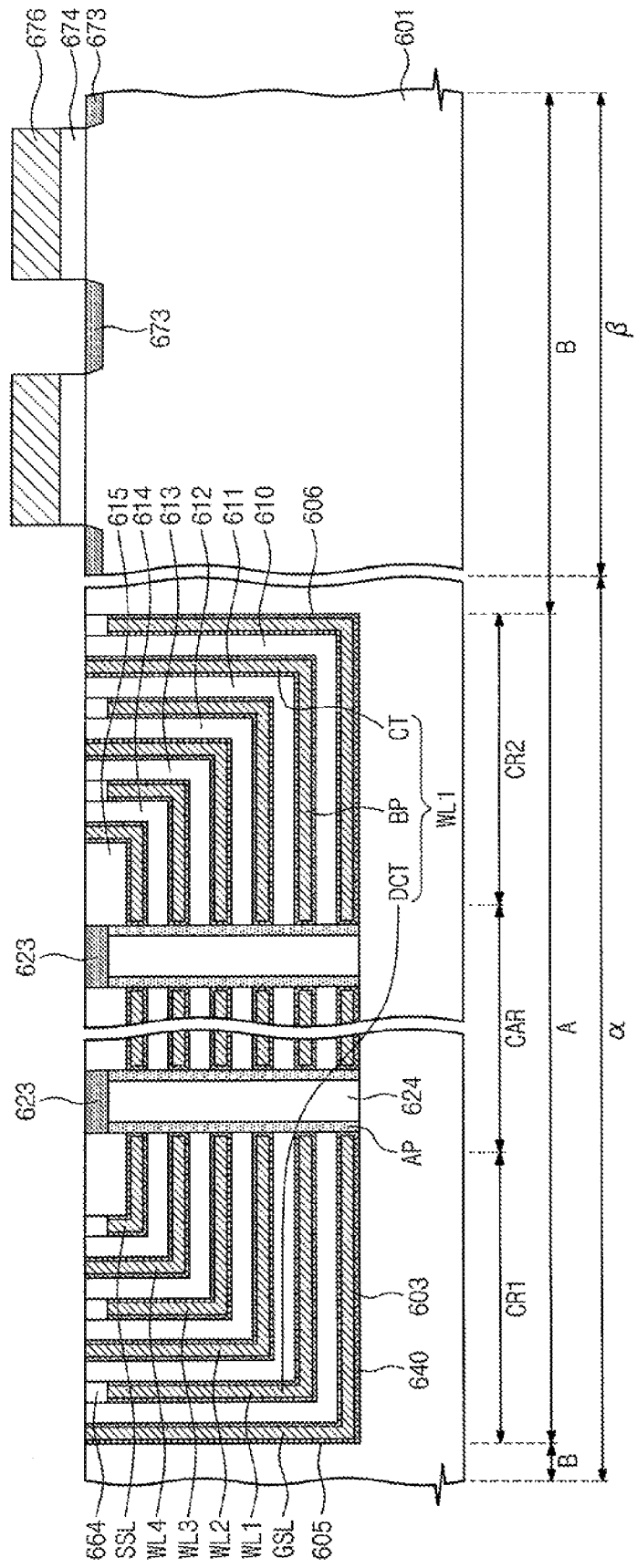

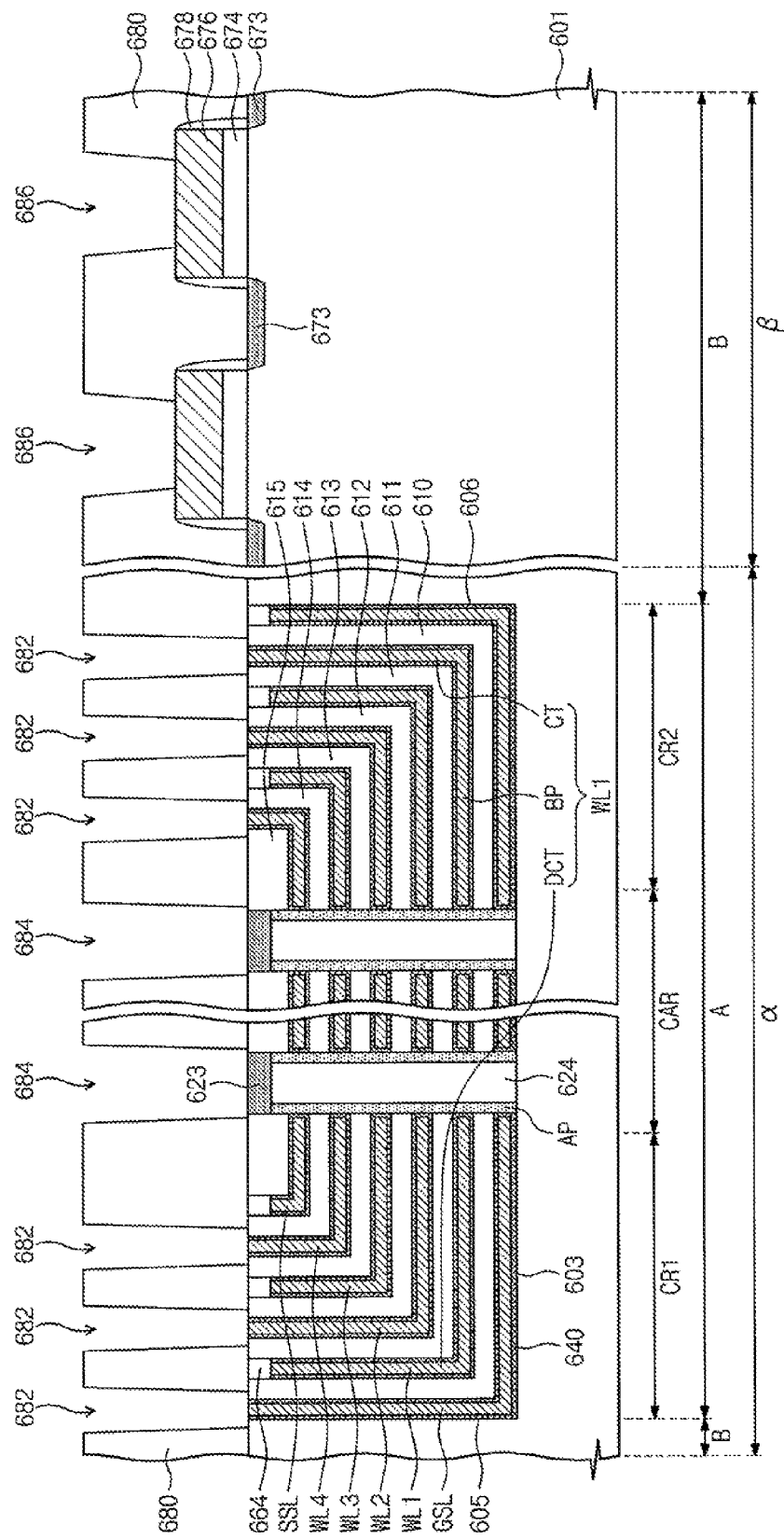

SEMICONDUCTOR MEMORY DEVICE COMPRISING THREE-DIMENSIONAL MEMORY CELL ARRAY

CROSS-REFERENCE TO RELATED PATENT APPLICATION

This application is a Continuation Application of U.S. patent application Ser. No. 12/752,485 filed on Apr. 1, 2010, now U.S. Pat. No. 8,284,601, which claims priority to and the benefit of Korean Patent Application Nos. 10-2009-0028159 filed on Apr. 1, 2009 and 10-2009-0079243 filed on Aug. 26, 2009, in the Korean Intellectual Property Office the entire contents of both of which are incorporated by reference herein.

BACKGROUND

The present disclosure relates to semiconductor devices, and more particularly, to semiconductor memory devices having an improved three-dimensional structure with distributed contact pads.

As the semiconductor industry continues its advance, higher integration of semiconductor devices, less power consumption and/or higher speeds may be required. In particular, since higher integration can increase the specifications of various electronic devices, and this is an important factor in determining product price, the importance of higher integration has been increasing. Thus, to realize such highly integrated semiconductor devices, semiconductor technology has advanced to permit semiconductor devices of diverse structures to be manufactured, thereby departing from traditional substantially flat or two-dimensional semiconductor devices.

As semiconductor devices become highly integrated and diverse semiconductor device structures emerge, it is increasingly difficult to secure process margins for connecting diverse and complex patterns in semiconductor devices to conductive lines and other patterns. If a failure occurs in a semiconductor device manufacturing process, the reliability of the semiconductor device decreases, which may cause lower performance of an electronic device incorporating the semiconductor device. Accordingly, it is desirable to enhance the reliability of highly integrated semiconductor devices by securing the process margins in semiconductor devices having complex patterns.

SUMMARY

One concept of the present disclosure relates to the connection between a cell array and a circuitry outside of the cell array. Therefore, the inventive concept of the present application should not be limited to vertical NAND or VNAND, and shall be understood to apply to three-dimensional memory devices such as RRAM, MRAM, PRAM, and the like. The present disclosure provides a formation method and resulting semiconductor device in accordance with the following exemplary embodiments.

According to an exemplary embodiment, a semiconductor memory device comprises a substantially planar substrate, a substantially planar substrate, a memory string vertical to the substrate, the memory string comprising a plurality of storage cells and a plurality of elongated word lines, each word line including a first portion substantially parallel to the substrate and connected to the memory string and a second portion substantially inclined relative to the substrate and extending above the substrate, wherein a first group of the plurality of word lines are electrically connected to first conductive lines disposed at a first side of the memory string, and a second group of the plurality of word lines are electrically connected to second conductive lines disposed at a second side of the memory string.

A word line of the first group and a word line of the second group of word lines are alternatingly positioned with each other in the direction from top to bottom of the memory string. The inclination of the elongated memory string can be substantially 90 degrees relative to the planar substrate. The first side of the memory string may be opposite to the second side of the memory string.

The first portions of each of the plurality of word lines can be parallel to each other, respectively. The second portions of each of the plurality of word lines at the first side of the memory string can be parallel to each other, respectively, and the second portions of each of the plurality of word lines at the second side of the memory string can be parallel to each other, respectively.

The first alternating word lines can be disposed on odd numbered storage cells counting from top to bottom of the memory string, respectively, and the second alternating word lines can be disposed on even numbered storage cells counting from top to bottom of the memory string, respectively.

The device may further comprise insulating caps disposed at the elevated ends of the second portions of even numbered word lines at the first side of the memory string, and at the elevated ends of the second portions of odd numbered word lines at the second side of the memory string.

The device may further comprise a third group of word lines connected to a third conductive line disposed on a third side of the memory string, wherein the first group of word lines connect to modulus three remainder one numbered storage cells counting from top to bottom of the memory string, respectively, the second group of word lines connect to modulus three remainder two numbered storage cells counting from top to bottom of the memory string, respectively, and the third group of word lines connect to modulus three remainder zero numbered storage cells counting from top to bottom of the memory string, respectively.

Each of the plurality of storage cells and corresponding word lines may occupy a different plane disposed parallel to the plane of the substrate. Contiguous portions of a word line disposed in the same plane on different sides of the memory string can be electrically connected as one word line. The substrate can be horizontal when the memory string is vertical, and the device may further comprise a peripheral area disposed on a surface at or above the top of the vertical memory string.

The device may further comprise a plurality of conductive patterns for contact pads between the first alternating word lines and the first conductive lines, and between the second alternating word lines and the second conductive lines. The device may further comprise a peripheral area disposed above the planar substrate.

The peripheral area can be disposed in the same level as the lower surface of conductive patterns, or on top of the chamber. The inclined second portions of the word lines can be disposed at an inclination angle between about 50 and about 90 degrees relative to the substrate. Inclined second portions may extend from both ends of the first portion of each word line, and one of each pair of inclined second portions from each word line can be terminated with an insulating cap.

The device may further comprise a plurality of bit lines disposed substantially perpendicular to each of the memory string and the word lines. The device may further comprise a chamber having a silicon (Si) recess in the substrate, where the elongated memory string and elongated word lines can be disposed in the Si recess.

The device may further comprise a chamber having an insulating wall disposed on top of the substrate, where the elongated memory string and elongated word lines can be disposed within the periphery of the insulating wall. The elongated word lines may comprise metal or silicide. The memory string structure comprising the plurality of storage cells can be substantially columnar, pillar, tubular, or bar-sided.

The device may further comprise at least two row decoders, one row decoder disposed on the side of the odd numbered storage cells and another row decoder disposed on the side of the even numbered storage cells. A first of the two row decoders can be connected to either even or odd string select lines (SSLs) and even word lines, and a second row decoder of the two can be connected to either odd or even SSLs and odd word lines, respectively. A first row decoder of the two may be connected to all of the string select lines (SSLs) and either even or odd word lines, and a second row decoder of the two is connected to either odd or even word lines, respectively.

The substrate can comprise Si, the insulating layers can comprise $SiO_2$, and the word lines can comprise metal. Each storage cell may comprise a control gate, a first insulating region, a charge storage region and a second insulating region. Each storage cell may comprise a metal gate as a control gate, a high-k region as a blocking layer, a nitride region as a charge storage layer, an oxide region as a tunnel layer.

According to an exemplary embodiment, a method of forming a semiconductor memory device comprises providing a substrate, forming a chamber on the substrate, depositing a plurality of alternating insulating layers and sacrificial layers in the chamber, each layer having a horizontal first portion and at least one inclined second portion, forming a hole substantially normal to the substrate and extending through the layers to the substrate, depositing a vertically inclined memory string into the hole, the memory string comprising a plurality of storage cells, replacing the sacrificial layers with conductive layers to form a plurality of elongated word lines, respectively, and connecting first alternating word lines of the plurality to conductive lines disposed at a first side of the memory string, and second alternating word lines of the plurality to conductive lines disposed at a second side of the memory string.

The method may further comprise forming a peripheral area on a surface at the level of the top of the memory string. The vertical memory string can be bar-sided; the method may further comprise forming a trench for x-cut to divide the memory string into two parallel strings. The substrate can comprise Si, the insulating layers can comprise $SiO_2$, and the word lines can comprise metal. The chamber can be recessed directly into the substrate.

The chamber can be formed on top of the substrate by forming insulating sidewalls thereon. Each storage cell may comprise a metal gate as a control gate, a first insulating region, a charge storage region and a second insulating region. Each storage cell may comprise a metal gate as a control gate, a high-K region as a blocking layer, a nitride region as a charge storage layer and an oxide region as a tunnel layer.

According to an embodiment, a semiconductor memory device may comprise a substrate, a memory string disposed on and substantially normal to the substrate, the memory string comprising a plurality of storage cells, and a plurality of word lines, each word line includes a first portion substantially parallel to the substrate and coupled to the memory string and a second portion substantially inclined relative to the substrate and extending upwardly, wherein first alternating word lines of the plurality are electrically connected to first conductive lines disposed at a first side of the memory string, and second alternating word lines of the plurality are electrically connected to second conductive lines disposed at a second side of the memory string.

According to an exemplary embodiment, a semiconductor memory device comprises a substrate, a memory string disposed on and substantially normal to the substrate, the memory string comprising a plurality of storage cells, and a plurality of word lines, each word line includes a first portion substantially parallel to the substrate and coupled to the memory string and a second portion substantially inclined relative to the substrate and extending upwardly, wherein the word lines comprise first word lines selectively connected to first conductive lines disposed at a first side of the memory string, and second word lines selectively connected to second conductive lines disposed at a second side of the memory string.

The word lines may comprise at least one dummy word line. The first side may have a first row decoder and the second side may have a second row decoder.

According to an exemplary embodiment, a semiconductor memory device may comprise a substrate, a memory string disposed on and substantially normal to the substrate, the memory string comprising a plurality of storage cells, a plurality of word lines; and at least two row decoders, wherein word lines have a first group of word lines electrically connected to one row decoder at a first side of the memory string and a second group of word lines electrically connected to the other row decoder at a second side of the memory string. In the device as one embodiment of the present disclosure, the first row decoder is connected to one group of string select lines (SSLs) at a first side of the memory string, and the second row decoders is connected to another group of SSLs at a second side of the memory string. Alternatively, in the device of the present disclosure, either one of the two row decoders may be connected to all of the string select lines (SSLs).

According to an exemplary embodiment, a method of forming a semiconductor memory device comprises providing a substrate, forming a chamber on the substrate, depositing a plurality of alternating insulating layers and conductive layers in the chamber, the conductive layers forming a plurality of word lines, each layer having a horizontal first portion and at least one inclined second portion, forming a hole substantially normal to the substrate and extending through the layers to the substrate, depositing a vertically inclined memory string into the hole, the memory string comprising a plurality of storage cells, and connecting first alternating word lines of the plurality to contact pads disposed at a first side of the memory string, and second alternating word lines of the plurality to contact pads disposed at a second side of the memory string.

BRIEF DESCRIPTION OF THE DRAWINGS

The present disclosure provides a formation method and resulting semiconductor device with distributed connections to conductive lines, with or without contact pads in accordance with the following exemplary figures, in which like reference indicia may be used to indicate like elements, where:

FIG. 2B shows a schematic sectional view taken along line I-I' of FIGS. 1A and 1B in accordance with an exemplary embodiment of the present disclosure;

FIG. 8A shows a schematic sectional view taken along line III-III' of FIG. 7 showing also peripheral circuitry in accordance with an exemplary embodiment of the present disclosure;

FIG. 8B shows a schematic sectional view taken along line III-III' of FIG. 7 in accordance with an exemplary embodiment of the present disclosure;

FIGS. 13A through 13H show schematic cross-sectional views for explaining a method of forming a semiconductor device in accordance with an exemplary embodiment of the present disclosure;

FIGS. 16A to 16I show schematic cross-sectional views for explaining a method of forming a semiconductor device in accordance with an exemplary embodiment of the present disclosure;

DETAILED DESCRIPTION OF PREFERRED EMBODIMENTS

Figure 1A:
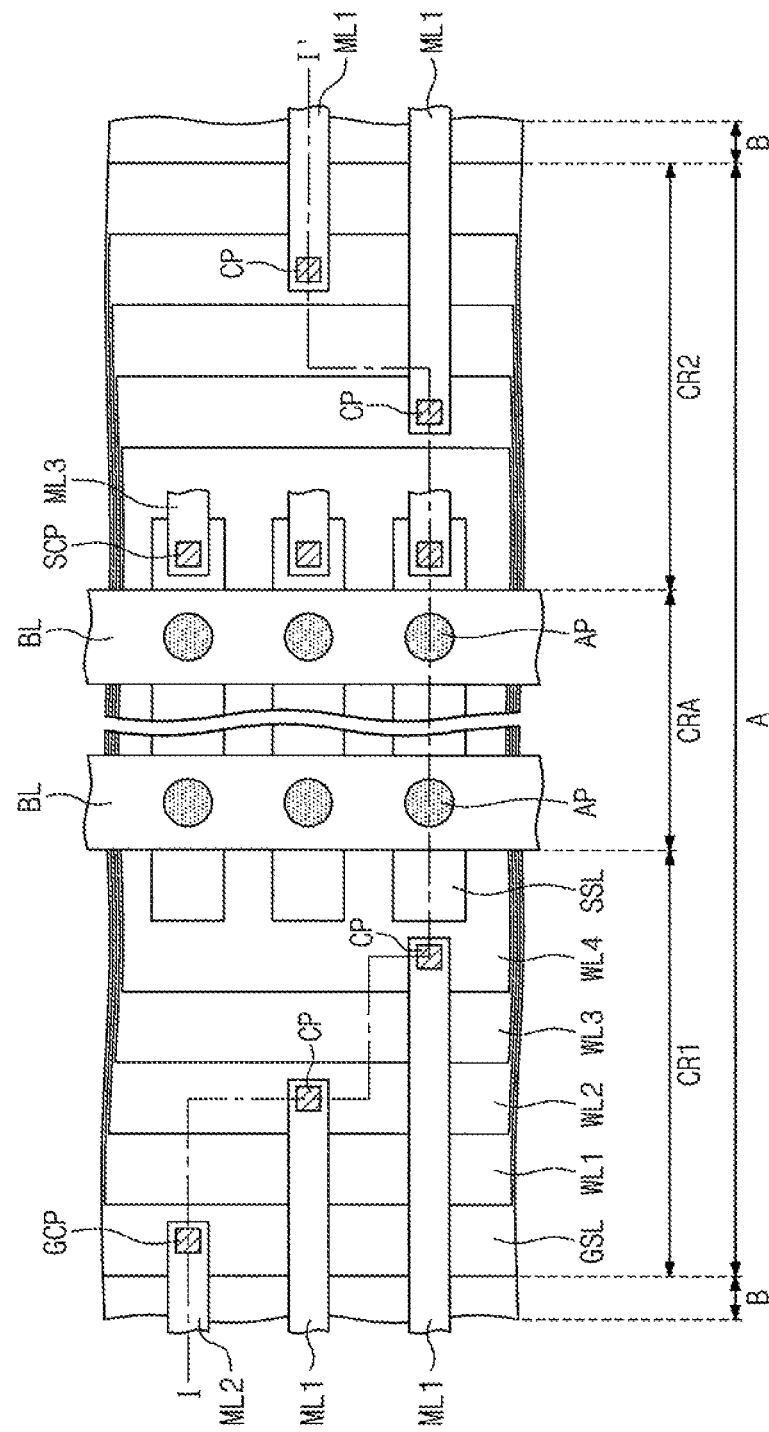
FIGS. 1A and 1B show schematic plan views for a semiconductor device in accordance with an exemplary embodiment of the present disclosure.

Exemplary embodiments of the present disclosure provide three-dimensional semiconductor memory structures with improved and distributed contact area margins. Particularly preferred embodiments exhibit improved contact process margins for greater reliability. In addition, the present disclosure provides a layout of connections between either word lines or word lines and string select lines, and at least two row decoders Exemplary embodiments of the inventive concept are described in greater detail with reference to the accompanying drawings. The inventive concept may, however, be embodied in different forms and shall not be construed as being limited to the embodiments set forth herein. Rather, these embodiments are provided so that this disclosure will be thorough and complete, and will convey the scope of the inventive concept to those skilled in the art. In addition, since reference indicia such as numerals and/or characters are used for the exemplary embodiments, such reference numerals and/or characters provided according to the order of the explanation are not necessarily limited to that order. In the figures, the dimensions of layers and regions may be exaggerated for clarity of illustration. It will also be understood that when an element or feature, such as a layer or a film, is referred to as being 'on' another element or feature, such as another layer or a substrate, it can be directly on the other layer or substrate, or intervening layers may also be present. As used herein, the term "and/or" includes any and all combinations of one or more of the associated listed items.

Figure 1B:
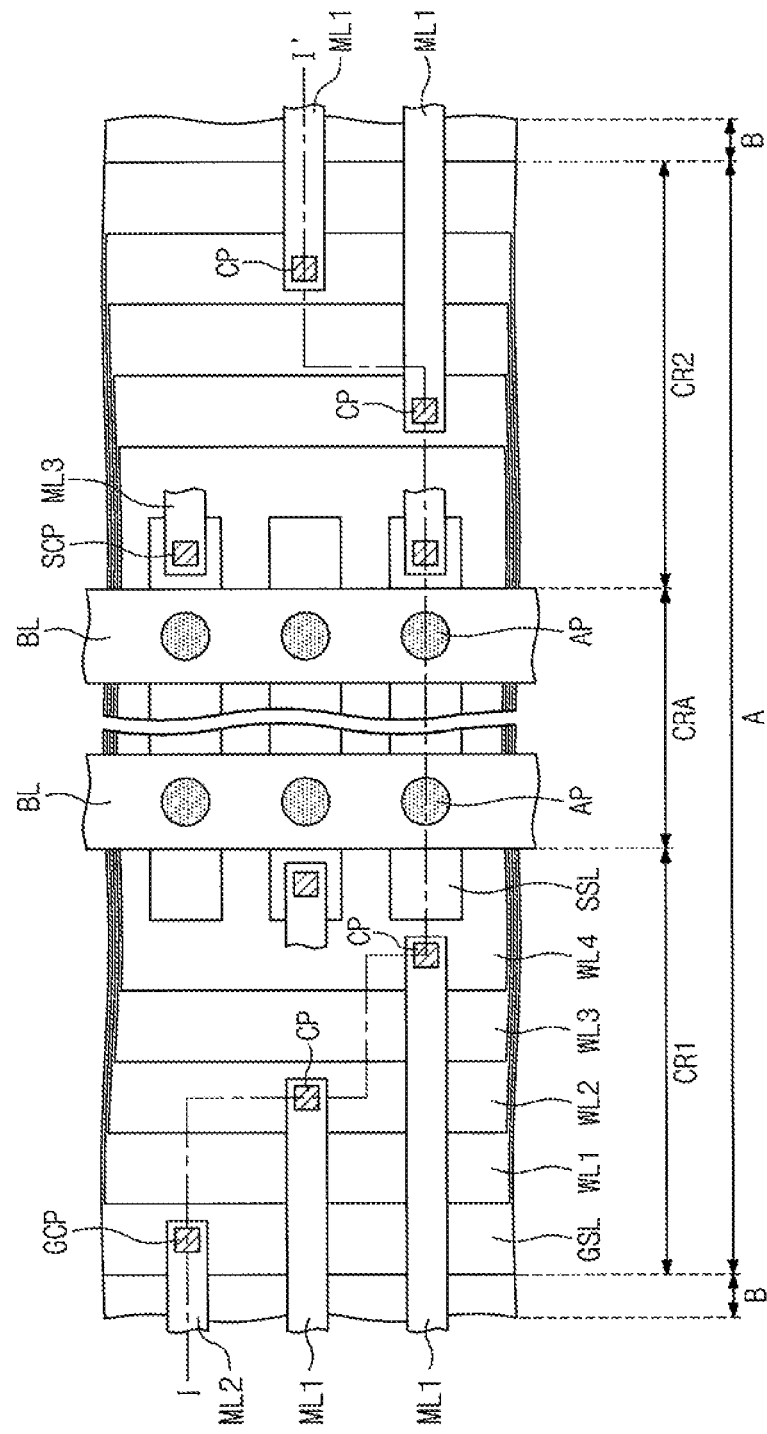
Figure 2A:
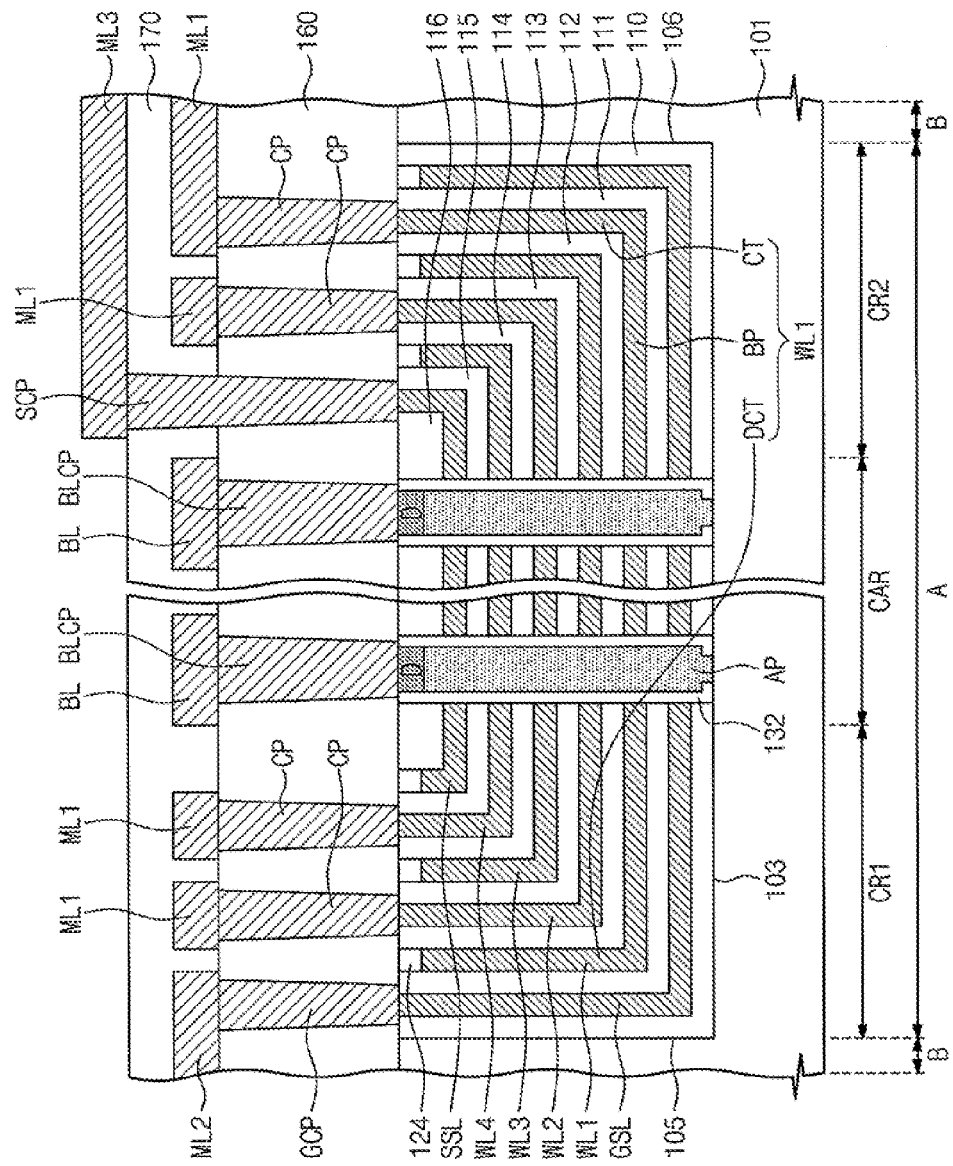
FIG. 2A shows a schematic sectional view taken along the line I-I' of FIGS. 1A and 1B in accordance with an exemplary embodiment of the present disclosure.

A semiconductor device according to a first embodiment of the inventive concept will now be described. FIGS. 1A through 1B show a plan view for explaining a semiconductor device according to an embodiment of the inventive concept, and FIG. 2A is a sectional view taken along the line I-I' of FIGS. 1A through 1B.

The semiconductor device of the present disclosure includes a memory cell array region, a row decoder, a column decoder, an interconnection to connect the memory cell array to outside element of the semiconductor device, for example a voltage generator or generating unit and a control unit. Interconnection may be connected to conductive via or plug, pad that vertically extends to other layers, patterns, or lines.

The semiconductor device of the present disclosure includes three dimensionally a plurality of memory cells. As one of our embodiment of the disclosure, the memory device includes a memory string that vertically extends on the planar substrate. The memory string may include a control gate, a first insulating layer, a charge storage layer, a second insulating layer, and an active region where a channel will be formed. A charge storage layer may be an insulating layer or nano-dots that can trap charges or any other information storage region may be changeable. The insulating layer for charge storage comprises silicon nitride or silicon oxy-nitride wherein the content of nitride is sufficiently richer that that of oxygen. A first insulating layer is positioned between the active region and the charge storage layer. The first insulating layer may comprise silicon oxide or thin (e.g., between about 5 and about 150 angstroms) multilayers comprising any of silicon oxide, silicon oxy-nitride and silicon nitride. The second insulating layer may be positioned between the charge storage layer and the control gate. The second insulating layer may be any of silicon oxide, high-k material, aluminum oxide and combination thereof.

The active region may be of various types. For example, the shape may be of pillar or columnar, tubular, or bar-sided shape. The tubular active region may surround a core of insulating material.

Referring to FIGS. 1A through 1B and 2A, a substrate 101 is provided. The substrate 101 may be a semiconductor-based substrate and may be substantially planar. The substrate may be of silicon, preferably of monocrystalline Si. The substrate 101 may include a doped region for example a well that includes a first type dopant. A source region may be disposed in the substrate 101. Some group of memory strings can share one source line, a common source line. The common source region may be disposed in a plate form or some portion within a cell region of the substrate. The common source region may include a high concentration of a second conductive type, which is different from the conductive type of the dopant included in the well. For example, in the case where the well includes a p-type dopant, the common source region may include a high concentration of n-type dopant.

The substrate 101 may be horizontally planar. The protruded portion may be formed on the substrate 101. The protruded portion may be deposited on the substrate 101. The material of the protruded portion may be of silicon or of insulating layer. The resultant surface includes a concave portion A, or a chamber from the planar substrate 101 and convex portion B from the protruded portion. The concave portion A may include a bottom surface 103, and first and second sidewalls 105 and 106 facing each other. The resultant substrate 101 may include a convex portion or portions B extended from the first and second sidewalls 105 and 106. A top surface of the convex portion B may be in parallel with the bottom surface 103 of the concave portion A. The concave portion A and the convex portion B may be alternatively formed by etching a portion of a semiconductor substrate corresponding to the concave portion A and leaving a portion of the semiconductor substrate corresponding to the convex portion B. In this case, the substrate 101 may be one body substrate. A memory cell may be disposed in the concave portion A. If the protruded portion may be formed of an insulating layer and peripheral circuitry is to be formed on the protruded portion, silicon layer is further formed on the protruded portion for Silicon on Insulator (SOI) type.

Next, the memory cell will be described. The concave portion A forming a chamber may have a first contact region CR1 adjacent to the first sidewall 105, and a second contact region CR2 adjacent to the second sidewall 106. A cell array region CAR may be disposed between the first contact region CR1 and the second contact region CR2. That is, the first contact region CR1 and the second contact region CR2 may be spaced apart from each other with the cell array region CAR in-between. Conductive patterns GSL, WL1-WL4, SSL spaced apart from one another may be disposed on the substrate 101. The conductive patterns GSL, WL1-WL4, SSL may include a ground select line GSL, word lines WL1-WL4, and a string select line (SSL), respectively on the concave portion A of the substrate 101, which may be formed by sequentially stacking them along a resultant surface. Moreover, interlayer insulators may be disposed between the adjacent word lines for inhibiting unwanted short between such adjacent conductive patterns. The memory device of the present disclosure may comprise dummy word lines near GSL and/or SSL or between word lines. The word lines, GSL and SSL may be formed by stacking conductive lines and interlayer insulating layers. In another embodiment, stacking word lines, GSL and SSL and interlayer insulating layers may be conducted multiple times.

The memory array may be of three dimensional, which means that a plurality of memory cells that can store information may be disposed on and/or above the planar substrate. A switching element for activating a memory cell may be of a transistor or a diode type. The type of a memory cell may be volatile or non-volatile. For example, the memory device of the present disclosure may be a flash memory device.

The active memory string structure region for a three-dimensional memory may be parallel or vertical to the planar substrate 101. Preferably, the active memory string structure may be vertical on the planar substrate. The active memory string structure may be formed of silicon; the shape of the active memory string structure may be columnar, pillar, tubular or bar-sided. The active memory string structure may be formed of monocrystalline silicon, polycrystalline silicon, or the like. The active memory string structure may be formed with amorphous silicon then transforming to polycrystalline silicon.

A memory string is vertical to the planar substrate, comprising a control gate, a first insulating layer, a charge storage layer, a second insulating layer, and an active memory string. A memory string has a first side and a second side. The insulating layer for charge storage comprises silicon nitride or silicon oxy-nitride wherein the content of nitride is sufficiently richer that that of oxygen. A first insulating layer is positioned between the active region and the charge storage layer. The first insulating layer may comprise silicon oxide or thin (e.g., between about 5 and about 150 angstroms) multilayers comprising any of silicon oxide, silicon oxy-nitride and silicon nitride. The second insulating layer may be positioned between the charge storage layer and the control gate. The second insulating layer may be any of silicon oxide, high-k material, aluminum oxide and combination thereof.

The conductive patterns GSL, for example, WL1-WL4, SSL are spaced apart from one another with inter-gate insulating layers 111-116 in-between. For example, the ground select line GSL, the first inter-gate insulating layer 111, the first word line WL1, the second inter-gate insulating layer 112, the second word line WL2, the third inter-gate insulating layer 113, the third word line WL3, the fourth inter-gate insulating layer 114, the fourth word line WL4, the fifth inter-gate insulating layer 115 and the string select line SSL may be sequentially stacked.

A ground select insulating layer 110 are disposed between the bottom surface 103 of the concave portion A, the first and second sidewalls 105, 106, and the ground select line GSL. A string select insulating layer 116 may be disposed on the string select line SSL. The insulating layers 110-115 include bottom portions above the bottom surface 103 of the concave portion A, and sidewall portions extended over the first sidewall 105 and the second sidewall 106 from the bottom portions thereof.

The conductive patterns GSL, WL1-WL4, SSL include bottom portions BP disposed above the bottom surface 103 of the concave portion A. The bottom portions BP may be in parallel with the bottom surface 103.

The conductive patterns GSL, WL1-WL4, SSL may include upwardly inclining portions. The upwardly inclining portion may include contact inclining portion CT, which is extended over one of the first sidewall 105 and the second sidewall 106 from one ends of the bottom portions BP. A contact region where the inclining portion of any one of the conductive patterns is disposed may be different from a contact region where the inclining portion of another conductive pattern adjacent to the any one of the conductive patterns. For example, in the case where the contact inclining portion CT of the ground select line GSL is disposed in the first contact region CR1, the contact inclining portion CT of the first word line WL1 adjacent to the ground select line GSL may be disposed in the second contact region CR2.

An extended line of the contact inclining portion CT may cross the bottom surface 103. For example, the extended line may cross the bottom surface 103 at a right angle. In one embodiment of the present disclosure, a top surface of the contact inclining portion CT may be coplanar with the top surface of the convex portion B. An angle between the inclining portion CT and the bottom portion BP may be 50 to 90°.

The conductive patterns GSL, WL1-WL4, SSL may also include dummy inclining portions DCT extended over the other one of the first sidewall 105 and the second sidewall 106 from the other ends of the bottom portions BP on the bottom surface 103. A contact region where the dummy inclining portion of any one of the conductive patterns GSL, WL1-WL4, SSL is disposed may be different from a contact region where the dummy inclining portion of another conductive pattern adjacent to the any one of the conductive patterns. For example, in the case where the dummy inclining portion DCT of the string select line SSL is disposed in the first contact region CR1, the dummy inclining portion DCT of the fourth word line WL4 adjacent to the string select line SSL may be disposed in the second contact region CR2.

Each of the conductive patterns GSL, WL1-WL4, SSL may include one contact inclining portion CT and one dummy inclining portion DCT. In one of the conductive patterns GSL, WL1-WL4, SSL, a length of the dummy inclining portion DCT may be shorter than that of the contact inclining portion CT. The contact inclining portion CT may be disposed between the dummy inclining portions DCT adjacent to each other. The contact inclining portions CT adjacent to one of the dummy inclining portions DCT may be spaced apart from each other by the sidewalls of the insulating layers interposed therebetween. In other words, some group of word lines are connected to conductive lines at a first side of the memory string, and some group of word lines are connected to conductive lines at a second side of the memory string, thereby obtaining more contact margin for interconnection.

A dummy insulating layer pattern 124 may be disposed on the dummy inclining portion DCT. A top surface of the dummy insulating layer pattern 124 may be coplanar with the top surface of the convex portion B. The top surface of the dummy insulating layer pattern 124 may be coplanar with a top surface of the string select insulating layer 116. Sidewalls of the dummy insulating layer pattern 124 may be coplanar with sidewalls of the dummy inclining portion DCT. The dummy insulating layer pattern 124 may include the same material as the insulating layers 110-116.

Conductive plugs may be disposed on the contact inclining portions CT of the word lines WL1-WL4, respectively. The conductive plugs may be word line contact plugs CP. The word lines WL1-WL4 may be electrically connected with the word line contact plugs CP, respectively. Widths of the word line contact plugs CP may be wider than those of the top surfaces of the contact inclining portions CT of the word lines WL1-WL4. The widths of word line contact plugs CP may be greater than widths between the dummy inclining portions DCT adjacent to the contact inclining portions CT of the word lines WL1-WL4. The word line contact plugs CP may penetrate a first interlayer insulating layer 160. First conductive lines ML1 may be disposed on the word line contact plugs CP and the first interlayer insulating layer 160. The word line contact plugs CP may be electrically connected with the first conductive lines ML1. Some of the first conductive lines ML1 may extend in a first direction. Other first conductive lines ML1 may extend in a second direction opposite to the first direction. For example, the first conductive lines ML1 connected with the word lines WL2, WL4 positioned at odd-numbered layers of the conductive patterns above the substrate 101 may extend in the first direction, and the first conductive lines ML1 connected with the word lines WL1, WL3 positioned at even-numbered layers of the conductive patterns above the substrate 101 may extend in the second direction. The first direction may be a direction from I' to I. The first conductive lines ML1 may be electrically connected with the word lines WL1-WL4 through the word line contact plugs CP. Alternatively, the first conductive lines ML1 may be directly connected with the word lines WL1-WL4. A second interlayer insulating layer 170 covering the first conductive lines ML1 may be disposed. The first and second interlayer insulating layers 160 and 170 may include the same material.

A conductive plug may be disposed on the contact inclining portion CT of the ground select line GSL. The conductive plug may be a ground select contact plug GCP. The ground select line GSL may be electrically connected with the ground select contact plug GCP. A width of the ground select contact plug GCP may be wider than a width of a top surface of the contact inclining portion CT of the ground select line GSL. The ground select contact plug GCP may penetrate the first interlayer insulating layer 160. A second conductive line ML2 may be disposed on the ground select contact plug GCP and the first interlayer insulating layer 160. The ground select contact plug GCP may be electrically connected with the second conductive line ML2. The second conductive line ML2 may extend in the first direction. The second conductive line ML2 may be electrically connected with the ground select line GSL through the ground select contact plug GCP. Alternatively, the ground select line GSL may be directly connected with the second conductive line ML2. The second interlayer insulating layer 170 may cover the second conductive line ML2.

A conductive plug may be disposed on the contact inclining portion CT of the string select line SSL. The conductive plug may be a string select contact plug SCP. The string select line SSL may be electrically connected with the string select contact plug SCP. A width of the string select contact plug SCP may be wider than a width of a top surface of the contact inclining portion CT of the string select line SSL. The string select contact plug SCP may penetrate the first interlayer insulating layer 160 and the second interlayer insulating layer 170. A third conductive line ML3 may be disposed on the string select contact plug SCP, the second interlayer insulating layer 170. The string select contact plug SCP may be electrically connected with the third conductive line ML3. The third conductive line ML3 may extend in the second direction. Referring to FIG. 1B, a plurality of the string select line SSL may dispose in the concave portion. And the third conductive lines ML3 of the string select lines SSL adjacent to each other may extend different direction. In another embodiment of the present disclosure, conductive pads may be interposed between a contact pad and contact inclining portion CT.

The conductive lines ML1-ML3 may extend separated in the first and second directions with the cell array region CAR in-between. For example, the conductive lines ML1, ML2 connected with the conductive patterns GSL, WL2, WL4 of which the contact inclining portions CT are disposed in the first contact region CR1 may extend in the first direction, and the conductive lines ML2, ML3 connected with the conductive patterns WL1, WL3, SSL of which the contact inclining portions CT are disposed in the second contact region CR2 may extend in the second direction.

As one embodiment of the present disclosure, an active memory string structure extending upward from the bottom surface 103 of the concave portion A may be disposed. The active memory string structure extends vertical to the substrate 101, penetrating the conductive patterns GSL, WL1-WL4, SSL so that one end of the active memory string structure may be electrically connected with the common source region. A drain region D may be disposed at the other end of the active memory string structure. The drain region D may be a region doped with a high concentration of dopant. For example, the active memory string structure may be of n doped type.

A bit line contact plug BLCP may be disposed on the drain region D of the active memory string structure. The bit line contact plug BLCP may be electrically connected with the drain region D and penetrate the first interlayer insulating layer 160. A bit line BL may be disposed on the bit line contact plug BLCP. The bit line BL may be connected with the drain region D of the active memory string structure through the bit line contact plug BLCP. Unlike this, the bit line BL may be directly connected with the drain region D. The bit line BL may extend in a third direction crossing the first and the second direction. The third direction may cross the first and second direction at a right angle. The bit line BL may cross the string select line SSL.

An information storage layer 132 may be disposed between a sidewall of the active memory string structure and the conductive patterns GSL, WL1-WL4, SSL. The information storage layer 132 may be provided in a cylindrical type penetrating the conductive patterns GSL, WL1-WL4, SSL. The information storage layer 132 may be provided to surround the active memory string structure. The information storage layer 132 may be disposed between the sidewall of the active memory string structure and the conductive patterns GSL, WL1-WL4, SSL and the insulating layers 110-116.

Figure 3:
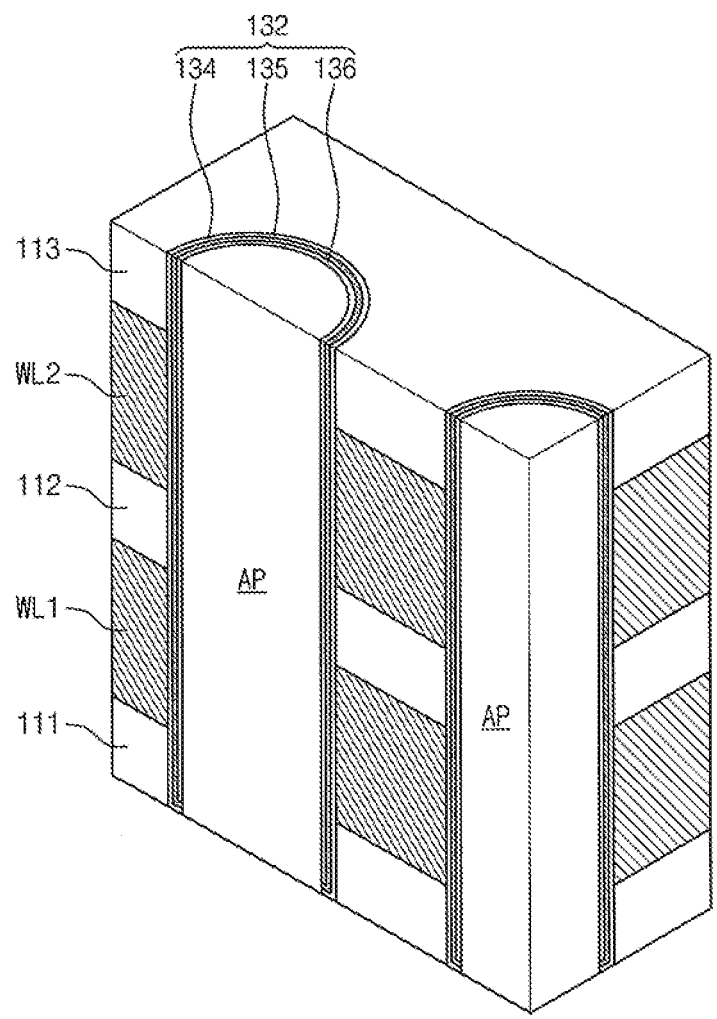
FIG. 3 shows a schematic view for explaining an information storage layer, for example a charge storage layer in accordance with an exemplary embodiment of the present disclosure.

The active memory string, the information storage layer and the conductive patterns according to a first embodiment of the inventive concept will be specifically described. FIG. 3 is a view for explaining an information storage layer according to a first embodiment of the inventive concept.

Referring to FIG. 3, the information storage layer 132 may include a tunnel insulating layer 136, a charge storage layer 135 and a blocking layer 134.

Referring to FIGS. 1A and 1B, an interconnection, extending outside one edge of the cell array portion, is electrically connected to contact inclining portion of a word line at one side, whereas another interconnection, extending outside the other edge of the cell array portion, is electrically connected to contact inclining portion of a word line at another side. According to FIG. 1A, all SSLs are connected to interconnections at either side, whereas some SSLs are connected to interconnections at one side, and some SSLs are connected to interconnections at another side for FIG. 1B. The word line may be chosen alternatingly. That is, odd numbered word lines from bottom to top direction of a string for example, first, third, fifth word lines are connected to interconnections at one side of a string, and even numbered word lines for example, second, fourth, sixth word lines connected to interconnections at the other side of a string.

The tunnel insulating layer 136 may cover the sidewalls of the active memory string structure. The tunnel insulating layer 136 may have a single layer structure or a multilayer structure. The tunnel insulating layer 136 may include at least one selected from the group consisting of a silicon oxy-nitride layer, a silicon nitride layer, a silicon oxide layer and a metal oxide layer.

The charge storage layer 135 may cover the tunnel insulating layer 136. The charge storage layer 135 may be spaced apart from the active memory string structure by the tunnel insulating layer 136. The charge storage layer 135 may include charge trap sites, which can store charges. For example, the charge storage layer 135 may include at least one selected from the group consisting of a silicon nitride layer, a metal nitride layer, a metal oxy-nitride layer, a metal silicon oxide layer, a metal silicon oxy-nitride layer and nanodots.

The blocking layer 134 may be disposed between the charge storage layer 135 and the conductive patterns GSL, WL1-WL4, SSL. The blocking layer 134 may be disposed between the charge storage layer 135 and the insulating layers 110-116. The blocking layer 134 may cover the charge storage layer 135. The blocking layer 134 may include at least one selected from the group consisting of a silicon oxide layer, a silicon nitride layer, a silicon oxy-nitride layer and high-k dielectric. The high-k insulating layers may include hafnium (Hf), zirconium (Zr), aluminum (Al), tantalum (Ta), lanthanum (La), Cerium (Ce), praseodymium (Pr) or the like. A dielectric constant of the blocking layer 134 may be higher than that of the tunnel insulating layer 136.

A modified example of the first embodiment of the inventive concept will now be described. FIG. 2B is a sectional view taken along line I-I' of FIG. 1, for explaining a modified example of the first embodiment of the inventive concept.

Referring to FIGS. 1 and 2B, a substrate 100 is provided. A common source region may be disposed in the substrate 100. The substrate 100 may include a concave portion A. The concave portion A may include a bottom surface 103, and first and second sidewalls 105 and 106 facing each other. The substrate 100 may include a convex portion B extending from the first and second sidewalls 105 and 106. The convex portion B may be defined by an insulating layer 104 on the substrate 100.

A memory cell may be disposed in the concave portion A. The concave portion A may include a first contact region CR1 adjacent to the first sidewall 105, and a second contact region CR2 adjacent to the second sidewall 106. The memory cell may be the memory cell explained with reference to FIG. 2A.

Figure 2C:
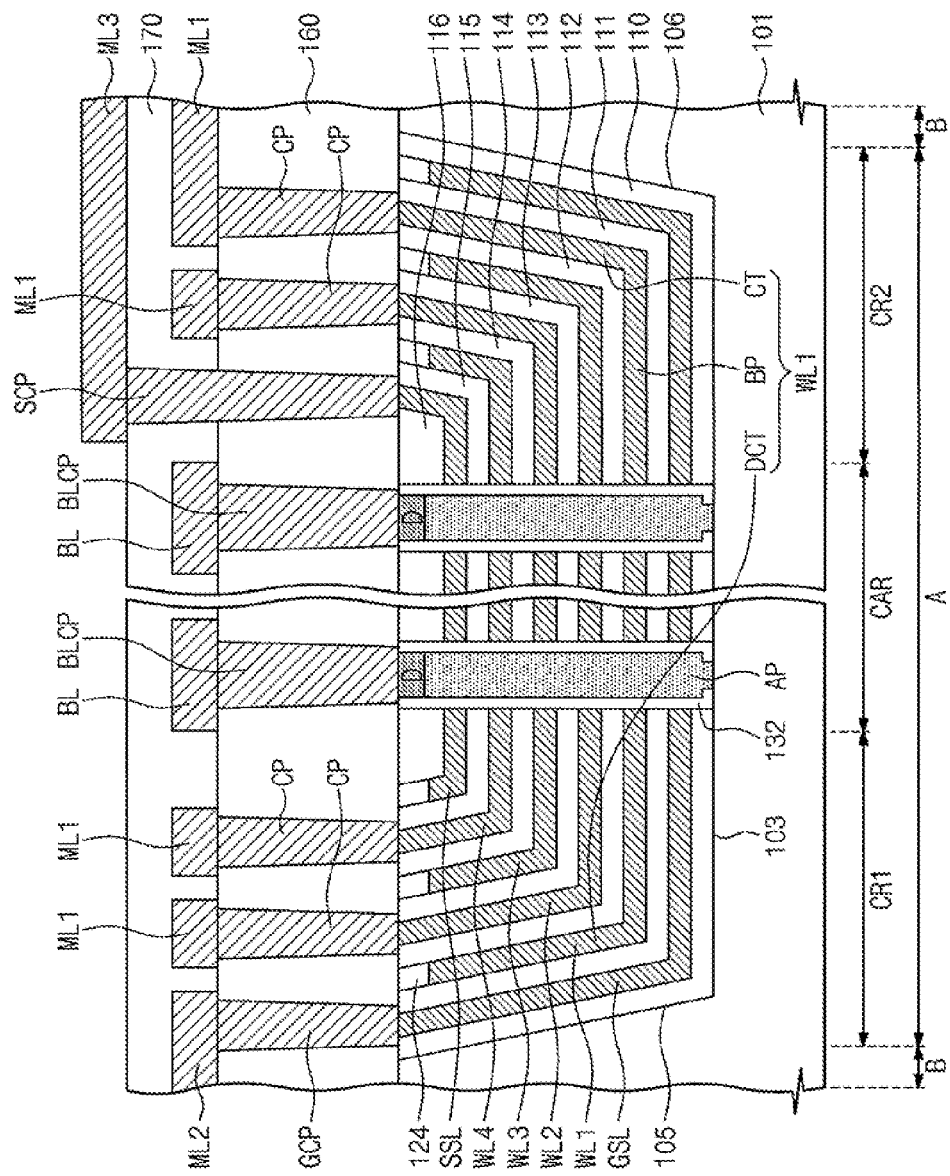
FIG. 2C shows a schematic sectional view taken along line I-I' of FIGS. 1A through 1B in accordance with an exemplary embodiment of the present disclosure.

A semiconductor device according to another modified example of the first embodiment of the inventive concept will now be described. FIG. 2C is a sectional view taken along line I-I' of FIG. 1A through FIG. 1B, for showing another modified example of the first embodiment of the inventive concept.

Referring to FIGS. 1A through 1B and 2C, a substrate 101 is provided. A common source region may be disposed in the substrate 101. The substrate 101 may include a concave portion A. The concave portion A may include a bottom surface 103, and first and second sidewalls 105 and 106 facing each other. Any one of the first and second sidewalls 105 and 106 may be inclined to the bottom surface 103 of the concave portion A. For example, the first sidewall 105 and the second sidewall 106 may have an angle, which is 50° to 90° with respect to the bottom surface 103. A slope of the first sidewall 105 with respect to the bottom surface 103 may be equal to that of the second sidewall 106 with respect to the bottom surface 103. Alternatively, the slope of the first sidewall 105 with respect to the bottom surface 103 may be different from that of the second sidewall 106 with respect to the bottom surface 103. The substrate 101 may include a convex portion B extending from the first and second sidewalls 105 and 106. A top surface of the convex portion B may be in parallel with the bottom surface 103 of the concave portion A. The concave portion A and the convex portion B of the substrate 101 may be defined through an etching process. Alternatively, as described with reference to FIG. 2B, the convex portion B may be defined by the insulating layer 104 on the substrate 100.

A memory cell may be disposed in the concave portion A. The memory cell will now be described. The memory cell may be the memory cell explained with reference to FIG. 2A. The concave portion A may have a first contact region CR1 adjacent to the first sidewall 105, and a second contact region CR2 adjacent to the second sidewall 106. A contact inclining portion CT and a dummy inclining portion DCT of any one of the conductive patterns GSL, WL1-WL4, SSL may have an inclined slope with respect to a bottom portion BP.

An angle between the sidewall adjacent to the contact region where the contact inclining portion CT is disposed and the bottom surface 103 may be equal to an angle between the contact inclining portion CT and the bottom portion BP. For example, in the case of the first word line WL1, a slope of the contact inclining portion CT with respect to the bottom portion BP may be equal to a slope of the second sidewall 106 with respect to the bottom surface 103. When the slopes of the first sidewall 105 and the second sidewall 106 with respect to the bottom surface 103 are different from each other, in any one conductive pattern, the slope of the contact inclining portion with respect to the bottom portion BP may be different from the slope of the dummy inclining portion DCT with respect to the bottom portion BP.

FIG. 1a illustrates a memory device wherein the memory device comprises at least two row decoder assigned to a cell array and all of the string select lines (SSL) are connected to one row decoder whereas FIG. 1b illustrates a memory device wherein the even string select lines are connected to one row decoder and the odd string select lines are connected to the other row decoder.

Figure 4A:
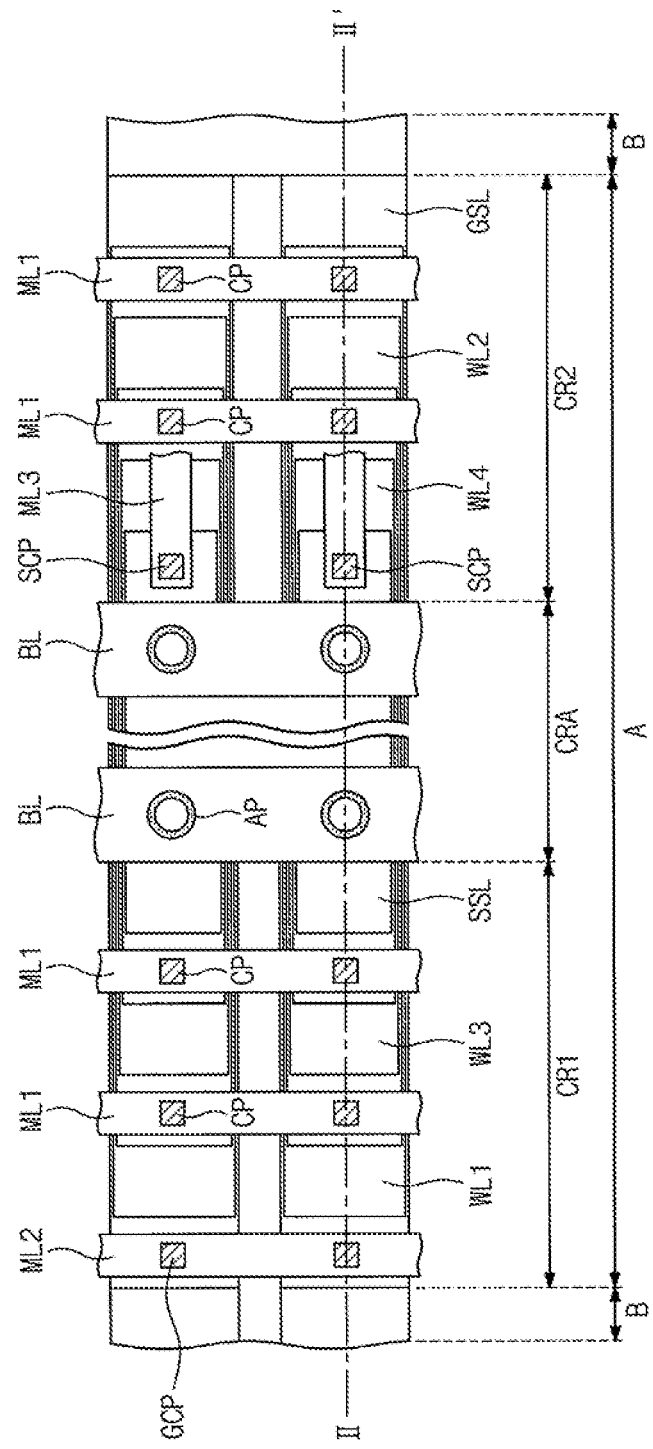
FIG. 4A through 4B show schematic plan views for explaining a semiconductor device in accordance with another exemplary embodiment of the present disclosure.
Figure 4B:
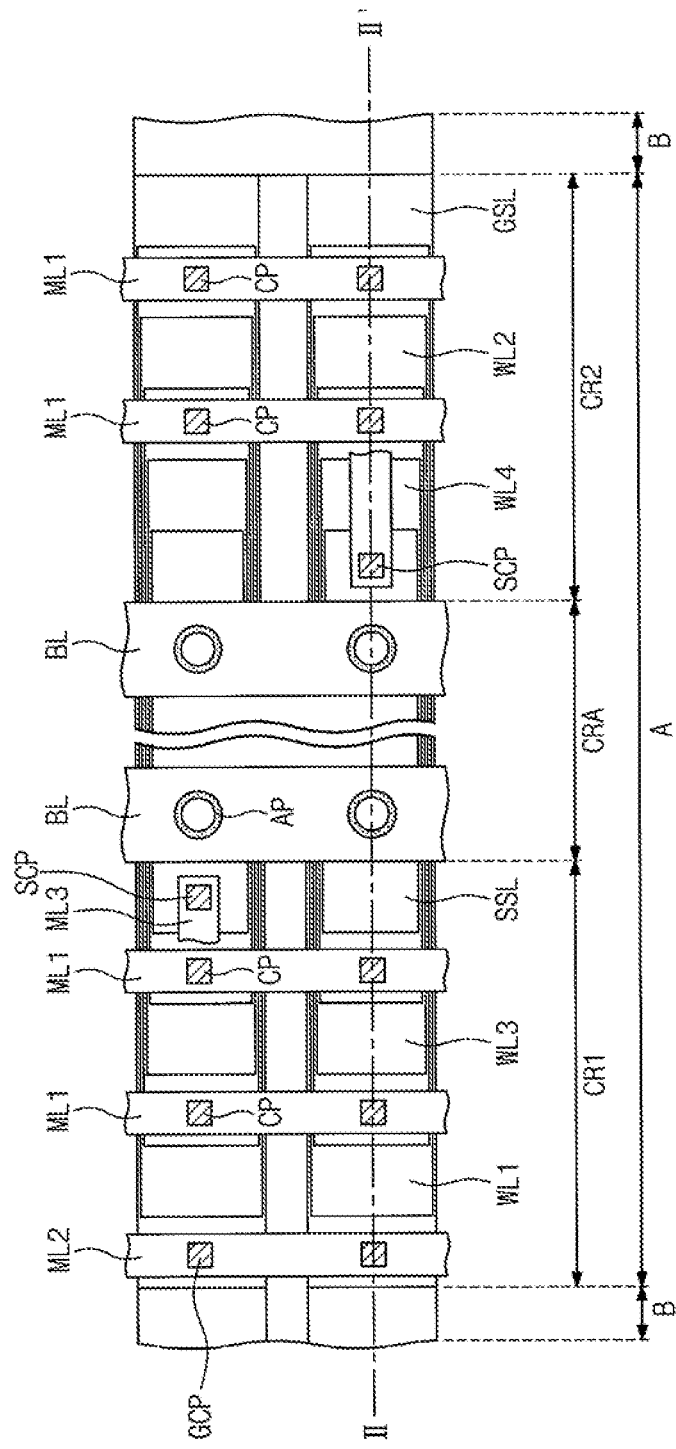

A semiconductor device according to a second embodiment of the inventive concept will now be described. FIG. 4A through FIG. 4B is a plan view for explaining a semiconductor device according to a second embodiment of the inventive concept, and FIG. 5A is a sectional view taken along line II-II' of FIGS. 4A through 4B.

Figure 5A:
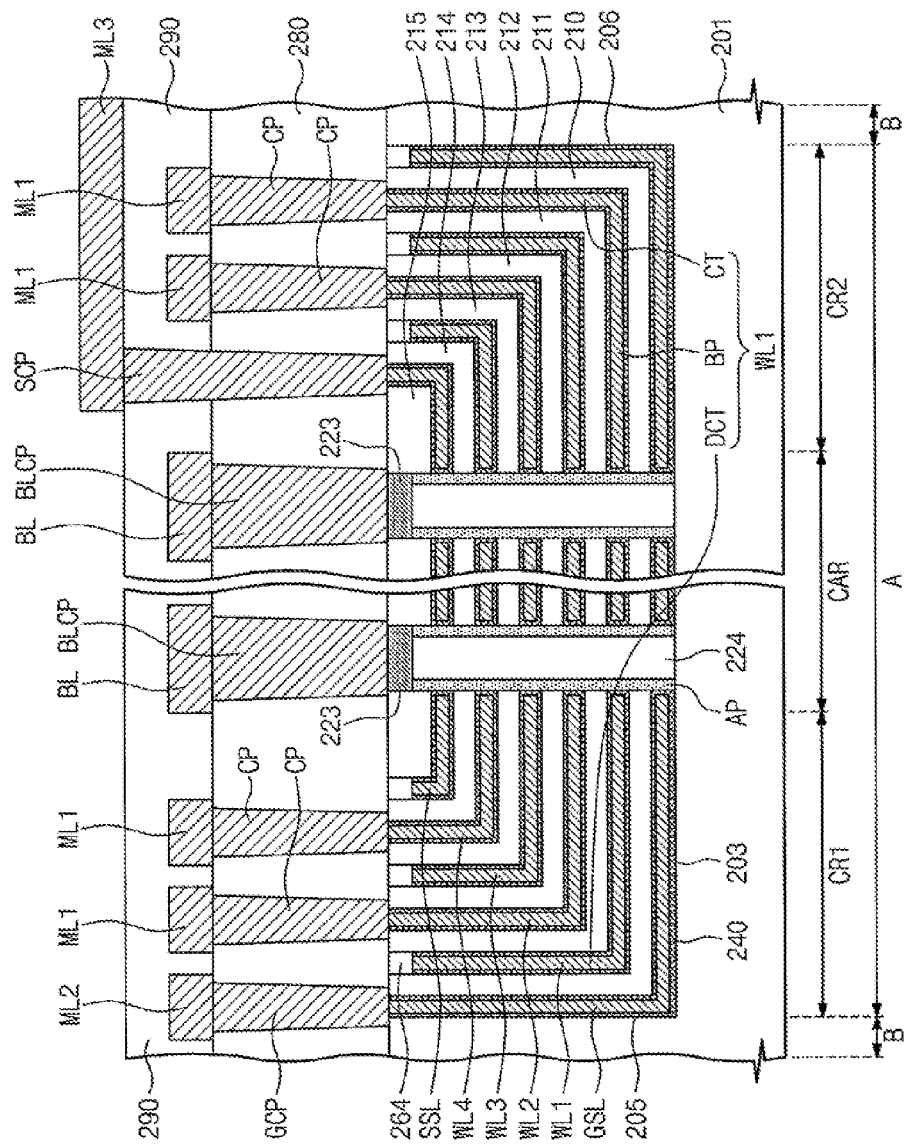
FIG. 5A shows a schematic sectional view taken along line II'-II' of FIGS. 4A through 4B in accordance with an exemplary embodiment of the present disclosure.

Referring to FIGS. 4A through 4B and 5A, a substrate 201 is provided. The substrate 201 may be a semiconductor-based substrate. The substrate 201 may include a doped well. The well may include a first conductive type dopant. A common source region 202 may be disposed in the substrate 201. The common source region 202 may be disposed in a plate form within a cell region of the substrate 201. The common source region 202 may include a high concentration of dopant. The dopant included in the common source region 202 may have a second conductive type, which is different from the conductive type of the dopant included in the well. For example, in the case where the well includes a p-type dopant, the common source region 202 may include a high concentration of n-type dopant.

The substrate, 201 may include a concave portion The concave portion A may include a bottom surface 203, and first and second sidewalls 205 and 206 facing each other. The substrate 201 may include a convex portion B extended from the first and second sidewalls 205 and 206. A top surface of the convex portion B may be in parallel with the bottom surface of the concave portion A. The concave portion A and the convex portion B may be formed by etching a portion of a semiconductor substrate corresponding to the concave portion A and leaving a portion of the semiconductor substrate corresponding to the convex portion B. In this case, the substrate 201 may be one body substrate. A memory cell may be disposed in the concave portion A.

The concave portion A may include a first contact region CR1 adjacent to the first sidewall 205, and a second contact region CR2 adjacent to the second sidewall 206. A cell array region CAR may be disposed between the first contact region CR1 and the second contact region CR2. The first contact region CR1 and the second contact region CR2 may be spaced apart from each other with the cell array region CAR in-between.

Conductive patterns GSL, WL1-WL4, SSL spaced apart from one another may be disposed on the substrate 201. The conductive patterns GSL, WL1-WL4, SSL may include a ground select line GSL, word lines WL1-WL4, and a string select line SSL, which are sequentially stacked on the concave portion A of the substrate 201. The conductive patterns GSL, WL1-WL4, SSL may be spaced apart from one another with inter-gate insulating layers 210-214 in-between. For example, the ground select line GSL, the first inter-gate insulating layer 210, the first word line WL1, the second inter-gate insulating layer 211, the second word line WL2, the third inter-gate insulating layer 212, the third word line WL3, the fourth inter-gate insulating layer 213, the fourth word line WL4, the fifth inter-gate insulating layer 214 and the string select line SSL may be sequentially stacked. The insulating layers 210-214 may include bottom portions above the bottom surface 203 of the concave portion A of the substrate 201, and sidewall portions extended over the first sidewall 205 and the second sidewall 206 from the bottom portions thereof. A string select insulating layer 215 may be disposed on the string select line SSL. The conductive patterns GSL, WL1-WL4, SSL may have a line form extending in a first direction. The first direction may be a direction of line II-II'. That is, the memory device of this embodiment is the device that includes a trench for x-cut thereby separating word line plate in a cell array memory. The separated word lines of substantially same level are electrically connected each other and will act as one word line plate.

The conductive patterns GSL, WL1-WL4, SSL may include bottom portions BP disposed above the bottom surface 203 of the concave portion A. Lengths of the bottom portions BP may be shortened as it goes far from the concave portion A of the substrate 201. The bottom portions BP may be in parallel with the bottom surface 203. The bottom portions BP may be in parallel with the top surface of the convex portion B.

The conductive patterns GSL, WL1-WL4, SSL may include contact inclining portions CT extended over one of the first sidewall 205 and the second sidewall 206 from one ends of the bottom portions BP. A contact region where the contact including portion of any one of the conductive patterns is disposed may be different from a contact region where the contact inclining portion of another conductive pattern adjacent to the any one of the conductive patterns. For example, in the case where the contact inclining portion CT of the ground select line GSL is disposed in the first contact region CR1, the contact inclining portion CT of the first word line WL1 adjacent to the ground select line GSL may be disposed in the second contact region CR2.

An extended line of the contact inclining portion CT may cross the bottom surface 203, for example, at a right angle. A length of the contact inclining portion CT may be decreased as it goes far from the concave portion A. A top surface of the contact inclining portion CT may be coplanar with the top surface of the convex portion B. An angle between the contact inclining portion CT and the bottom portion BP may be 90°.

The conductive patterns GSL, WL1-WL4, SSL may include dummy inclining portions DCT extended over the other one of the first sidewall 205 and the second sidewall 206 from the other ends of the bottom portions BP on the bottom surface 203. A contact region where the dummy inclining portion of any one of the conductive patterns GSL, WL1-WL4, SSL is disposed may be different from a contact region where the dummy inclining portion of another conductive pattern adjacent to the any one of the conductive patterns. For example, in the case where the dummy inclining portion DCT of the string select line SSL is disposed in the first contact region CR1, the dummy inclining portion DCT of the fourth word line WL4 adjacent to the string select line SSL may be disposed in the second contact region CR2.

Each of the conductive patterns GSL, WL1-WL4, SSL may include one contact inclining portion CT and one dummy inclining portion DCT. In one of the conductive patterns GSL, WL1-WL4, SSL, a length of the dummy inclining portion DCT may be shorter than that of the contact inclining portion CT. The contact inclining portion CT may be disposed between the dummy inclining portions DCT adjacent to each other. The contact inclining portions CT adjacent to one of the dummy inclining portions DCT may be spaced apart from each other by the sidewalls of the insulating layers interposed therebetween.

A dummy insulating layer pattern 264 may be disposed on the dummy inclining portion DCT. A top surface of the dummy insulating layer pattern 264 may be coplanar with the top surface of the convex portion B. The top surface of the dummy insulating layer pattern 264 may be coplanar with a top surface of the string select insulating layer 215. Sidewalls of the dummy insulating layer pattern 264 may be coplanar with sidewalls of the dummy inclining portion DCT. The dummy insulating layer pattern 264 may include the same material as the insulating layers 210-215.

Conductive plugs may be disposed on the contact inclining portions CT of the word lines WL1-WL4, respectively. The conductive plugs may be word line contact plugs CP. The word lines WL1-Wl4 may be electrically connected with the word line contact plugs CP, respectively. Widths of the word line contact plugs CP may be wider than those of the top surfaces of the contact inclining portions CT of the word lines WL1-WL4. The widths of the word line contact plugs CP may be wider than widths between the dummy inclining portions DCT adjacent to the contact inclining portions of the word lines WL1-WL4. The word line contact plugs may penetrate a first interlayer insulating layer 280. First conductive lines ML1 may be disposed on the word line contact plugs CP and the first interlayer insulating layer 280. The word line contact plugs CP may be electrically connected with the first conductive lines ML1. The first conductive lines ML1 may extend in a second direction crossing the first direction. The first conductive lines ML1 may be electrically connected with the word lines WL1-WL4 through the word line contact plugs CP. Unlike this, the first conductive lines ML1 may be directly connected with the word lines WL1-WL4. A second interlayer insulating layer 290 covering the first conductive lines ML1 may be disposed. The first and second interlayer insulating layers 280 and 290 may include the same material.

A conductive plug may be disposed on the contact inclining portion CT of the ground select line GSL. The conductive plug may be a ground select contact plug GCP. The ground select line GSL may be electrically connected with the ground select contact plug GCP. A width of the ground select contact plug GCP may be wider than a width of a top surface of the contact inclining portion CT of the ground select line GSL. The ground select contact plug GCP may penetrate the first interlayer insulating layer 280. A second conductive line ML2 may be disposed on the ground select contact plug GCP and the first interlayer insulating layer 280. The ground select contact plug GCP may be electrically connected with the second conductive line ML2. The second conductive line ML2 may extend in the second direction. The second conductive line ML2 may be electrically connected with the ground select line GSL through the ground select contact plug GCP. Unlike this, the ground select line GSL may be directly connected with the second conductive line ML2. The second interlayer insulating layer 290 may cover the second conductive line ML2.

A conductive plug may be disposed on the contact inclining portion CT of the string select line SSL. The conductive plug may be a string select contact plug SCP. The string select line SSL may be electrically connected with the string select contact plug SCP. A width of the string select contact plug SCP may be wider than a width of a top surface of the contact inclining portion CT of the string select line SSL. The string select contact plug SCP may penetrate the first interlayer insulating layer 280 and the second interlayer insulating layer 290. A third conductive line ML3 may be disposed on the string select contact plug SCP and the second interlayer insulating layer 290. The string select contact plug SCP may be electrically connected with the third conductive line ML3. The third conductive line ML3 may extend in the first direction. Referring to the FIG. 4B, a plurality of the string select line SSL may dispose in the concave portion. And the third conductive lines ML3 of the string select lines SSL adjacent to each other may extend different direction.

The conductive lines ML1, ML2 may be disposed separated in both sides with the cell array region CAR in-between. The conductive line connected with one of the conductive patterns GSL, WL1-WL4 may be disposed in a contact region different from the conductive line connected with the conductive pattern adjacent to the one conductive pattern. For example, the first conductive line ML1 connected with the first word line WL1 may be disposed in the second contact region CR2, and the second conductive line ML2 and the first conductive line ML1 respectively connected with the ground select line GSL and the second word line WL2 adjacent to the first word line WL1 may be disposed in the first contact region CR1.

An active memory string structure extending upward from the bottom surface 203 of the concave portion A may be disposed. The active memory string structure may extend perpendicular to the substrate 201. The active memory string structure may penetrate the conductive patterns GSL, WL1-WL4, SSL. Unlike this, the active memory string structure faces the sidewalls of the conductive patterns GSL, WL1-WL4, SSL. One end of the active memory string structure may be electrically connected with the common source region 202. A drain region D may be disposed at the other end of the active memory string. The drain region D may be a region doped with a high concentration of dopant. The active memory string structure may include a single crystalline semiconductor.

A bit line contact plug BLCP may be disposed on the drain region D of the active memory string structure. The bit line contact plug BLCP may be electrically connected with the drain region D and penetrate the first interlayer insulating layer 280. A bit line BL may be disposed on the bit line contact plug BLCP. The bit line BL may be connected with the drain region D of the active memory string structure through the bit line contact plug BLCP. Unlike this, the bit line BL may be directly connected with the drain region D. The bit line BL may extend in the second direction. The bit line BL may cross the third conductive line ML3.

An information storage layer 240 may be disposed between the sidewall of the active memory string structure and the conductive patterns GSL, WL1-WL4, SSL. The information storage layer 240 may be disposed between the conductive patterns GSL, WL1-WL4, SSL and the insulating layers 210-215.

Figure 6A:
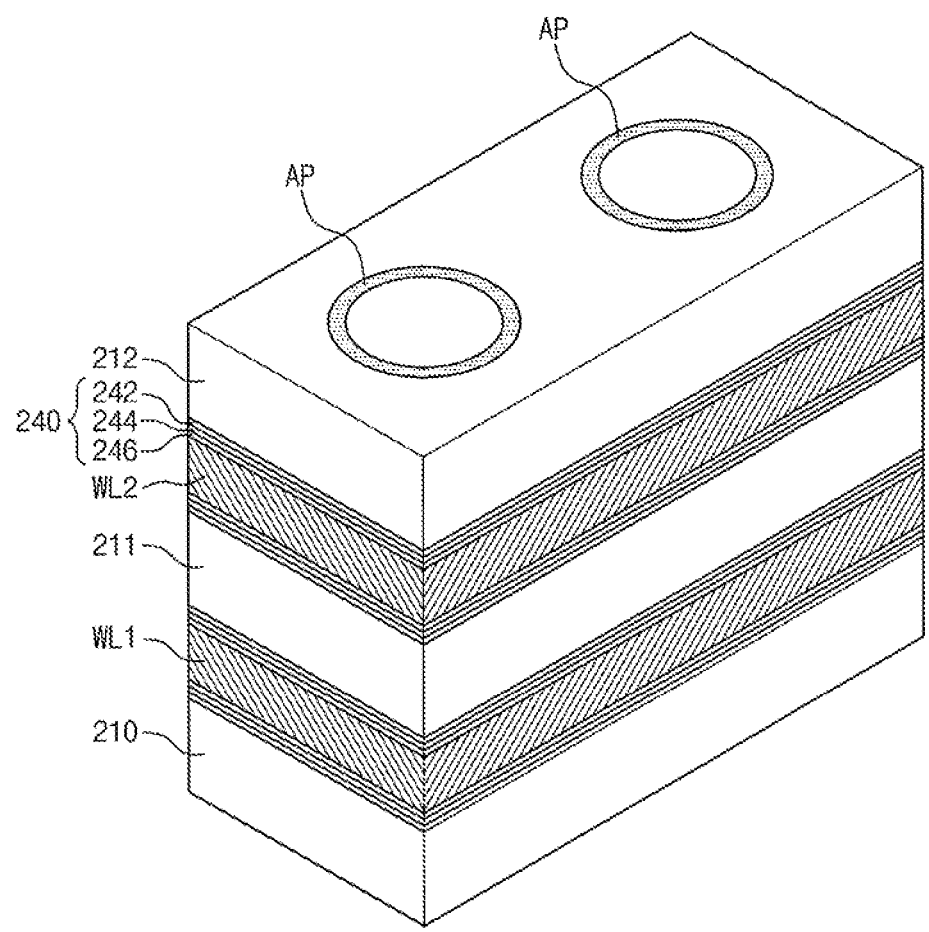
FIG. 6A shows a schematic view for explaining an information storage layer in accordance with an exemplary embodiment of the present disclosure.

The active memory string, the information storage layer and the conductive patterns according to a second embodiment of the inventive concept will be specifically described. FIG. 6A is a view for explaining an information storage layer according to a second embodiment of the inventive concept.

FIG. 4a illustrates a memory device wherein the memory device comprises at least two row decoder assigned to a cell array and all of the string select lines (SSL) are connected to one row decoder whereas FIG. 4b illustrates a memory device wherein the even string select lines are connected to one row decoder and the odd string select lines are connected to the other row decoder.

Referring to FIG. 6A, the information storage layer 240 may include a tunnel insulating layer 242, a charge storage layer 244 and a blocking layer 246.

The tunnel insulating layer 242 may cover the sidewall of the active memory string structure. The tunnel insulating layer 242 may have a single layer structure or a multilayer structure. For example, the tunnel insulating layer 242 may include at least one selected from the group consisting of a silicon oxy-nitride layer, a silicon nitride layer, a silicon oxide layer and a metal oxide layer.

The charge storage layer 244 may cover the tunnel insulating layer 242. The charge storage layer 244 may be spaced apart from the active memory string structure by the tunnel insulating layer 242. The charge storage layer 244 may include charge trap sites, which can store charges. For example, the charge storage layer 244 may include at least one selected from the group consisting of a silicon nitride layer, a metal nitride layer, a metal oxy-nitride layer, a metal silicon oxide layer, a metal silicon oxy-nitride layer and nanodots.

The blocking layer 246 may be disposed between the charge storage layer 244 and the conductive patterns GSL, WL1-WL4, SSL. The blocking layer 246 may be disposed between the charge storage layer 244 and the insulating layers 210-215. The blocking layer 246 may cover the charge storage layer 244. The blocking layer 246 may include at least one selected from the group consisting of a silicon oxide layer, a silicon nitride layer, a silicon oxy-nitride layer and high-k insulating layers. The high-k insulating layers may include hafnium (Hf), zirconium (Zr), aluminum (Al), tantalum (Ta), lanthanum (La), Cerium (Ce), praseodymium (Pr) or the like. A dielectric constant of the blocking layer 246 may be higher than that of the tunnel insulating layer 242.

Figure 6B:
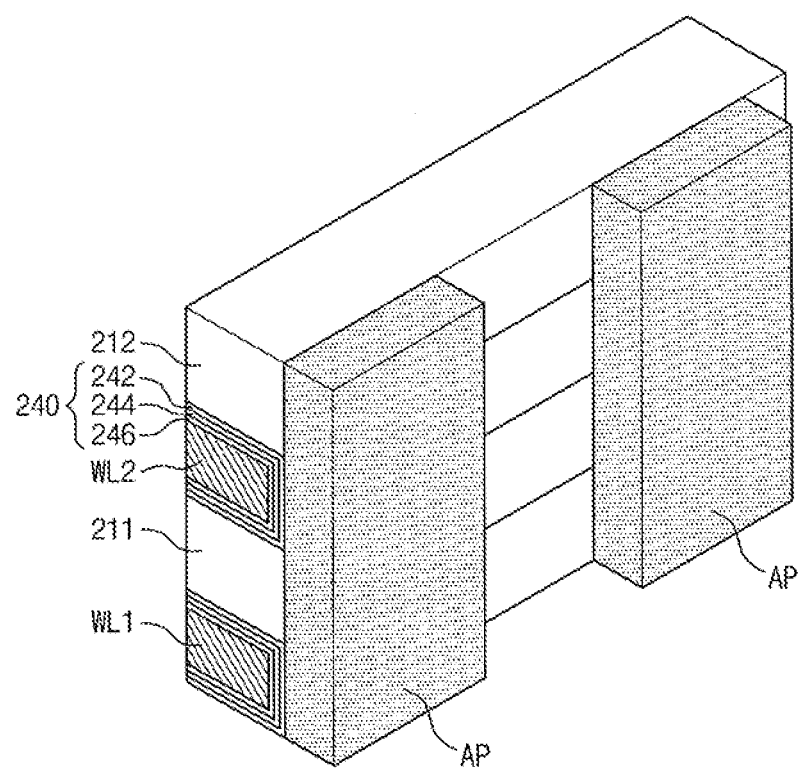
FIG. 6B shows a schematic partial perspective view for explaining an exemplary vertical active memory string of either pillar or tubular shape in accordance with an exemplary embodiment of the present disclosure.

A modified example of the active according to the second embodiment of the inventive concept will be described. FIG. 6B is a partial perspective view for explaining an active according to a modified example of the second embodiment of the inventive concept.

Referring to FIG. 6B, an information storage layer 240 including the tunnel insulating layer 242, the charge storage layer 244 and the blocking layer 246 described with reference to FIG. 6A is disposed between the conductive patterns WL1, GSL and the active memory string structure. The active memory string structure may face sidewalls of the bottom portions BP of the conductive patterns GSL, WL1.

Figure 5B:
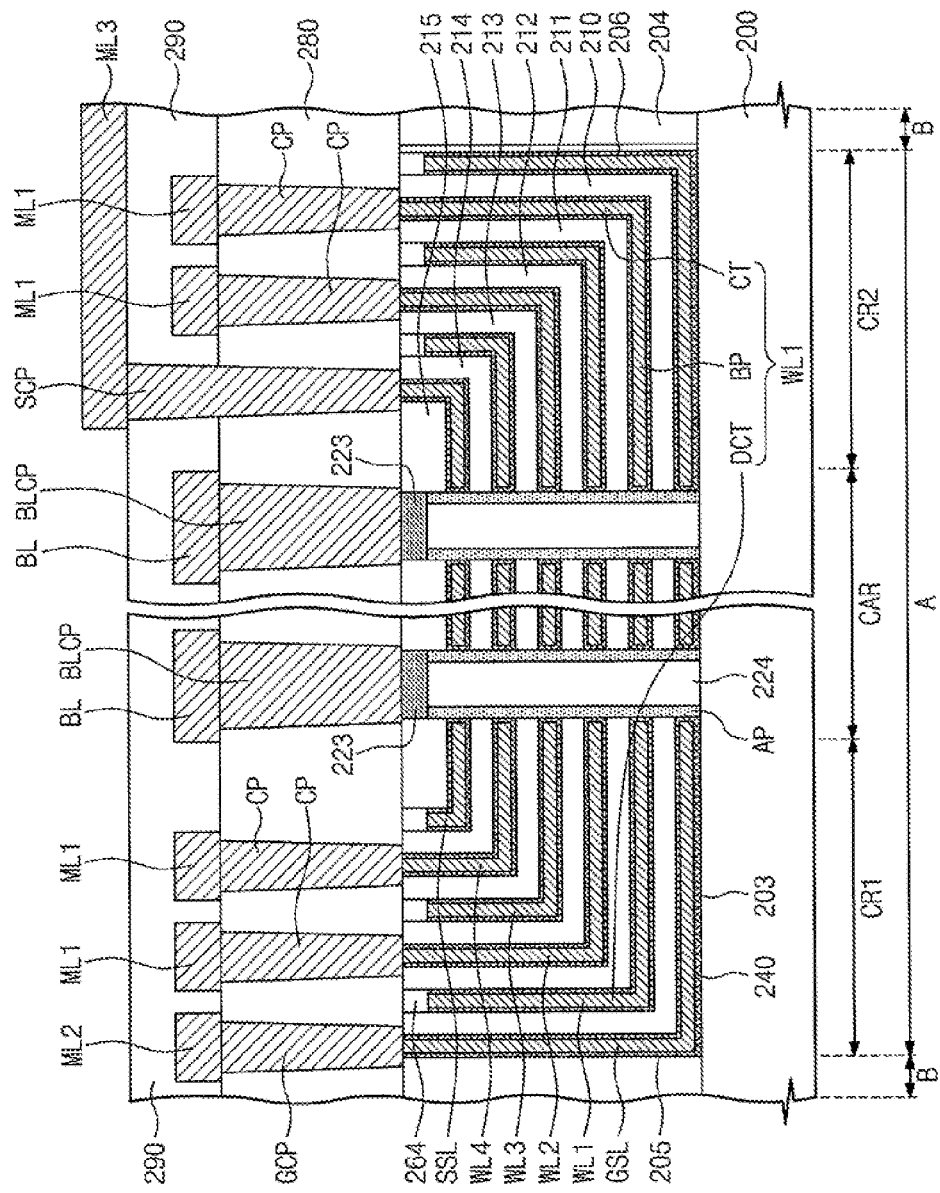
FIG. 5B shows a schematic sectional view taken along line II-II' of FIGS. 4A through 4B in accordance with an exemplary embodiment of the present disclosure.

A modified example of the second embodiment of the inventive concept will now be described. FIG. 5B is a sectional view taken along line II-II' of FIGS. 4A through 4B, for explaining a modified example of the second embodiment of the inventive concept.

Referring to FIGS. 4 and 5B, a substrate 200 is provided. A common source region 202 may be disposed in the substrate 200. The substrate 200 may include a concave portion A. The concave portion A may include a bottom surface 203, and first and second sidewalls 205 and 206 facing each other. The substrate 200 may include a convex portion B extending from the first and second sidewalls 205 and 206. A top surface of the convex portion B may be in parallel with the bottom surface 203 of the concave portion A. The convex portion B may be defined by an insulating layer 204 disposed on the substrate 200.

A memory cell may be disposed in the concave portion A. The concave portion A may include a first contact region CR1 adjacent to the first sidewall 205, and a second contact region CR2 adjacent to the second sidewall 206. The memory cell may be the memory cell explained with reference to FIG. 5A.

Figure 5C:
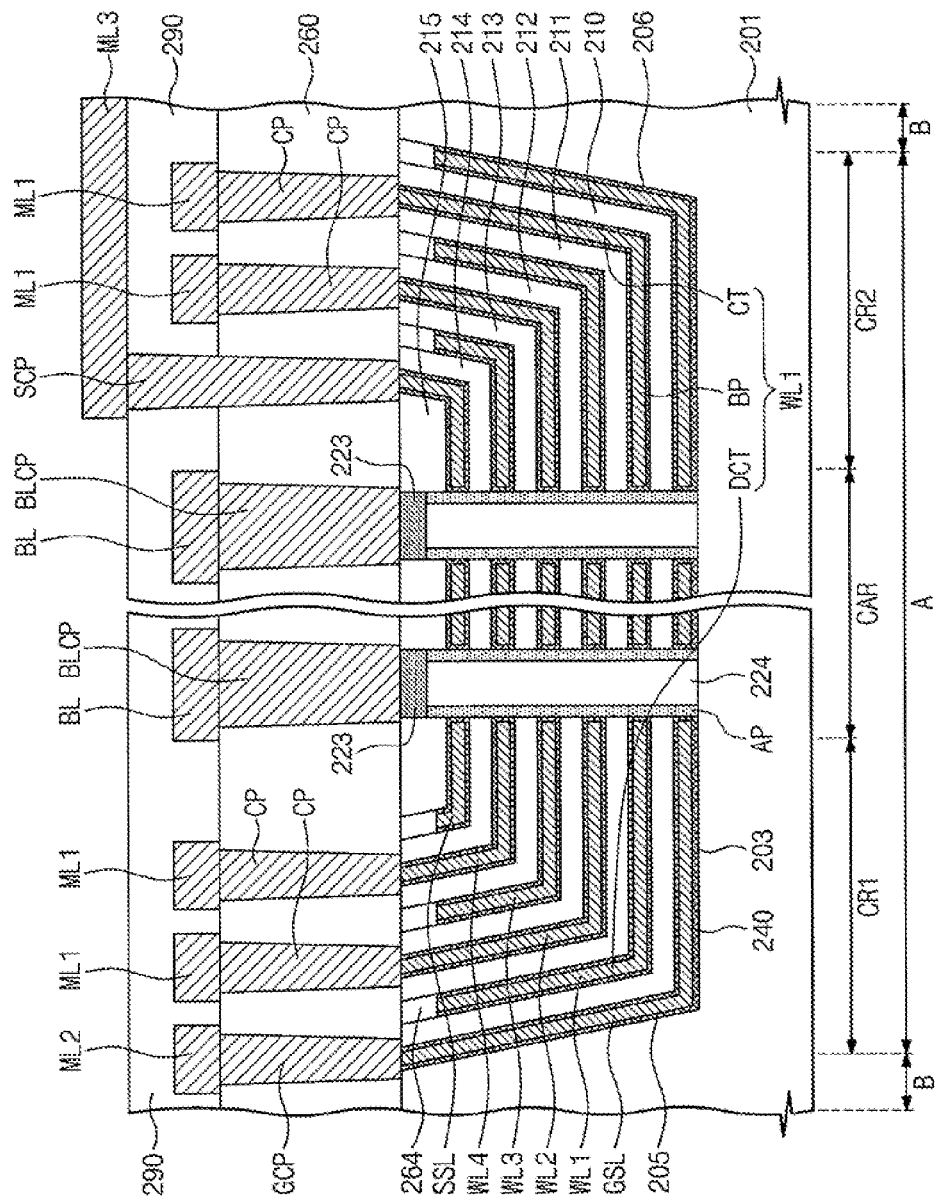
FIG. 5C shows a schematic sectional view taken along line II-II' of FIGS. 4A through 4B in accordance with an exemplary embodiment of the present disclosure.

A semiconductor device according to another modified example of the second embodiment of the inventive concept will now be described. FIG. 5C is a sectional view taken along line II-II' of FIG. 4, for showing another modified example of the second embodiment of the inventive concept.

Referring to FIGS. 4 and 5C, a substrate 201 is provided. A common source region 202 may be disposed in the substrate 201. The substrate 201 may include a concave portion A. The concave portion A may include a bottom surface 203, and first and second sidewalls 205 and 206 facing each other. Any one of the first and second sidewalls 205 and 206 may be inclined to the bottom surface 203 of the concave portion A. For example, the first sidewall 205 and the second sidewall 206 may have an angle, which is 50° and less than 90° with respect to the bottom surface 203. A slope of the first sidewall 205 with respect to the bottom surface 203 may be equal to that of the second sidewall 206 with respect to the bottom surface 203. Alternatively, the slope of the first sidewall 205 with respect to the bottom surface 203 may be different from that of the second sidewall 206 with respect to the bottom surface 203. The substrate 201 may include a convex portion B extending away from the first and second sidewalls 205 and 206. A top surface of the convex portion B may be in parallel with the bottom surface 203 of the concave portion A. The concave portion A and the convex portion B of the substrate 201 may be defined through an etching process. Alternatively, as described with reference to FIG. 5B, the convex portion B may be defined by the insulating layer 204 on the substrate 200.

A memory cell may be disposed in the concave portion A. The memory cell will now be described. The memory cell may be the memory cell explained with reference to FIG. 5A. The concave portion A may have a first contact region CR1 adjacent to the first sidewall 205, and a second contact region CR2 adjacent to the second sidewall 206. A contact inclining portion CT and a dummy inclining portion DCT of any one of the conductive patterns GSL, WL1-WL4, SSL may have an inclined slope with respect to a bottom portion BP.

An angle between the sidewall adjacent to the contact region where the contact inclining portion CT is disposed and the bottom surface 203 may be equal to an angle between the contact inclining portion CT and the bottom portion BP. For example, in the case of the first word line WL1, a slope of the contact inclining portion CT with respect to the bottom portion BP may be equal to a slope of the second sidewall 206 with respect to the bottom surface 203. When the slopes of the first sidewall 205 and the second sidewall 206 with respect to the bottom surface 203 are different from each other, in any one conductive pattern, the slope of the contact inclining portion with respect to the bottom portion BP may be different from the slope of the dummy inclining portion DCT with respect to the bottom portion BP.

Referring to FIGS. 6a and 6b, an active may be formed of silicon, the shape of the active region may be of pillar, tubular or bar-sided shape. The active may be formed of monocrystalline silicon, polycrystalline silicon. The active may be formed with amorphous silicon then transforming to polycrystalline silicon. FIG. 6b shows a vertical active memory string of bar-sided shapes. The invention concept of the present disclosure is not limited to the shaped of the actives. Thus, the active memory string of tubular type or pillar type can be applied to the memory devices of FIG. 1 and FIG. 4.

Figure 7:
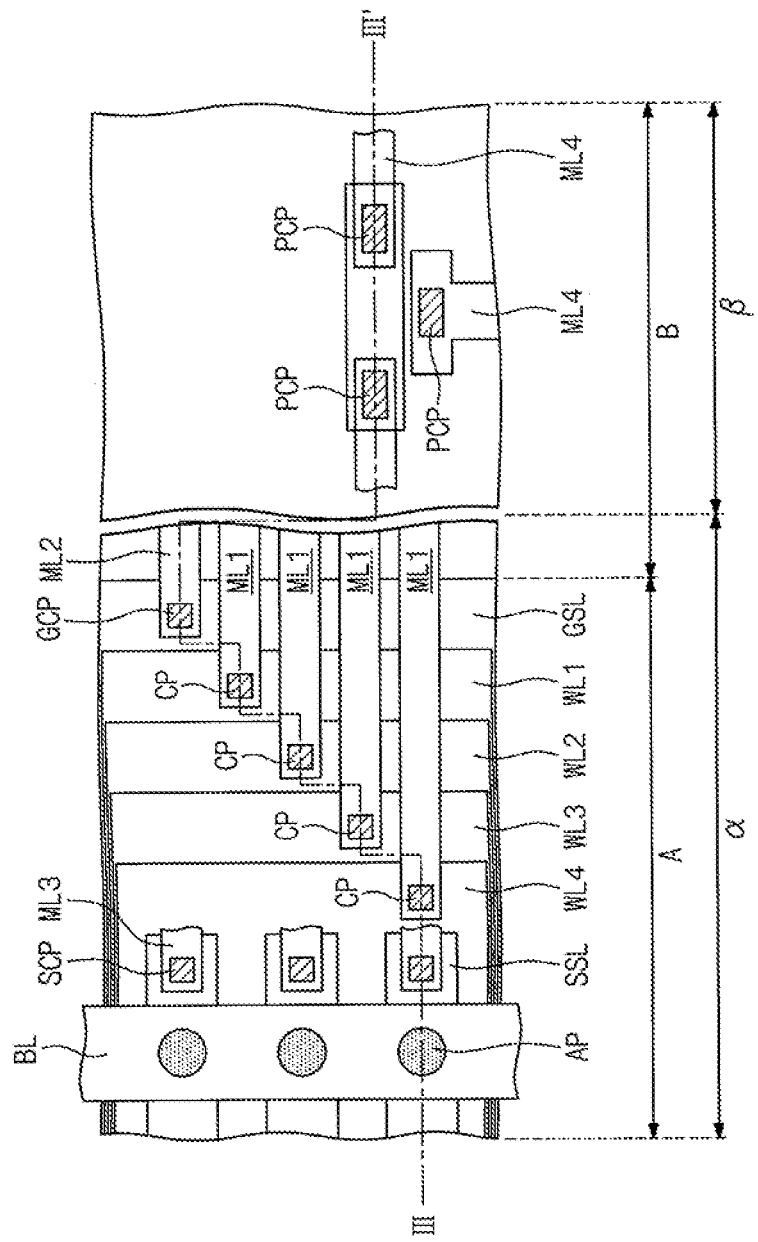
FIG. 7 shows a schematic plan view for explaining another vertical active memory string of bar-sided shape of a semiconductor device in accordance with an exemplary embodiment of the present disclosure.

A semiconductor device according to a third embodiment of the inventive concept will now be described. FIG. 7 is a plan view for explaining a semiconductor device according to a third embodiment of the inventive concept, and FIG. 8A is a sectional view taken along line III-III' of FIG. 7.

Referring to FIGS. 7 and 8A, a substrate 301 is provided. The substrate 301 may be a semiconductor-based substrate. The substrate 301 may include a well. The well may include a first conductive type dopant. A common source region 302 may be disposed in the substrate 301. The common source region 302 may be disposed in a plate form within a cell region of the substrate 301. The common source region 302 may include a high concentration of dopant. The dopant included in the common source region 302 may have a second conductive type, which is different from the conductive type of the dopant included in the well. For example, in the case where the well includes a p-type dopant, the common source region 302 may include a high concentration of n-type dopant.

The substrate 301 may include a concave portion A. The concave portion A may include a bottom surface 303, and a first sidewall 306. The substrate 301 may include a convex portion B extended from the first sidewall 306. A top surface of the convex portion B may be in parallel with the bottom surface of the concave portion A. The concave portion A and the convex portion B may be formed by etching a portion of a semiconductor substrate corresponding to the concave portion A and leaving a portion of the semiconductor substrate corresponding to the convex portion B. In this case, the substrate 301 may be one body substrate.

The substrate 301 may include a cell region α and a peripheral circuit region β. In the cell region α, a memory cell may be disposed. The cell region α may include the concave portion A and the convex portion B. In the peripheral circuit region β, a peripheral circuit may be disposed. The peripheral circuit region β may include the convex portion B.

The cell region α of the substrate 301 will now be described.

Conductive patterns GSL, WL1-WL4, SSL spaced apart from one another may be disposed on the concave portion A of the substrate 301. The conductive patterns GSL, WL1-WL4, SSL may include a ground select line GSL, word lines WL1-WL4, and a string select line SSL, which are sequentially stacked on the concave portion A of the substrate 301. The conductive patterns GSL, WL1-WL4, SSL may be spaced apart from one another with inter-gate insulating layers 311-315 in-between. For example, the ground select line GSL, the first inter-gate insulating layer 311, the first word line WL1, the second inter-gate insulating layer 312, the second word line WL2, the third inter-gate insulating layer 313, the third word line WL3, the fourth inter-gate insulating layer 314, the fourth word line WL4, the fifth inter-gate insulating layer 315 and the string select line SSL may be sequentially stacked.

A ground select insulating layer 310 may be disposed between the bottom surface 303 of the concave portion A of the substrate 301, the first sidewall 306, and the ground select line GSL. A string select insulating layer 316 may be disposed on the string select line SSL. The insulating layers 310-315 may include bottom portions above the bottom surface 303 of the concave portion A, and sidewall portions extended over the first sidewall 306 from the bottom portions thereof.

The conductive patterns GSL, WL1-WL4, SSL may include bottom portions BP disposed above the bottom surface 303 of the concave portion A. Lengths of the bottom portions BP may be shortened as it goes far from the concave portion A of the substrate 301. The bottom portions BP may be in parallel with the bottom surface 303. The bottom portions BP may be in parallel with the top surface of the convex portion B.

The conductive patterns GSL, WL1-WL4, SSL may include contact inclining portions CT extended over the first sidewall 306 from one ends of the bottom portions BP. An extended line of the contact inclining portion CT may cross the bottom surface 303. For example, the extended line may cross the bottom surface at a right angle. A length of the contact inclining portion CT may be decreased as it goes far from the concave portion A. A top surface of the contact inclining portion CT may be coplanar with the top surface of the convex portion B. An angle between the contact inclining portion CT and the bottom portion BP may be 90°.

Conductive plugs may be disposed on the contact inclining portions CT of the word lines WL1-WL4, respectively. The conductive plugs may be word line contact plugs CP. The word lines WL1-Wl4 may be electrically connected with the word line contact plugs CP, respectively. The word line contact plugs may penetrate a first interlayer insulating layer 360. First conductive lines ML1 may be disposed on the word line contact plugs CP and the first interlayer insulating layer 360. The first conductive line ML1 may extend in a first direction. The first direction may be the direction. The word line contact plugs CP may be electrically connected with the first conductive lines ML1. The first conductive lines ML1 may extend in a first direction. The first conductive lines ML1 may be electrically connected with the word lines WL1-WL4 through the word line contact plugs CP. Unlike this, the first conductive lines ML1 may be directly connected with the word lines WL1-WL4. A second interlayer insulating layer 370 covering the first conductive lines ML1 may be disposed. The first and second interlayer insulating layers 360 and 370 may include the same material.

A conductive plug may be disposed on the contact inclining portion CT of the ground select line GSL. The conductive plug may be a ground select contact plug GCP. The ground select line GSL may be electrically connected with the ground select contact plug GCP. A second conductive line ML2 may be disposed on the ground select contact plug GCP and the first interlayer insulating layer 360. The ground select contact plug GCP may be electrically connected with the second conductive line ML2. The second conductive line ML2 may extend in a first direction. The second conductive line ML2 may be electrically connected with the ground select line GSL through the ground select contact plug GCP. Unlike this, the second conductive line ML2 may be directly connected with the ground select line GSL. The second interlayer insulating layer 370 may cover the second conductive line ML2.

A conductive plug may be disposed on the contact inclining portion CT of the string select line SSL. The conductive plug may be a string select contact plug SCP. The string select line SSL may be electrically connected with the string select contact plug SCP. The string select contact plug SCP may penetrate the first interlayer insulating layer 360 and the second interlayer insulating layer 370. A third conductive line ML3 may be disposed on the string select contact plug SCP and the second interlayer insulating layer 370. The string select contact plug SCP may be electrically connected with the third conductive line ML3. The third conductive line ML3 may extend in the first direction.

An active memory string structure extending upward from the bottom surface 303 of the concave portion A may be disposed. The active memory string structure may extend perpendicular to the substrate 301. The active memory string structure may penetrate the conductive patterns GSL, WL1-WL4, SSL so that one end of the active memory string structure may be electrically connected with the common source region 302. A drain region D may be disposed at the other end of the active memory string. The drain region D may be a region doped with a high concentration of dopant. The active memory string structure may include a single crystalline semiconductor.

A bit line contact plug BLCP may be disposed on the drain region D of the active memory string structure. The bit line contact plug BLCP may be electrically connected with the drain region D and penetrate the first interlayer insulating layer 360. A bit line BL may be disposed on the bit line contact plug BLCP. The bit line BL may be connected with the drain region D of the active memory string structure through the bit line contact plug BLCP. Unlike this, the bit line BL may be directly connected with the drain region D. The bit line BL may extend in the second direction crossing the first direction. The bit line BL may cross the third conductive line ML3.

An information storage layer 332 may be disposed between the sidewall of the active memory string structure and the conductive patterns GSL, WL1-WL4, SSL. The information storage layer 332 may be provided in a cylindrical type penetrating the conductive patterns GSL, WL1-WL4, SSL. The information storage layer 332 may be provided to surround the active memory string structure. The information storage layer 332 may be disposed between the sidewall of the active memory string structure and the conductive patterns GSL, WL1-WL4, SSL and the insulating layers 310-316.

The information storage layer 332 according to the third embodiment of the inventive concept may be the information storage layer described with reference to FIG. 3.

The peripheral circuit region β of the substrate 301 will now be described.

A peripheral circuit may be disposed on a top surface of the convex portion B of the peripheral circuit region β. A gate insulating layer 354 may be disposed on the top surface of the convex portion B. The gate insulating layer 354 may include a silicon oxide layer. The gate insulating layer 354 may include a portion formed by thermally oxidizing the top surface of the convex portion B. A gate electrode 356 may be disposed on the gate insulating layer 354. The gate electrode 356 may include one selected from the group consisting of doped polysilicon, metal and metal silicide. A spacer 358 may be disposed on both sidewalls of the gate electrode 356. Source and drain regions 353 may be disposed in the convex portion B at both sides of the gate electrode 356. The source and drain regions 353 may be regions doped with a high concentration of dopant. A peripheral circuit contact plug PCP penetrating the first interlayer insulating layer 360 may be disposed on the gate electrode 356 and the source and drain regions 353. A fourth conductive line ML4 may be disposed on the peripheral circuit contact plug PCP. A second interlayer insulating layer 370 may be disposed on the fourth conductive line ML4.

A modified example of the third embodiment of the inventive concept will now be described. FIG. 8B is a sectional view taken along line III-III' of FIG. 7, for explaining a modified example of the third embodiment of the inventive concept.

Referring to FIGS. 7 and 8B, a substrate 300 is provided. A common source region 302 may be disposed in the substrate 300. The substrate 300 may include a concave portion A. The concave portion A may include a bottom surface 303, and a first sidewall 306. The substrate 300 may include a convex portion B extending from the first sidewall 306. A top surface of the convex portion B may be in parallel with the bottom surface 303 of the concave portion A. The convex portion B may be defined by an insulating layer 304 on the substrate 300.

The substrate 300 may include a cell region α and a peripheral circuit region β. In the cell region α, a memory cell may be disposed. In the peripheral circuit region β, a peripheral circuit may be disposed.

The cell region α of the substrate 300 will now be described.

In the cell region α of the substrate 300, the memory cell described with reference to FIG. 8A may be disposed.

The peripheral circuit region β of the substrate 300 will now be described.

A peripheral circuit may be disposed on a top surface of the convex portion B of the peripheral circuit region β. A semiconductor layer 352 may be disposed on a top surface of the insulating layer 304. The semiconductor layer 352 may include semiconductor materials including polysilicon, crystalline silicon and single crystalline silicon. A gate insulating layer 354 may be disposed on the semiconductor layer 352. The gate insulating layer 354 may include a silicon oxide layer. The gate insulating layer 354 may include a portion formed by thermally oxidizing the semiconductor layer 352. A gate electrode 356 may be disposed on the gate insulating layer 354. The gate electrode 356 may include one selected from the group consisting of doped polysilicon, metal and metal silicide. A spacer 358 may be disposed on both sidewalls of the gate electrode 356. Source and drain regions 353 may be disposed in the semiconductor layer 352 at both sides of the gate electrode 356. The source and drain regions 353 may be regions doped with a high concentration of dopant.

A peripheral circuit contact plug PCP penetrating the first interlayer insulating layer 360 may be disposed on the gate electrode 356 and the source and drain regions 353. A fourth conductive line ML4 may be disposed on the peripheral circuit contact plug PCP. A second interlayer insulating layer 370 may be disposed on the fourth conductive line ML4.

Figure 8C:
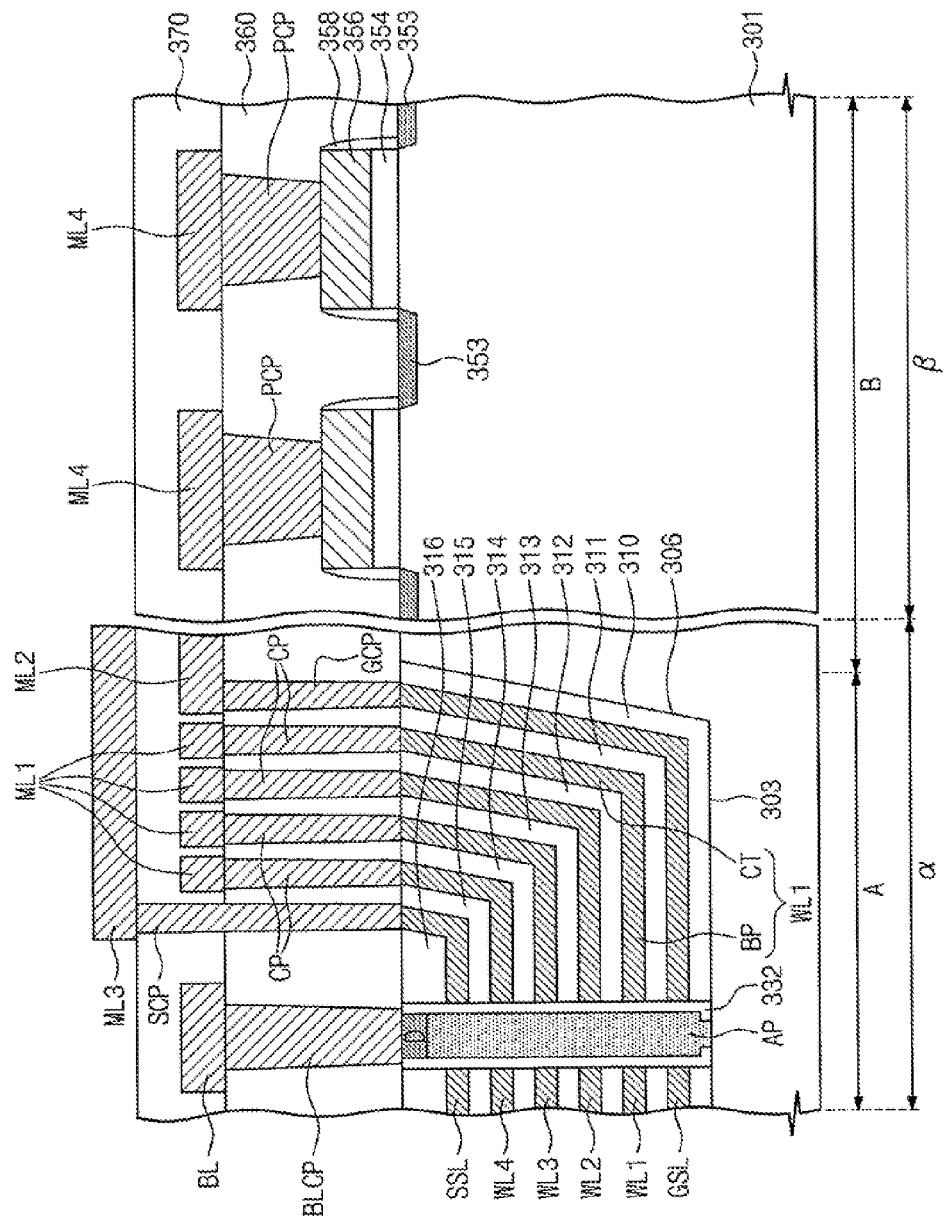
FIG. 8C shows a schematic sectional view taken along line III-III' of FIG. 7 in accordance with another exemplary embodiment of the present disclosure.

A semiconductor device according to another modified example of the third embodiment of the inventive concept will now be described. FIG. 8C is a sectional view taken along line III-III' of FIG. 7, for showing another modified example of the third embodiment of the inventive concept.

Referring to FIGS. 7 and 8C, a substrate 301 is provided. A common source region 302 may be disposed in the substrate 301. The substrate 301 may include a concave portion A. The concave portion A may include a bottom surface 303, and a first sidewall 306. The first sidewall 306 may be inclined to the bottom surface 303 of the concave portion A. For example, the first sidewall 306 may have an angle, which is 50 to 90 degrees with respect to the bottom surface 303. The substrate 301 may include a convex portion B extending from the first sidewall 306. A top surface of the convex portion B may be in parallel with the bottom surface 303 of the concave portion A. The concave portion A and the convex portion B of the substrate 301 may be defined through an etching process. Alternatively, as described with reference to FIG. 8B, the convex portion B may be defined by the insulating layer 304 on the substrate 300.

The substrate 301 may include a cell region α and a peripheral circuit region β. In the cell region α, a memory cell may be disposed. In the peripheral circuit region β, a peripheral circuit may be disposed.

The cell region α of the substrate 301 will now be described.

In the concave portion A of the cell region α, the memory cell described with reference to FIG. 8A may be disposed. A contact inclining portions CT of the conductive patterns GSL, WL1-WL4, SSL may have an inclined slope with respect to the bottom surface 303. An angle between the contact inclining portions CT of the conductive patterns GSL, WL1-WL4, SSL and the bottom surface 303 may be equal to the angle between the first sidewall 306 and the bottom surface 303.

The peripheral circuit region β of the substrate 301 will now be described.

In the peripheral circuit region β of the substrate 301, the peripheral circuit described with reference to FIG. 8A may be disposed. Alternatively, as aforementioned, in the case where the substrate is the substrate described with reference to FIG. 8B, a semiconductor layer 352 may be added.

Figure 9:
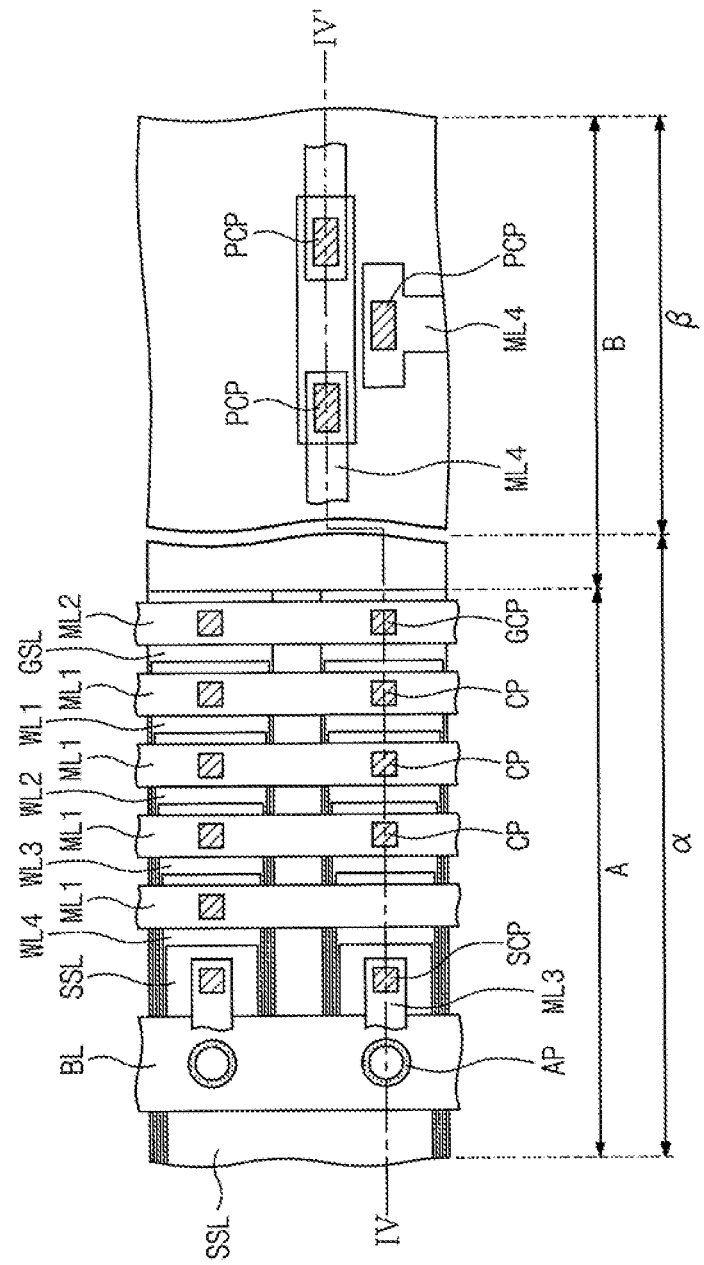
FIG. 9 shows a schematic plan view for explaining a semiconductor device in accordance with another exemplary embodiment of the present disclosure.

A semiconductor device according to a fourth embodiment of the inventive concept will now be described. FIG. 9 is a plan view for explaining a semiconductor device according to a fourth embodiment of the inventive concept, and FIG. 10A is a sectional view taken along line IV-IV' of FIG. 9.

Figure 10A:
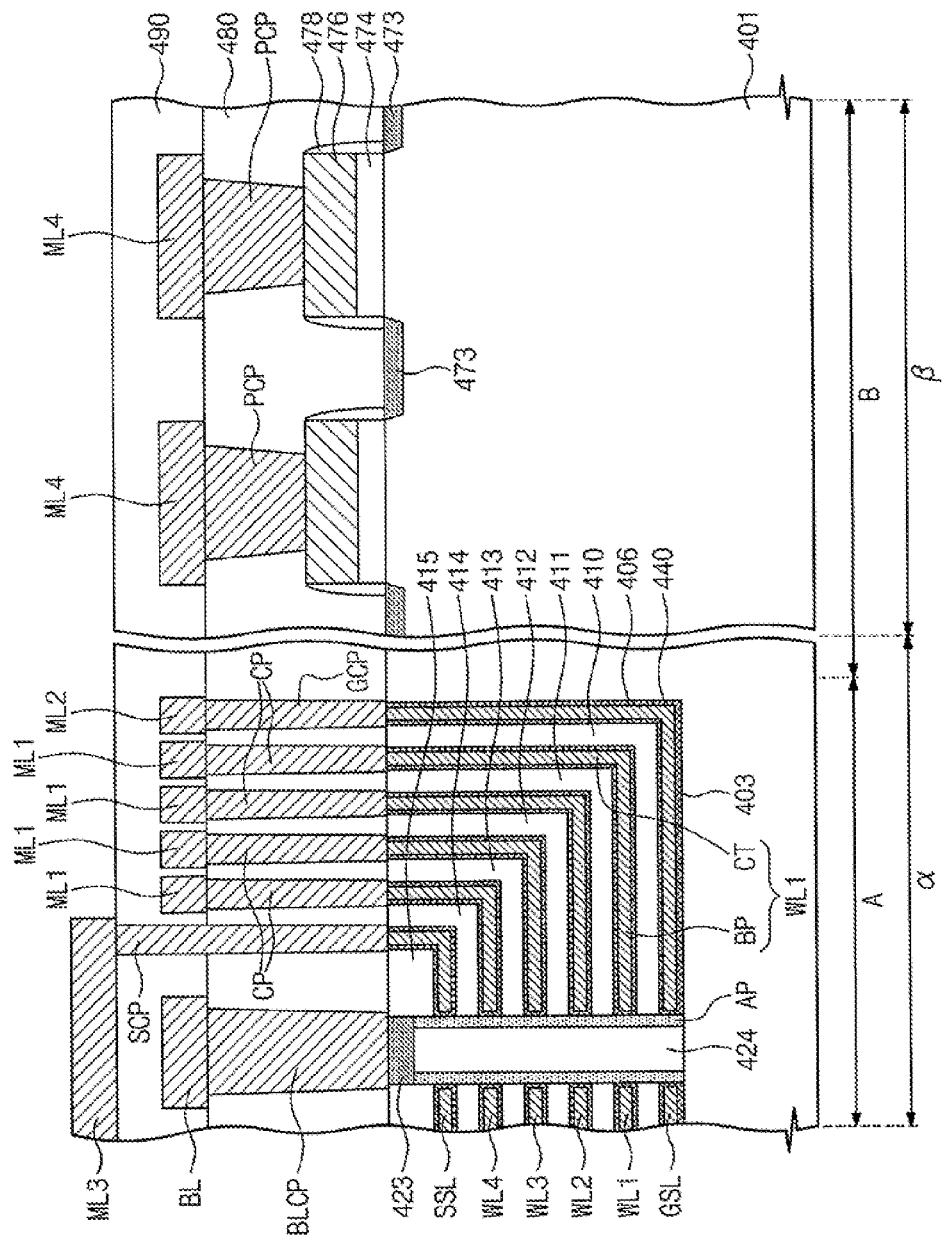
FIG. 10A shows a schematic sectional view taken along line IV-IV' of FIG. 9 in accordance with an exemplary embodiment of the present disclosure.

Referring to FIGS. 9 and 10A, a substrate 401 is provided. The substrate 401 may be a semiconductor-based substrate. The substrate 401 may include a well. The well may include a first conductive type dopant. A common source region 402 may be disposed in the substrate 401. The common source region 402 may be disposed in a plate form within a cell region of the substrate 401. The common source region 402 may include a high concentration of dopant. The dopant included in the common source region 402 may have a second conductive type, which is different from the conductive type of the dopant included in the well. For example, in the case where the well includes a p-type dopant, the common source region 402 may include a high concentration of n-type dopant.

The substrate 401 may include a concave portion A. The concave portion A may include a bottom surface 403, and a first sidewall 406. The substrate 401 may include a convex portion B extended from the first sidewall 406. A top surface of the convex portion B may be in parallel with the bottom surface of the concave portion A. The concave portion A and the convex portion B may be formed by etching a portion of a semiconductor substrate corresponding to the concave portion A and leaving a portion of the semiconductor substrate corresponding to the convex portion B. In this case, the substrate 401 may be one body substrate.

The substrate 401 may include a cell region α and a peripheral circuit region β. In the cell region α, a memory cell may be disposed. The cell region α may include the concave portion A and the convex portion B. In the peripheral circuit region β, a peripheral circuit may be disposed. The peripheral circuit region β may include the convex portion B.

The cell region α of the substrate 401 will now be described.

Conductive patterns GSL, WL1-WL4, SSL spaced apart from one another may be disposed on the concave portion A of the cell region α of the substrate 401. The conductive patterns GSL, WL1-WL4, SSL may include a ground select line GSL, word lines WL1-WL4, and a string select line SSL, which are sequentially stacked on the concave portion A of the substrate 401. The conductive patterns GSL, WL1-WL4, SSL may be spaced apart from one another with inter-gate insulating layers 410-414 in-between. For example, the ground select line GSL, the first inter-gate insulating layer 410, the first word line WL1, the second inter-gate insulating layer 411, the second word line WL2, the third inter-gate insulating layer 412, the third word line WL3, the fourth inter-gate insulating layer 413, the fourth word line WL4, the fifth inter-gate insulating layer 414 and the string select line SSL may be sequentially stacked.

A string select insulating layer 415 may be disposed on the string select line SSL. The insulating layers 410-414 may include bottom portions above the bottom surface 403 of the concave portion A, and sidewall portions extended over the first sidewall 406 from the bottom portions thereof. The conductive patterns GSL, WL1-WL4, SSL may have a line form extending in a first direction. The first direction may be a direction of line IV-IV'.

The conductive patterns GSL, WL1-WL4, SSL may include bottom portions BP disposed above the bottom surface 403 of the concave portion A. Lengths of the bottom portions BP may be shortened as it goes far from the concave portion A of the substrate 401. The bottom portions BP may be in parallel with the bottom surface 403. The bottom portions BP may be in parallel with the top surface of the convex portion B.

The conductive patterns GSL, WL1-WL4, SSL may include contact inclining portions CT extended over the first sidewall 406 from one ends of the bottom portions BP. An extended line of the contact inclining portion CT may cross the bottom surface 403. For example, the extended line may cross the bottom surface at a right angle. A length of the contact inclining portion CT may be decreased as it goes far from the concave portion A. A top surface of the contact inclining portion CT may be coplanar with the top surface of the convex portion B. An angle between the contact inclining portion CT and the bottom portion BP may be 90°.

Conductive plugs may be disposed on the contact inclining portions CT of the word lines WL1-WL4, respectively. The conductive plugs may be word line contact plugs CP. The word lines WL1-WL4 may be electrically connected with the word line contact plugs CP, respectively. The word line contact plugs CP may penetrate a first interlayer insulating layer 480. First conductive lines ML1 may be disposed on the word line contact plugs CP and the first interlayer insulating layer 480. The word line contact plugs CP may be electrically connected with the first conductive lines ML1. The first conductive lines ML1 may extend in a second direction crossing the first direction. The first conductive lines ML1 may be electrically connected with the word lines WL1-WL4 through the word line contact plugs CP. Unlike this, the first conductive lines ML1 may be directly connected with the word lines WL1-WL4. A second interlayer insulating layer 490 covering the first conductive lines ML1 may be disposed. The first and second interlayer insulating layers 480 and 490 may include the same material.

A conductive plug may be disposed on the contact inclining portion CT of the ground select line GSL. The conductive plug may be a ground select contact plug GCP. The ground select line GSL may be electrically connected with the ground select contact plug GCP. The ground select contact plug GCP may penetrate the first interlayer insulating layer 480. A second conductive line ML2 may be disposed on the ground select contact plug GCP and the first interlayer insulating layer 480. The ground select contact plug GCP may be electrically connected with the second conductive line ML2. The second conductive line ML2 may extend in the second direction. The second conductive line ML2 may be electrically connected with the ground select line GSL through the ground select contact plug GCP. Unlike this, the second conductive line ML2 may be directly connected with the ground select line GSL. The second interlayer insulating layer 490 may cover the second conductive line ML2.

A conductive plug may be disposed on the contact inclining portion CT of the string select line SSL. The conductive plug may be a string select contact plug SCP. The string select line SSL may be electrically connected with the string select contact plug SCP. The string select contact plug SCP may penetrate the first interlayer insulating layer 480 and the second interlayer insulating layer 490. A third conductive line ML3 may be disposed on the string select contact plug SCP and the second interlayer insulating layer 490. The string select contact plug SCP may be electrically connected with the third conductive line ML3. The third conductive line ML3 may extend in the first direction.

An active memory string structure extending upward from the bottom surface 403 of the concave portion A of the substrate 401 may be disposed. The active memory string structure may extend perpendicular to the substrate 401. The active memory string structure may penetrate the conductive patterns GSL, WL1-WL4, SSL. Unlike this, as described with reference to FIG. 6B, the active memory string structure may face the sidewalls of the conductive patterns GSL, WL1-WL4, SSL. One end of the active memory string structure may be electrically connected with the common source region 402. A drain region 423 may be disposed at the other end of the active memory string. The drain region 423 may be a region doped with a high concentration of dopant. The active memory string structure may include a single crystal-line semiconductor.

A bit line contact plug BLCP may be disposed on the drain region 423 of the active memory string structure. The bit line contact plug BLCP may be electrically connected with the drain region D and penetrate the first interlayer insulating layer 480. A bit line BL may be disposed on the bit line contact plug BLCP. The bit line BL may be connected with the drain region 423 of the active memory string structure through the bit line contact plug BLCP. Unlike this, the bit line BL may be directly connected with the drain region 423. The bit line BL may extend in the second direction. The bit line BL may cross the string select line SSL.

An information storage layer 440 may be disposed between the sidewall of the active memory string structure and the conductive patterns GSL, WL1-WL4, SSL. The information storage layer 440 may be disposed between the conductive patterns GSL, WL1-WL4, SSL and the insulating layers 410-415.

The peripheral circuit region of the substrate 401 will now be described.

A peripheral circuit may be disposed on a top surface of the convex portion B of the peripheral circuit region β. A gate insulating layer 474 may be disposed on the top surface of the convex portion B. The gate insulating layer 474 may include a silicon oxide layer. The gate insulating layer 474 may include a portion formed by thermally oxidizing the substrate 401. A gate electrode 476 may be disposed on the gate insulating layer 474. The gate electrode 476 may include one selected from the group consisting of doped polysilicon, metal and metal silicide. A gate spacer 478 may be disposed on both sidewalls of the gate electrode 476. Source and drain regions 473 may be disposed in the convex portion B at both sides of the gate electrode 476. The source and drain regions 473 may be regions doped with a high concentration of dopant. A peripheral circuit contact plug PCP penetrating the first interlayer insulating layer 480 may be disposed on the gate electrode 476 and the source and drain regions 473. A fourth conductive line ML4 may be disposed on the peripheral circuit contact plug PCP. A second interlayer insulating layer 490 may be disposed on the fourth conductive line ML4.

Figure 10B:
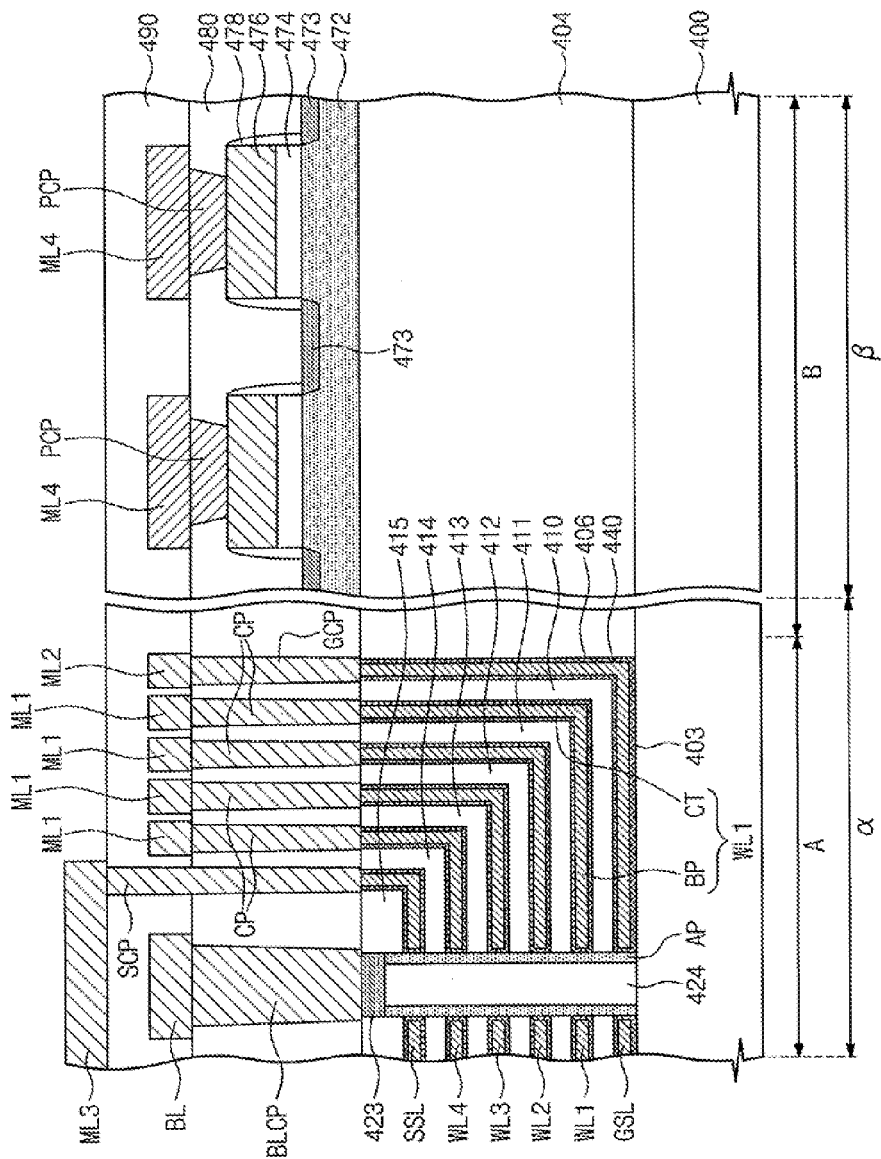
FIG. 10B shows a schematic sectional view taken along line IV-IV' of FIG. 9 in accordance with another exemplary embodiment of the present disclosure.

A modified example of the fourth embodiment of the inventive concept will now be described. FIG. 10B is a sectional view taken along line IV-IV' of FIG. 9, for explaining a modified example of the fourth embodiment of the inventive concept.

Referring to FIGS. 9 and 10B, a substrate 400 is provided. A common source region 402 may be disposed in the substrate 400. The substrate 400 may include a concave portion A. The concave portion A may include a bottom surface 403, and a first sidewall 406. The substrate 400 may include a convex portion B extending from the first sidewall 406. A top surface of the convex portion B may be in parallel with the bottom surface 403 of the concave portion A. The convex portion B may be defined by an insulating layer 404 on the substrate 400.

The substrate 400 may include a cell region α and a peripheral circuit region β. In the cell region α, a memory cell may be disposed. In the peripheral circuit region β, a peripheral circuit may be disposed.

The cell region α of the substrate 400 will now be described.

In the concave portion A of the cell region α, the memory cell described with reference to FIG. 10A may be disposed.

The peripheral circuit region β of the substrate 400 will now be described.

A peripheral circuit may be disposed on a top surface of the convex portion B of the peripheral circuit region β. A semiconductor layer 472 may be disposed on a top surface of the insulating layer 404. The semiconductor layer 472 may include semiconductor materials including polysilicon, crystalline silicon and single crystalline silicon. A gate insulating layer 474 may be disposed on the semiconductor layer 472. The gate insulating layer 474 may include a silicon oxide layer. The gate insulating layer 474 may include a portion formed by thermally oxidizing the semiconductor layer 472. A gate electrode 476 may be disposed on the gate insulating layer 474. The gate electrode 476 may include at least one selected from the group consisting of doped polysilicon, metal and metal silicide. A spacer 478 may be disposed on both sidewalls of the gate electrode 476. Source and drain regions 473 may be disposed in the semiconductor layer 472 at both sides of the gate electrode 476. The source and drain regions 473 may be regions doped with a high concentration of dopant.

A peripheral circuit contact plug PCP penetrating the first interlayer insulating layer 480 may be disposed on the gate electrode 476 and the source and drain regions 473. A fourth conductive line ML4 may be disposed on the peripheral circuit contact plug PCP. A second interlayer insulating layer 490 may be disposed on the fourth conductive line ML4.

Figure 10C:
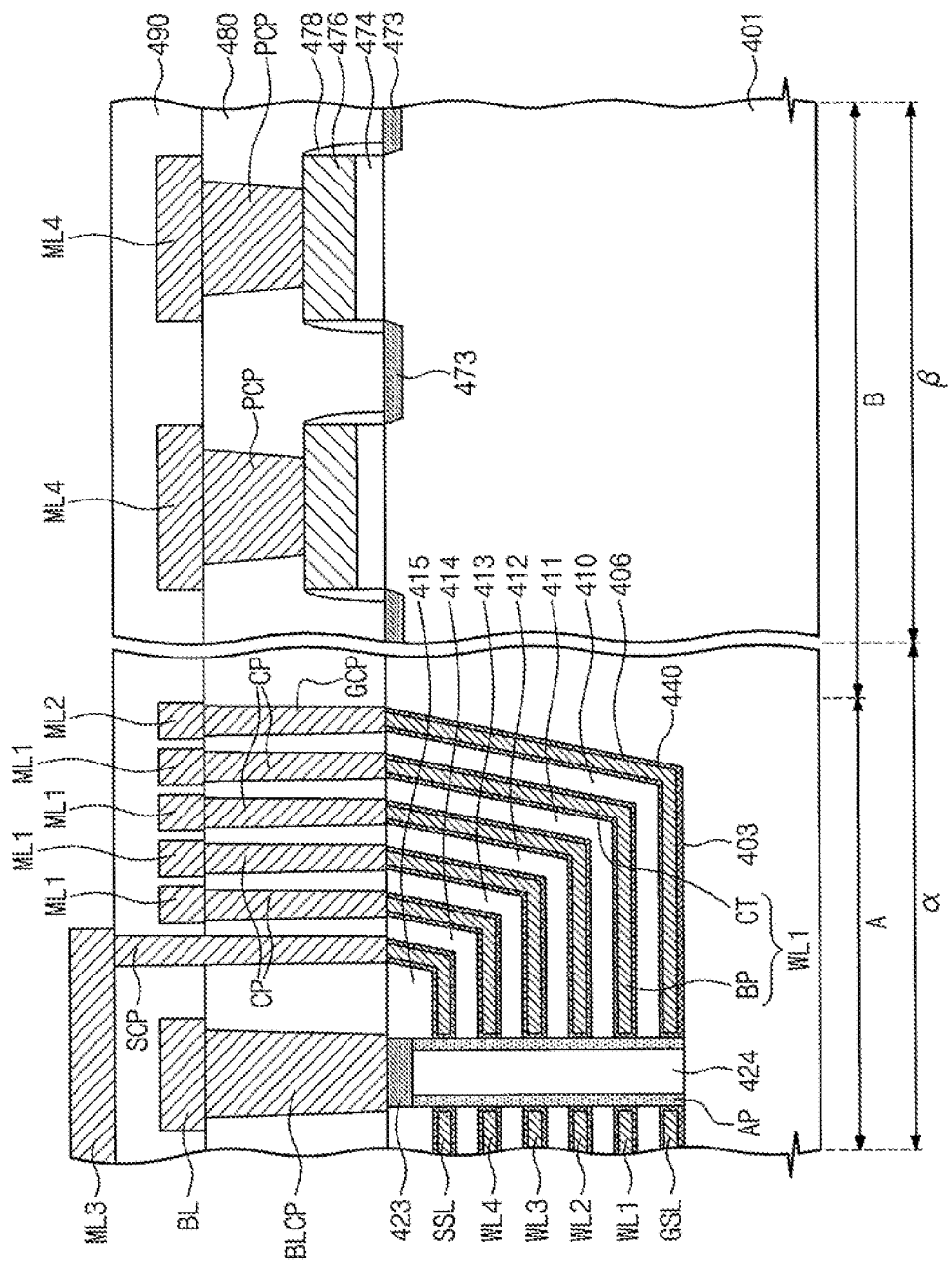
FIG. 10C shows a schematic sectional view taken along line IV-IV' of FIG. 9 in accordance with an exemplary embodiment of the present disclosure.

A semiconductor device according to another modified example of the fourth embodiment of the inventive concept will now be described. FIG. 10C is a sectional view taken along line IV-IV' of FIG. 9, for showing another modified example of the fourth embodiment of the inventive concept.

Referring to FIGS. 9 and 10O, a substrate 401 is provided. A common source region 402 may be disposed in the substrate 401. The substrate 401 may include a concave portion A. The concave portion A may include a bottom surface 403, and a first sidewall 406. The first sidewall 406 may be inclined to the bottom surface 403 of the concave portion A. For example, the first sidewall 406 may have an angle, which is 50 to 90 degrees with respect to the bottom surface 403. The substrate 401 may include a convex portion B extending from the first sidewall 406. A top surface of the convex portion B may be in parallel with the bottom surface 403 of the concave portion A. The concave portion A and the convex portion B of the substrate 401 may be defined through an etching process. Alternatively, as described with reference to FIG. 10B, the convex portion B may be defined by the insulating layer 404 on the substrate 400.

The substrate 401 may include a cell region α and a peripheral circuit region β. In the cell region α, a memory cell may be disposed. The peripheral circuit region β may include a peripheral circuit.

The cell region α of the substrate 401 will now be described.

In the concave portion A of the cell region α, the memory cell described with reference to FIG. 10A may be disposed. A contact inclining portions CT of the conductive patterns GSL, WL1-WL4, SSL may have an inclined slope with respect to the bottom surface 403. An angle between the contact inclining portions CT of the conductive patterns GSL, WL1-WL4, SSL and the bottom surface 403 may be equal to the angle between the first sidewall 406 and the bottom surface 403.

The peripheral circuit region β of the substrate 401 will now be described.

In the peripheral circuit region β of the substrate 401, the peripheral circuit described with reference to FIG. 10A may be disposed. Alternatively, as aforementioned, in the case where the substrate is the substrate described with reference to FIG. 10B, a semiconductor layer 472 may be added.

Figure 11A:
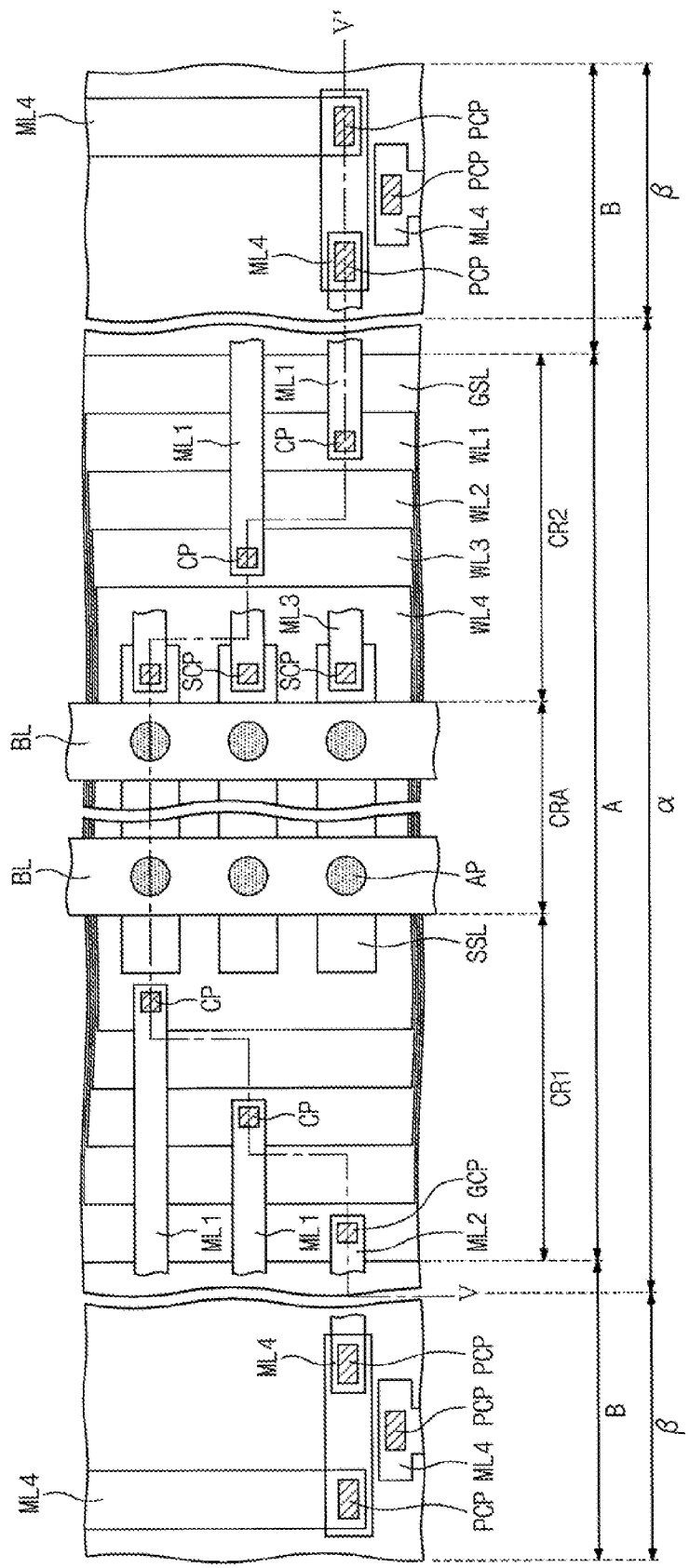
FIGS. 11A through 11B show schematic plan views for explaining a semiconductor device in accordance with an exemplary embodiment of the present disclosure.
Figure 11B:
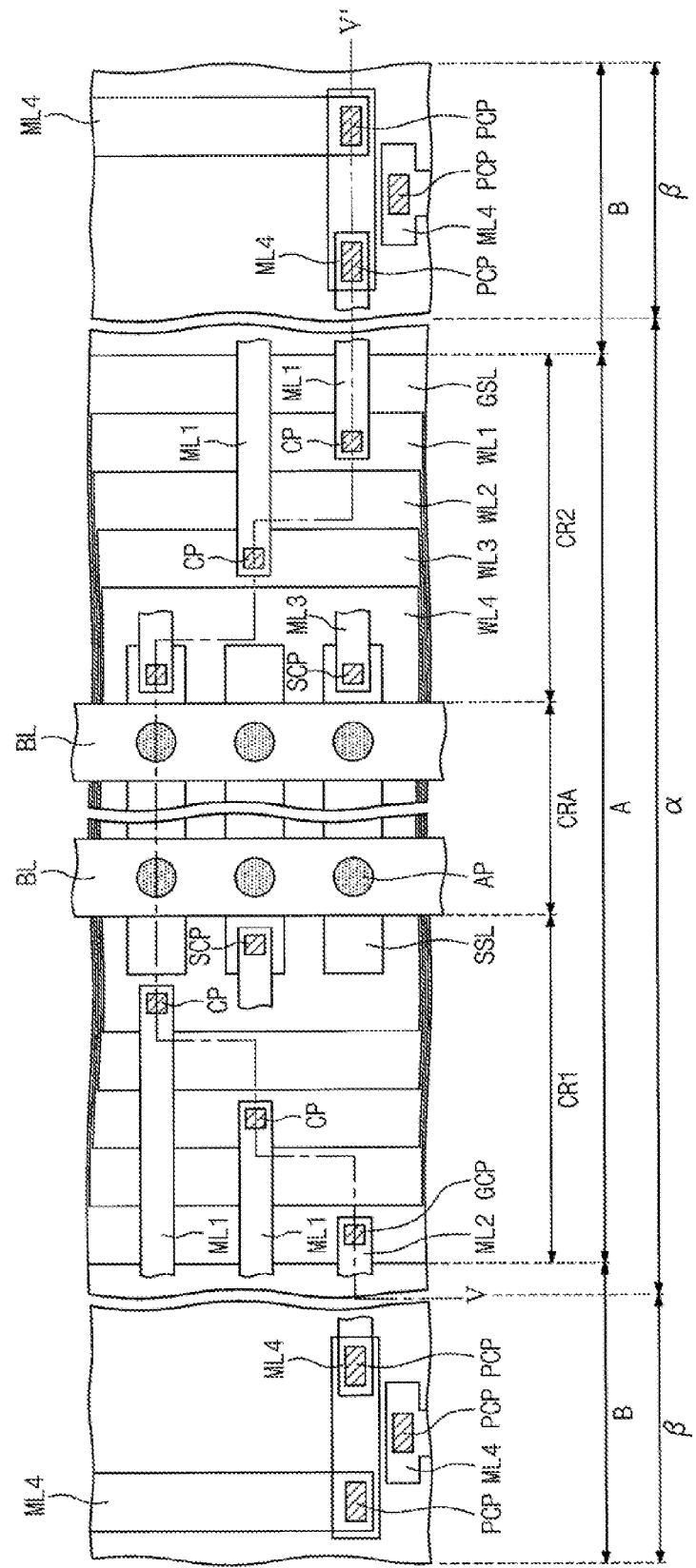

A semiconductor device according to a fifth embodiment of the inventive concept will now be described. FIG. 11A through FIG. 11B is a plan view for explaining a semiconductor device according to a fifth embodiment of the inventive concept, and FIG. 12A is a sectional view taken along line V-V' of FIG. 11A through FIG. 11B.

Figure 12A:
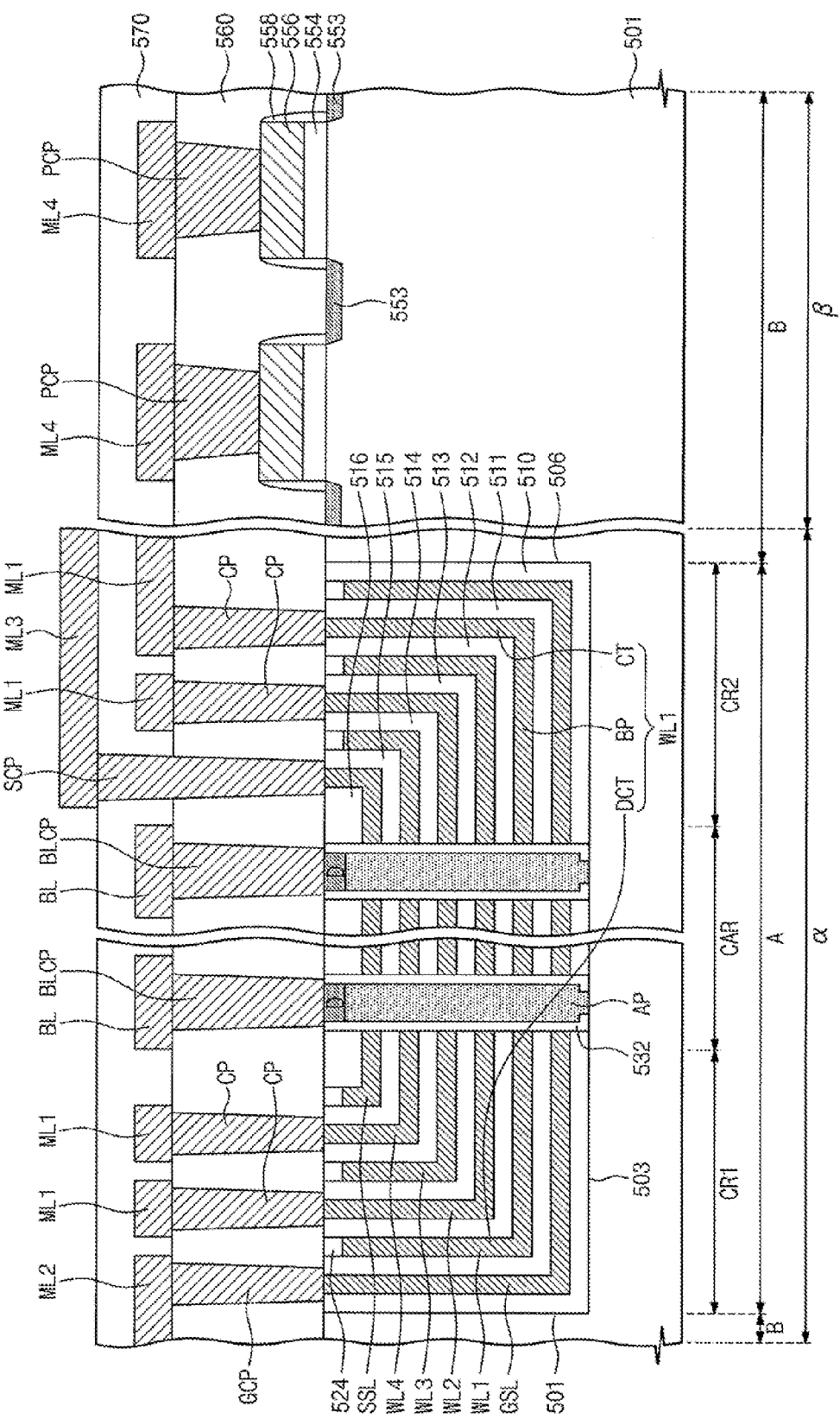
FIG. 12A shows a schematic sectional view taken along line V-V' of FIGS. 11A through 11B in accordance with an exemplary embodiment of the present disclosure.

Referring to FIGS. 11A through 11B and 12A, a substrate 501 is provided. The substrate 501 may be a semiconductor-based substrate. The substrate 501 may include a well. The well may include a first conductive type dopant. A common source region 502 may be disposed in the substrate 501. The common source region 502 may be disposed in a plate form within a cell region of the substrate 501. The common source region 502 may include a high concentration of dopant. The dopant included in the common source region 502 may have a second conductive type, which is different from the conductive type of the dopant included in the well. For example, in the case where the well includes a p-type dopant, the common source region 502 may include a high concentration of n-type dopant.

The substrate 501 may include a concave portion A. The concave portion A may include a bottom surface 503, and first and second sidewalls 505 and 506 facing each other. The substrate 501 may include a convex portion B extended from the first and second sidewalls 505 and 506. A top surface of the convex portion B may be in parallel with the bottom surface of the concave portion A. The concave portion A and the convex portion B may be formed by etching a portion of a semiconductor substrate corresponding to the concave portion A and leaving a portion of the semiconductor substrate corresponding to the convex portion B. In this case, the substrate 501 may be one body substrate.

The substrate 501 may include a cell region α and a peripheral circuit region β. In the cell region α, a memory cell may be disposed. The cell region α may include the concave portion A and the convex portion B. In the peripheral circuit region β, a peripheral circuit may be disposed. The peripheral circuit region β may include the convex portion B.

The cell region α of the substrate 501 will now be described.

The cell region α may include a first contact region CR1 adjacent to the first sidewall 505 of the concave portion A, and a second contact region CR2 adjacent to the second sidewall 506. A cell array region CAR may be disposed between the first contact region CR1 and the second contact region CR2. That is, the first contact region CR1 and the second contact region CR2 may be spaced apart from each other with the cell array region CAR in-between.

Conductive patterns GSL, WL1-WL4, SSL spaced apart from one another may be disposed on the substrate 501. The conductive patterns GSL, WL1-WL4, SSL may include a ground select line GSL, word lines WL1-WL4, and a string select line SSL, which are sequentially stacked on the concave portion A of the substrate 501. The conductive patterns GSL, WL1-WL4, SSL may be spaced apart from one another with inter-gate insulating layers 511-515 in-between. For example, the ground select line GSL, the first inter-gate insulating layer 511, the first word line WL1, the second inter-gate insulating layer 512, the second word line WL2, the third inter-gate insulating layer 513, the third word line WL3, the fourth inter-gate insulating layer 514, the fourth word line WL4, the fifth inter-gate insulating layer 515 and the string select line SSL may be sequentially stacked. The insulating layers 511-515 may include bottom portions above the bottom surface 503 of the concave portion A of the substrate 501, and sidewall portions extended over the first sidewall 505 and the second sidewall 506 from the bottom portions thereof.

A ground select insulating layer 510 may be disposed between the bottom surface 503 of the concave portion A of the substrate 501, the first and second sidewalls 505, 506, and the ground select line GSL. A string select insulating layer 516 may be disposed on the string select line SSL. The word lines WL1-WL4 may have a plate form parallel to the concave portion A.

The conductive patterns GSL, WL1-WL4, SSL may include bottom portions BP disposed above the bottom surface 503 of the concave portion A. Lengths of the bottom portions BP may be shortened as it goes far from the concave portion A of the substrate 501. The bottom portions BP may be in parallel with the bottom surface 503. The bottom portions BP may be in parallel with the top surface of the convex portion B.

The conductive patterns GSL, WL1-WL4, SSL may include contact inclining portions CT extended over one of the first sidewall 505 and the second sidewall 506 from one ends of the bottom portions BP. A contact region where the contact inclining portion of any one of the conductive patterns is disposed may be different from a contact region where the contact inclining portion of another conductive pattern adjacent to the any one of the conductive patterns. For example, in the case where the contact inclining portion CT of the ground select line GSL is disposed in the first contact region CR1, the contact inclining portion CT of the first word line WL1 adjacent to the ground select line GSL may be disposed in the second contact region CR2. An extended line of the contact inclining portion CT may cross the bottom surface 503. The extended line may cross the bottom surface 503 at a right angle. A length of the contact inclining portion CT may be decreased as it goes far from the concave portion A. A top surface of the contact inclining portion CT may be coplanar with the top surface of the convex portion B. An angle between the contact inclining portion CT and the bottom portion BP may be 90°.

The conductive patterns GSL, WL1-WL4, SSL may include dummy inclining portions DCT extended over the other one of the first sidewall 505 and the second sidewall 506 from the other ends of the bottom portions BP above the bottom surface 503. A contact region where the dummy inclining portion of any one of the conductive patterns GSL, WL1-WL4, SSL is disposed may be different from a contact region where the dummy inclining portion of another conductive pattern adjacent to the any one of the conductive patterns. For example, in the case where the dummy inclining portion DCT of the string select line SSL is disposed in the first contact region CR1, the dummy inclining portion DCT of the fourth word line WL4 adjacent to the string select line SSL may be disposed in the second contact region CR2. Each of the conductive patterns GSL, WL1-WL4, SSL may include one contact inclining portion CT and one dummy inclining portion DCT. In one of the conductive patterns GSL, WL1-WL4, SSL, a length of the dummy inclining portion DCT may be shorter than that of the contact inclining portion CT. The contact inclining portion CT may be disposed between the dummy inclining portions DCT adjacent to each other. The contact inclining portions CT adjacent to one of the dummy inclining portions DCT may be spaced apart from each other by the sidewalls of the insulating layers interposed therebetween.

A dummy insulating layer pattern 524 may be disposed on the dummy inclining portion DCT. A top surface of the dummy insulating layer pattern 524 may be coplanar with the top surface of the convex portion B. The top surface of the dummy insulating layer pattern 524 may be coplanar with a top surface of the string select insulating layer 516. Sidewalls of the dummy insulating layer pattern 524 may be coplanar with sidewalls of the dummy inclining portion DCT. The dummy insulating layer pattern 524 may include the same material as the insulating layers 510-516.

Conductive plugs may be disposed on the contact inclining portions CT of the word lines WL1-WL4, respectively. The conductive plugs may be word line contact plugs CP. The word lines WL1-Wl4 may be electrically connected with the word line contact plugs CP, respectively. Widths of the word line contact plugs CP may be wider than those of the top surfaces of the contact inclining portions CT of the word lines WL1-WL4. The widths of the word line contact plugs CP may be wider than widths between the dummy inclining portions DCT adjacent to the contact inclining portions of the word lines WL1-WL4. The word line contact plugs may penetrate a first interlayer insulating layer 560. First conductive lines ML1 may be disposed on the word line contact plugs CP and the first interlayer insulating layer 560. The word line contact plugs CP may be electrically connected with the first conductive lines ML1. Some of the first conductive lines ML1 may extend in a first direction. Another some of the first conductive lines ML1 may extend in a second direction opposite to the first direction. For example, the first conductive lines ML1 connected with the word lines WL2, WL4 positioned at odd-numbered layers of the conductive patterns above the substrate 101 may extend in the first direction, and the first conductive lines ML1 connected with the word lines WL1, WL3 positioned at even-numbered layers of the conductive patterns above the substrate 101 may extend in the second direction. The first direction may be a direction of line V'-V. The first conductive lines ML1 may be electrically connected with the word lines WL1-WL4 through the word line contact plugs CP. Unlike this, the first conductive lines ML1 may be directly connected with the word lines WL1-WL4. A second interlayer insulating layer 570 covering the first conductive lines ML1 may be disposed. The first and second interlayer insulating layers 560 and 570 may include the same material.

The first conductive lines ML1 may extend in a second direction crossing the first direction. The first conductive lines ML1 may be electrically connected with the word lines WL1-WL4 through the word line contact plugs CP. Unlike this, the first conductive lines ML1 may be directly connected with the word lines WL1-WL4. A second interlayer insulating layer 570 covering the first conductive lines ML1 may be disposed. The first and second interlayer insulating layers 560 and 570 may include the same material.

A conductive plug may be disposed on the contact inclining portion CT of the ground select line GSL. The conductive plug may be a ground select contact plug GCP. The ground select line GSL may be electrically connected with the ground select contact plug GCP. A width of the ground select contact plug GCP may be wider than a width of a top surface of the contact inclining portion CT of the ground select line GSL. The ground select contact plug GCP may penetrate the first interlayer insulating layer 560. A second conductive line ML2 may be disposed on the ground select contact plug GCP and the first interlayer insulating layer 560. The ground select contact plug GCP may be electrically connected with the second conductive line ML2. The second conductive line ML2 may extend in the first direction. The second conductive line ML2 may be electrically connected with the ground select line GSL through the ground select contact plug GCP. Unlike this, the second conductive line ML2 may be directly connected with the ground select line GSL. The second interlayer insulating layer 570 may cover the second conductive line ML2.

A conductive plug may be disposed on the contact inclining portion CT of the string select line SSL. The conductive plug may be a string select contact plug SCP. The string select line SSL may be electrically connected with the string select contact plug SCP. A width of the string select contact plug SCP may be wider than a width of a top surface of the contact inclining portion CT of the string select line SSL. The string select contact plug SCP may penetrate the first interlayer insulating layer 560 and the second interlayer insulating layer 570. A third conductive line ML3 may be disposed on the string select contact plug SCP and the second interlayer insulating layer 570. The string select contact plug SCP may be electrically connected with the third conductive line ML3. The third conductive line ML3 may extend in the second direction. The second interlayer insulating layer 570 may cover the third conductive line ML3. Referring to the FIG. 10B, a plurality of the string select line SSL may dispose in the concave portion. And the third conductive lines ML3 of the string select lines SSL adjacent to each other may extend different direction.

The conductive lines ML1, ML2, ML3 may be extended separated in the first direction and the second direction sides with the cell array region CAR in-between. For example, the conductive lines ML2, ML1 connected with the conductive patterns GSL, WL2, WL4 of which the contact inclining portions CT are disposed in the first contact region may extend in the first direction, and the conductive lines ML1, ML3 connected with the conductive patterns WL1, WL3, SSL of which the contact inclining portions CT are disposed in the second contact region may extend in the second direction.

An active memory string structure extending upward from the bottom surface 503 of the concave portion A may be disposed. The active memory string structure may extend perpendicular to the substrate 501. The active memory string structure may penetrate the conductive patterns GSL, WL1-WL4, SSL so that one end of the active memory string structure may be electrically connected with the common source region 502. A drain region D may be disposed at the other end of the active memory string. The drain region D may be a region doped with a high concentration of dopant. The active memory string structure may include a single crystalline semiconductor.

A bit line contact plug BLCP may be disposed on the drain region D of the active memory string structure. The bit line contact plug BLCP may be electrically connected with the drain region D and penetrate the first interlayer insulating layer 560. A bit line BL may be disposed on the bit line contact plug BLCP. The bit line BL may be connected with the drain region D of the active memory string structure through the bit line contact plug BLCP. Unlike this, the bit line BL may be directly connected with the drain region D. The bit line BL may extend in the first direction, and a third direction crossing the second direction. The third direction may cross the first and second directions at a right angle. The bit line BL may cross the string select line SSL.

An information storage layer 532 may be disposed between the sidewall of the active memory string structure and the conductive patterns GSL, WL1-WL4, SSL. The information storage layer 532 may be provided in a cylindrical type penetrating the conductive patterns GSL, WL1-WL4, SSL. The information storage layer 532 may be provided to surround the active memory string structure. The information storage layer 532 may be disposed between the sidewall of the active memory string structure and the conductive patterns GSL, WL1-WL4, SSL and the insulating layers 510-516.

The information storage layer 532 according to the fifth embodiment of the inventive concept may be the information storage layer described with reference to FIG. 3.

The peripheral circuit region β of the substrate 501 will now be described.

A peripheral circuit may be disposed on a top surface of the convex portion B of the peripheral circuit region β. A gate insulating layer 554 may be disposed on the top surface of the convex portion B. The gate insulating layer 554 may include a silicon oxide layer. The gate insulating layer 554 may include a portion formed by thermally oxidizing the top surface of the convex portion B. A gate electrode 556 may be disposed on the gate insulating layer 554. The gate electrode 556 may include one selected from the group consisting of doped polysilicon, metal and metal silicide. A spacer 558 may be disposed on both sidewalls of the gate electrode 556. Source and drain regions 553 may be disposed in the convex portion B at both sides of the gate electrode 556. The source and drain regions 553 may be regions doped with a high concentration of dopant.

A peripheral circuit contact plug PCP penetrating the first interlayer insulating layer 560 may be disposed on the gate electrode 556 and the source and drain regions 553. A fourth conductive line ML4 may be disposed on the peripheral circuit contact plug PCP. A second interlayer insulating layer 570 may be disposed on the fourth conductive line ML4.

Figure 12B:
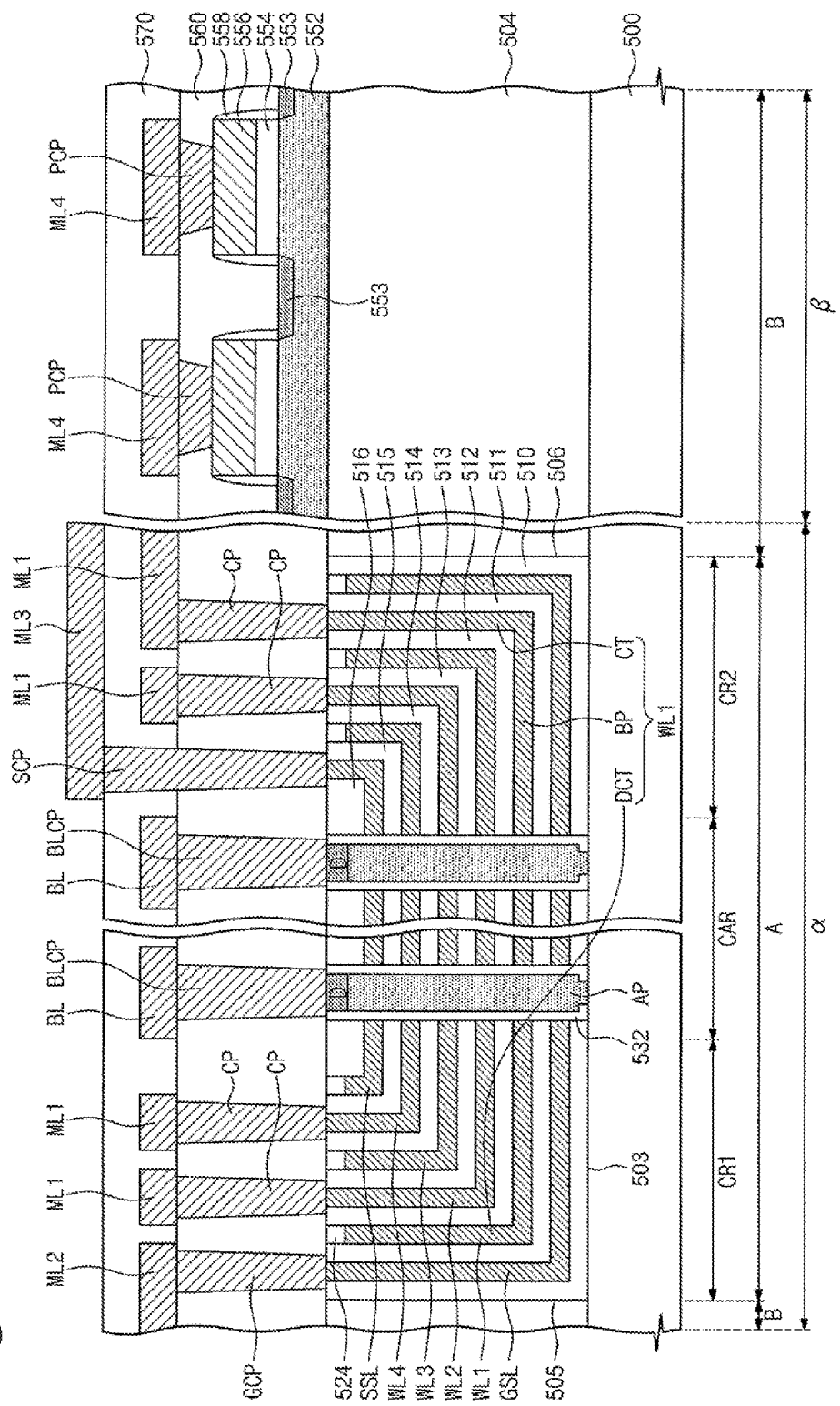
FIG. 12B shows a schematic sectional view taken along line V-V of FIGS. 11A through 11B in accordance with an exemplary embodiment of the present disclosure.

A modified example of the fifth embodiment of the inventive concept will now be described. FIG. 12B is a sectional view taken along line V-V' of FIG. 11A through FIG. 11B, for explaining a modified example of the fifth embodiment of the inventive concept.

Referring to FIGS. 11A through 11B and 12B, a substrate 500 is provided. A common source region 502 may be disposed in the substrate 500. The substrate 500 may include a concave portion A. The concave portion A may include a bottom surface 503, and first and second sidewalls 505 and 506 facing each other. The substrate 500 may include a convex portion B extending from the first and second sidewalls 505 and 506. A top surface of the convex portion B may be in parallel with the bottom surface 503 of the concave portion A. The convex portion B may be defined by an insulating layer 504 disposed on the substrate 500.

The substrate 500 may include a cell region α and a peripheral circuit region β. In the cell region α, a memory cell may be disposed. In the peripheral circuit region β, a peripheral circuit may be disposed.

The cell region α of the substrate 500 will now be described.

The cell region α may include a first contact region CR1 adjacent to the first sidewall 505 of the concave portion A, and a second contact region CR2 adjacent to the second sidewall 506. The memory cell explained with reference to FIG. 12A may be disposed in the cell region α of the substrate 500.

The peripheral circuit region β of the substrate 500 will now be described.

A peripheral circuit may be disposed on a top surface of the convex portion B of the peripheral circuit region β. A semiconductor layer 552 may be disposed on a top surface of the insulating layer 504. The semiconductor layer 552 may be semiconductor materials including polysilicon, crystalline silicon and single crystalline silicon. A gate insulating layer 554 may be disposed on the semiconductor layer 552. The gate insulating layer 554 may include a silicon oxide layer. The gate insulating layer 554 may include a portion formed by thermally oxidizing the semiconductor layer 552. A gate electrode 556 may be disposed on the gate insulating layer 554. The gate electrode 556 may include one selected from the group consisting of doped polysilicon, metal and metal silicide. A spacer 558 may be disposed on both sidewalls of the gate electrode 556. Source and drain regions 553 may be disposed in the semiconductor layer 552 at both sides of the gate electrode 556. The source and drain regions 553 may be regions doped with a high concentration of dopant.

A peripheral circuit contact plug PCP penetrating the first interlayer insulating layer 560 may be disposed on the gate electrode 556 and the source and drain regions 553. A fourth conductive line ML4 may be disposed on the peripheral circuit contact plug PCP. A second interlayer insulating layer 570 may be disposed on the fourth conductive line ML4.

Figure 12C:
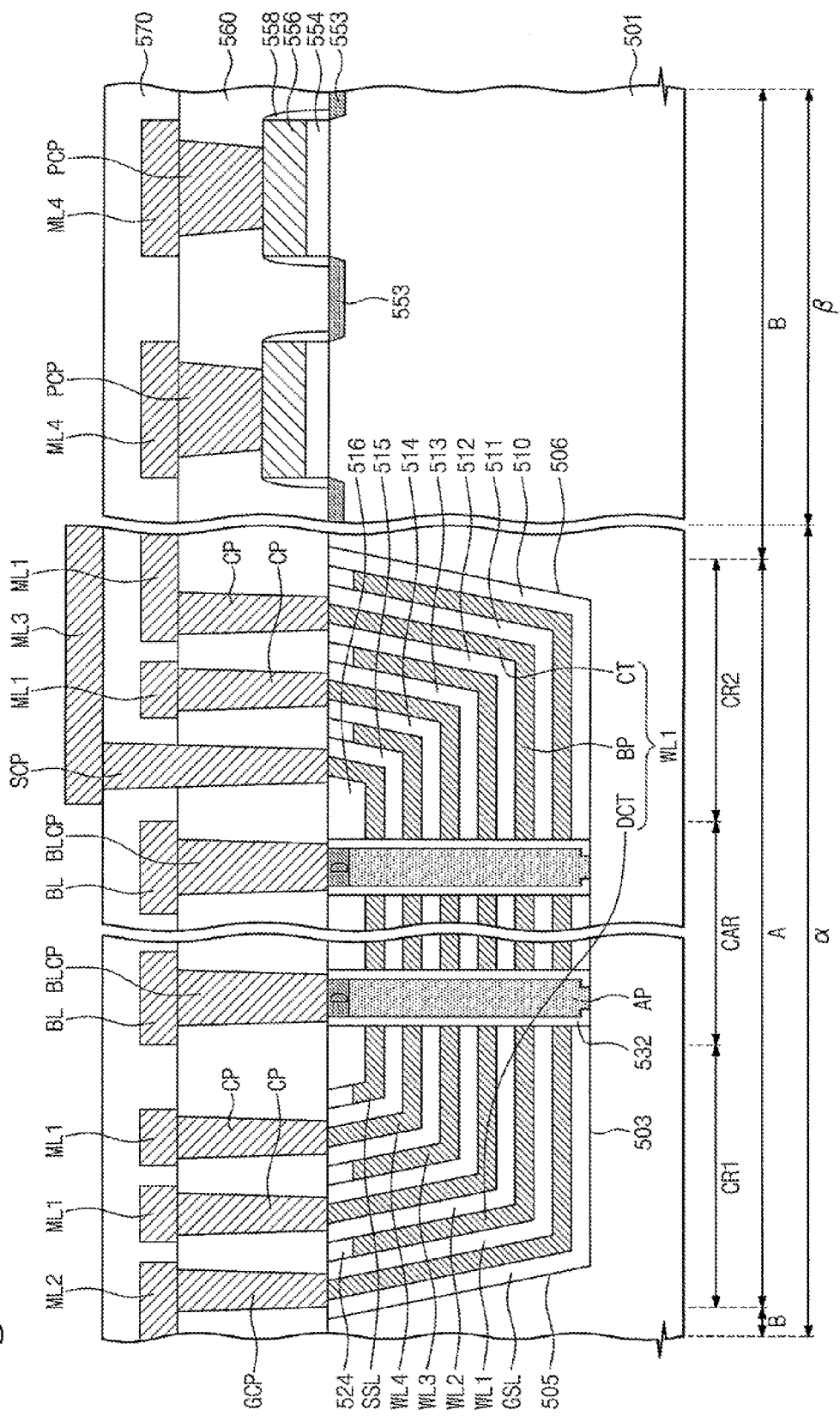
FIG. 12C shows a schematic sectional view taken along line V-V' of FIGS. 11A through 11B in accordance with an exemplary embodiment of the present disclosure.

A semiconductor device according to another modified example of the fifth embodiment of the inventive concept will now be described. FIG. 12C is a sectional view taken along line V-V' of FIG. 11A through 11B, for showing another modified example of the fifth embodiment of the inventive concept.

Referring to FIGS. 11A through 11B and 12C, a substrate 501 is provided. A common source region 502 may be disposed in the substrate 501. The substrate 501 may include a concave portion A. The concave portion A may include a bottom surface 503, and first and second sidewalls 505 and 506 facing each other. Any one of the first and second sidewalls 505 and 506 may be inclined to the bottom surface 503 of the concave portion A. For example, the first sidewall 505 and the second sidewall 506 may have an angle, which is 50 to 90 degrees with respect to the bottom surface 503. A slope of the first sidewall 505 with respect to the bottom surface 503 may be equal to that of the second sidewall 506 with respect to the bottom surface 503. Alternatively, the slope of the first sidewall 505 with respect to the bottom surface 503 may be different from that of the second sidewall 506 with respect to the bottom surface 503. The substrate 501 may include a convex portion B extending from the first and second sidewalls 505 and 506. A top surface of the convex portion B may be in parallel with the bottom surface 503 of the concave portion A. The concave portion A and the convex portion B of the substrate 501 may be defined through an etching process. Alternatively, as described with reference to FIG. 12B, the convex portion B may be defined by the insulating layer 504 on the substrate 501.

The substrate 501 may include a cell region α and a peripheral circuit region β. In the cell region α, a memory cell may be disposed. The peripheral circuit region β may include a peripheral circuit.

The cell region α of the substrate 501 will now be described.

The cell region α may include a first contact region CR1 adjacent to the first sidewall 505 of the concave portion A, and a second contact region CR2 adjacent to the second sidewall 506. The memory cell explained with reference to FIG. 12A may be disposed in the cell region α of the substrate 501. A contact inclining portion CT and a dummy inclining portion DCT of any one of the conductive patterns GSL, WL1-WL4, SSL may have an inclined slope with respect to a bottom portion BP.

An angle between the sidewall adjacent to the contact region where the contact inclining portion CT is disposed, and the bottom surface 503 may be equal to an angle between the contact inclining portion CT and the bottom portion BP. For example, in the case of the first word line WL1, a slope of the contact inclining portion CT with respect to the bottom portion BP may be equal to a slope of the second sidewall 506 with respect to the bottom surface 503. When the slopes of the first sidewall 505 and the second sidewall 506 with respect to the bottom surface 503 are different from each other, the slope of the contact inclining portion with respect to the bottom portion BP in any one conductive pattern may be different from the slope of the dummy inclining portion DCT with respect to the bottom portion BP.

The peripheral circuit region β of the substrate 501 will now be described.

In the peripheral circuit region β of the substrate 501, the peripheral circuit described with reference to FIG. 12A may be disposed. Alternatively, as aforementioned, in the case where the substrate is the substrate described with reference to FIG. 12B, a semiconductor layer 552 may be added.

A method for forming a semiconductor device according to the fifth embodiment will now be described. FIGS. 13A to 13H are cross-sectional views for explaining a method for forming a semiconductor device according to the fifth embodiment of the inventive concept.

Figure 13A:
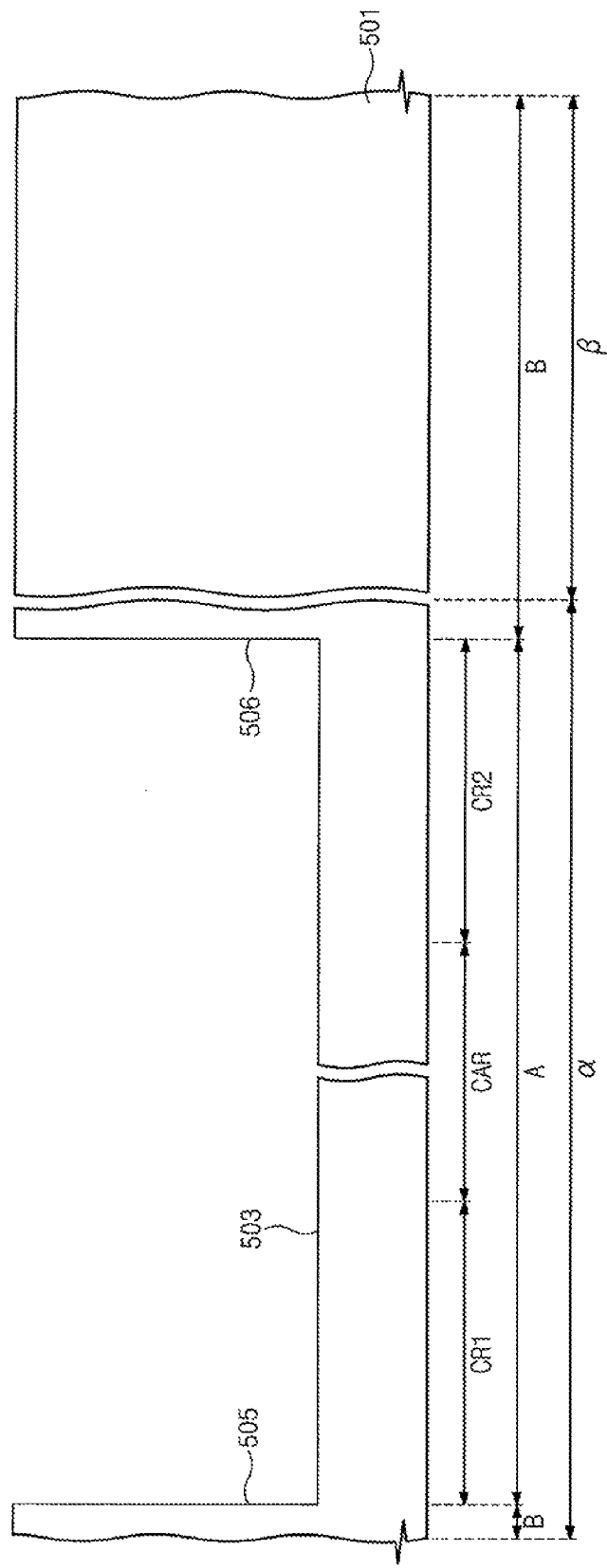

Referring to FIG. 13A, a substrate 501 is provided. The substrate 501 may include a concave portion A. The concave portion A may include a bottom surface 503, and first and second sidewalls 505 and 506 facing each other. The substrate 501 may include a convex portion B extended from the first and second sidewalls 505 and 506. A top surface of the convex portion B may be in parallel with the bottom surface of the concave portion A. A forming of the concave portion A and the convex portion B of the substrate 501 may include etching a portion of a substrate corresponding to the concave portion A and leaving a portion of the substrate corresponding to the convex portion B.

The substrate 501 may include a cell region α and a peripheral circuit region β. In the cell region α, a memory cell may be disposed. The cell region α may include the concave portion A and the convex portion B. The peripheral circuit region β may include a peripheral circuit. The peripheral circuit region β may include the convex portion B.

The cell region α may include a first contact region CR1 adjacent to the first sidewall 505 of the concave portion A, and a second contact region CR2 adjacent to the second sidewall 506. A cell array region CAR may be disposed between the first contact region CR1 and the second contact region CR2. That is, the first contact region CR1 and the second contact region CR2 may be spaced apart from each other with the cell array region CAR in-between.

The substrate 501 may be a single crystalline semiconductor substrate (e.g., p-type silicon wafer). The substrate 501 may include a well. The well may be formed by introducing a dopant into the substrate 501. The dopant may be introduced by a doping process including an ion implantation or a plasma implantation. A common source region 502 may be provided in an upper portion of the substrate 501. The common source region 502 may be formed by doping a dopant into the well. The common source region 502 may include a dopant having a conductive type, which is different from the conductive type of the well. For example, the well may include a p-type dopant and the common source region 502 may include an n-type dopant.

Referring to FIG. 13B, conductive patterns GSL, WL1-WL4, SSL and insulating layers 510-516 may be alternatingly formed on the concave portion A of the substrate 501. For example, the ground select insulating layer 510, the ground select line GSL, the first inter-gate insulating layer 511, the first word line WL1, the second inter-gate insulating layer 512, the second word line WL2, the third inter-gate insulating layer 513, the third word line WL3, the fourth inter-gate insulating layer 514, the fourth word line WL4, the fifth inter-gate insulating layer 515, the string select line SSL and the string select insulating layer 516 may be sequentially deposited. The conductive patterns GSL, WL1-WL4, SSL and the insulating layer 510-516 may be also formed on the top surface of the convex portion B. The conductive patterns GSL, WL1-WL4, SSL may include metal or polycrystalline semiconductor material. The insulating layers 510-516 may include a silicon oxide layer.

A planarizing process may be performed by using the top surface of the convex portion B as an etch stop layer. The planarizing process may be performed by using any of an etch-back or a chemical mechanical polishing (CMP). By the planarizing process, the conductive patterns GSL, WL1-WL4, SSL and the insulating layers 510-516 formed on the convex portion B may be removed.

The conductive patterns GSL, WL1-WL4, SSL may include bottom portions BP disposed above the bottom surface 503 of the concave portion A. The conductive patterns GSL, WL1-WL4, SSL may include contact inclining portions CT extended over one of the first sidewall 505 and the second sidewall 506 from one ends of the bottom portions BP. A contact region where the contact inclining portion of any one of the conductive patterns is disposed may be different from a contact region where the contact inclining portion of another conductive pattern adjacent to the any one of the conductive patterns. An exposed top surface of the contact inclining portion CT may be coplanar with the top surface of the convex portion B.

The conductive patterns GSL, WL1-WL4, SSL may include dummy inclining portions DCT extended over the other one of the first sidewall 505 and the second sidewall 506 from the other ends of the bottom portions BP above the bottom surface 503. A contact region where the dummy inclining portion of any one of the conductive patterns GSL, WL1-WL4, SSL is disposed may be different from a contact region where the dummy inclining portion of another conductive pattern adjacent to the any one of the conductive patterns. Each of the conductive patterns GSL, WL1-WL4, SSL may include one contact inclining portion CT and one dummy inclining portion DCT.

A mask pattern 520 covering the exposed top surface of the contact inclining portions is covered. The mask pattern 520 exposes the dummy inclining portions DCT. The covering of the mask pattern 520 may include forming a mask layer on the substrate 501, and patterning the mask layer. The mask pattern 520 may include a material having an etch selectivity with respect to the conductive patterns GSL, WL1-WL4, SSL and the insulating layers 510-516. For example, the mask pattern 520 may include a silicon nitride layer or a photoresist pattern.

Referring to FIG. 13C, the dummy inclining portions DCT may be partially etched by using the mask pattern 520 as an etch mask. As a result, dummy recess portions 522 may be formed. Lengths of the dummy inclining portions DCT may be shorter than lengths of the contact inclining portions CT. Due to the dummy recess portions 522, sidewalls of the insulating layers 510-516 may be partially exposed. The etching of the dummy inclining portions DCT may be performed by using an etch recipe in which the etch rate of the conductive patterns GSL, WL1-WL4, SSL is higher than that of the mask pattern 520 and the insulating layers 510-516. Thereafter, the mask pattern 520 may be removed.

The string select line SSL may be patterned in a line form extending in a first direction. The first direction may be a direction of line V-V'.

Figure 13D:
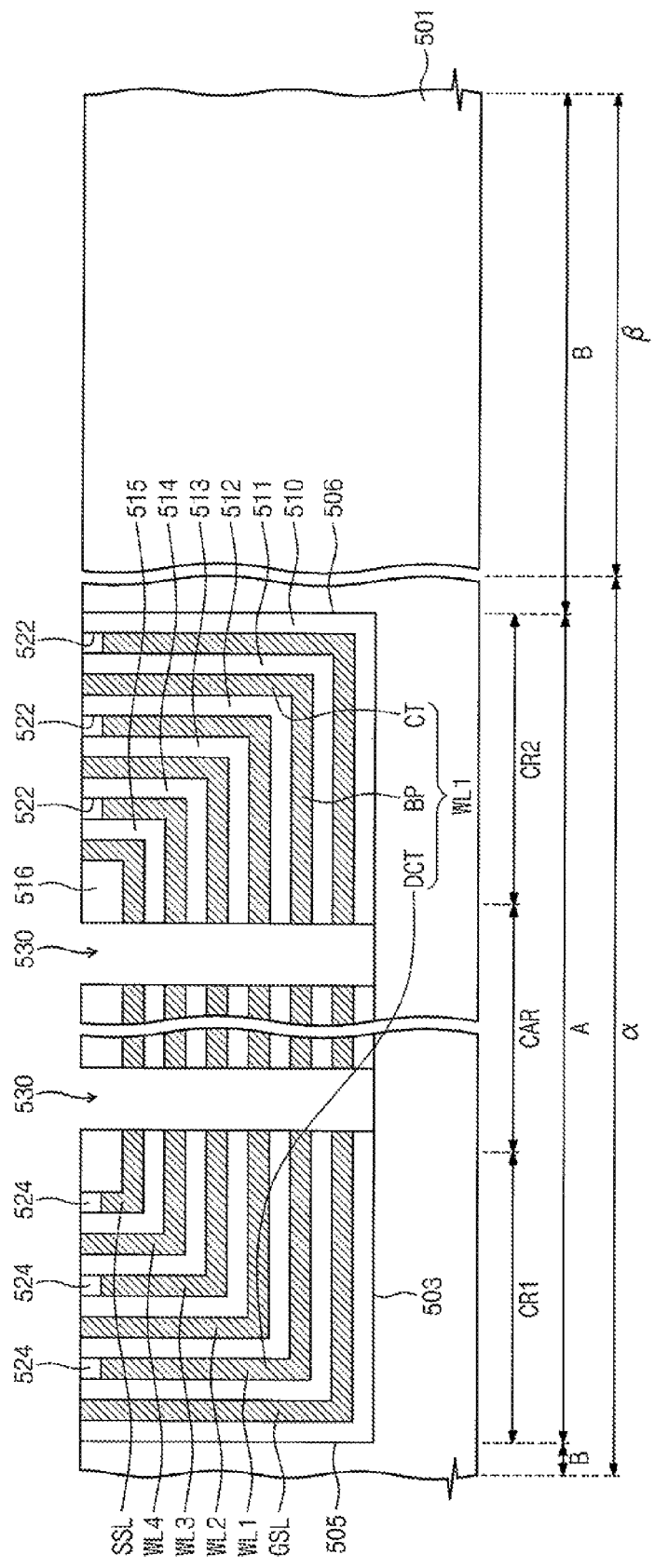

Referring to FIG. 13D, a dummy insulating layer pattern 524 filling the dummy recess portions 522 may be formed. The forming of the dummy insulating layer pattern 524 may include forming a dummy insulating layer on the substrate, and performing a planarizing process by using the top surface of the convex portion B or a top surface of the string select insulating layer 516 as an etch stop layer. A top surface of the dummy insulating layer pattern 524 may be coplanar with the top surface of the convex portion B. The top surface of the dummy insulating layer pattern 524 may be coplanar with the top surface of the string select insulating layer 516. Sidewalls of the dummy insulating layer pattern 524 may be coplanar with sidewalls of the insulating layers 510-516.

Active openings 530 exposing the common source region 502 positioned at the bottom surface 503 of the concave portion may be formed by etching the conductive patterns GSL, WL1-WL4, SSL and the insulating layers 510-516. The active memory string openings 530 may expose sidewalls of the conductive patterns GSL, WL1-WL4, SSL and sidewalls of the insulating layers 510-516. The etching of the conductive patterns GSL, WL1-WL4, SSL and the insulating layers 510-516 may be performed by using an anisotropic etching.

Figure 13E:
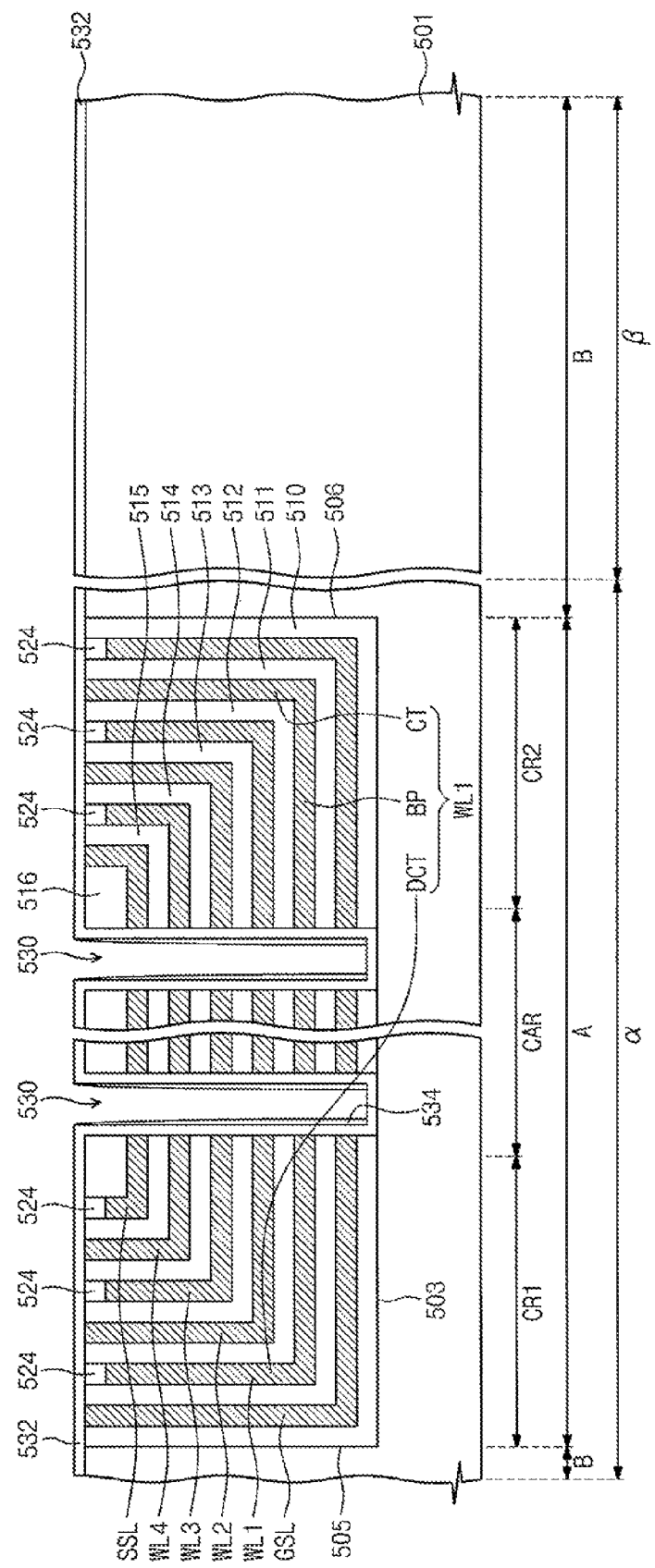

Referring to FIG. 13E, an information storage layer 532 covering the sidewalls of the conductive patterns GSL, WL1-WL4, SSL and the sidewalls of the insulating layers 510-516 exposed by the active memory string openings 530 may be formed. Layers containing the information storage layer 532 may cover the common source region 502 exposed by the active memory string openings 530. Layers containing the information storage layer 532 may be formed on the top surface of the convex portion B, the top surface of the string select insulating layer 516, the sidewalls of the insulating layers 510-516, the top surface of the dummy insulating layer pattern 524, and the top surface of the contact inclining portions CT.

Again referring to FIG. 3, a method of forming the information storage layer 532 will be described. The forming of the information storage layer 532 may include forming a blocking layer 134 in the active memory string openings 530, forming a charge storage layer 135 covering the blocking layer 134, and forming a tunnel insulating layer 136 covering the charge storage layer 135. The shape of an active may be pillar or tubular wherein the core of the opening is filled with a insulating material.

Again referring to FIG. 13E, a spacer 534 may be formed in the active memory string openings 530. The spacer 534 may partially cover the information storage layer 532 formed on sidewalls of the active memory string openings 530 and the information storage layer 532 formed on the bottom surface of the active memory string openings 530. The forming of the spacer 534 may include forming a spacer layer on the substrate, and anisotropically etching a bottomed portion. The spacer 534 may include silicon. The spacer 534 may include a material having an etch selectivity with respect to the information storage layer 532. The anisotropic etching will expose the bottomed portion where the spacer 534 does not cover. Some portion of layers including information storage layer on the bottomed portion of the opening may remain after etching.

Figure 13F:
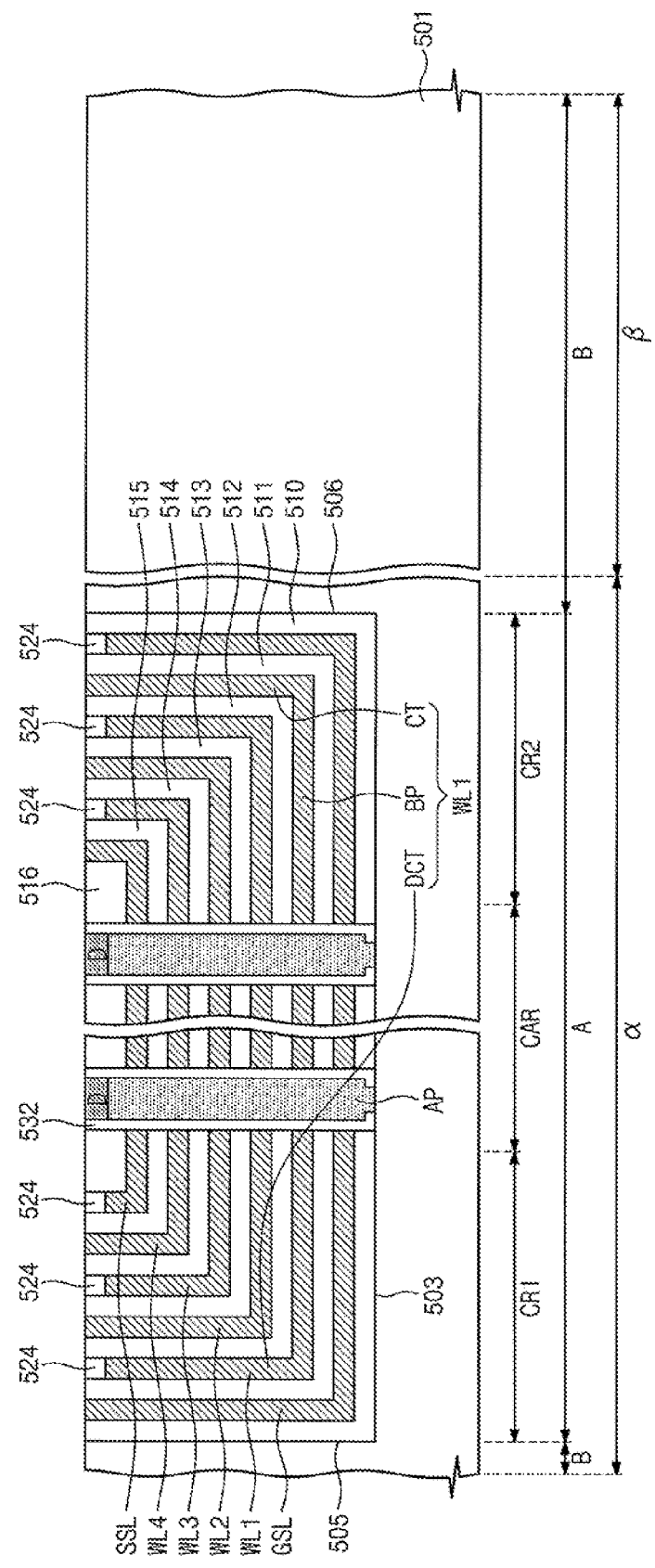

Referring to FIG. 13F, the information storage layer 532 not exposed by the spacer 534 may be etched by using the spacer 534 as an etch mask. During the etching, the surface of the substrate 503 may be exposed. The information storage layer 532 formed on the top surface of the convex portion B, the top surface of the string select insulating layer 516, the top surfaces of the insulating layers 510-515, the top surface of the dummy insulating layer pattern 524 and the top surfaces of the contact inclining portions CT may be removed. In the case where the spacer 534 includes polysilicon, the spacer 534 may be removed or not removed and used as a portion of active region. In the case where the spacer 534 is an insulator, the spacer 534 may be removed and semiconductor material for an active region may be formed on the side and bottom of the resultant opening.

Actives filling the active memory string openings 530 may be formed. The active memory string structure may include, but is not limited to, a single crystalline semiconductor. In the case where the active memory string structure includes a single crystalline semiconductor, the active memory string structure may be formed by an epitaxial growth which uses the substrate 501 as a seed layer. Alternatively, the active memory string structure may be formed by forming a polycrystalline or amorphous semiconductor layer filling the active memory string openings 530 and then performing a phase transition of the formed polycrystalline or amorphous semiconductor layer through a heat or laser treatment. In the case where the spacer 534 is not removed, the active memory string structure may include the same material as the spacer 534. The active memory string structure may be formed in a form filling the active memory string opening 530, or in a hollow cylindrical form.

A drain region D may be formed at an upper portion of the active memory string structure. The drain region D may be formed by doping the upper portion of the active memory string structure. The drain region D may be a region where dopants having a conductive type different from that of the well are included at a high concentration. For example, the drain region D may include a high concentration of n-type dopant. The drain region may be of pad shape of tubular shape.

Figure 13G:
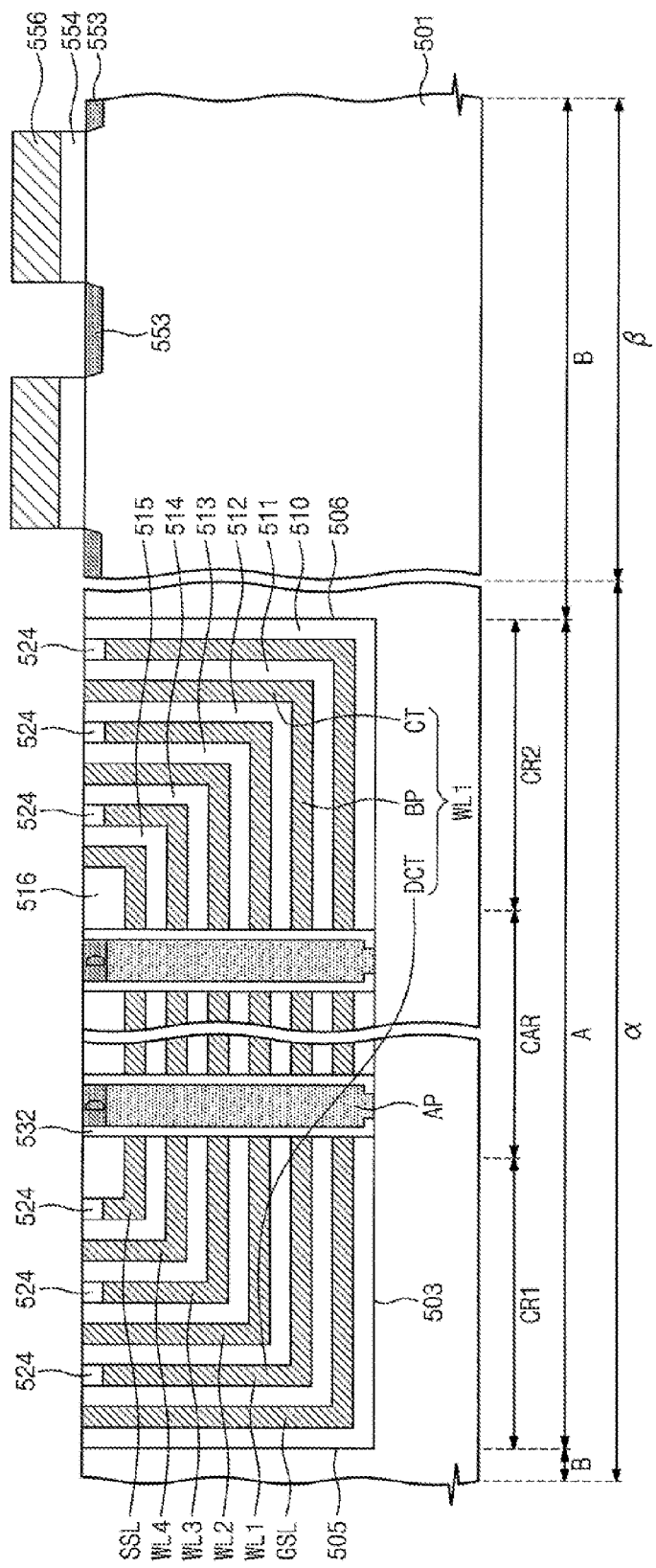

Referring to FIG. 13G, a gate insulating layer 554 may be formed on the top surface of the convex portion B. The forming of the gate insulating layer 554 may include thermally oxidizing the semiconductor layer 552. In the case where the gate insulating layer 554 is formed by a thermal oxidation, an oxide layer may be formed on the top surface of the contact inclining portion CT. Therefore, prior to forming of the gate insulating layer 554, a mask layer covering the concave portion A and exposing the convex portion B may be additively formed. The mask layer may be an insulating layer.

The gate insulating layer 554 may include a silicon oxide layer. A gate electrode 556 may be formed on the gate insulating layer 554. Source and drain regions 553 may be formed in the semiconductor layer 552 at both sides of the gate electrode 556. The source and drain regions 553 may be formed by implanting an impurity into the semiconductor layer 552.

Figure 13H:
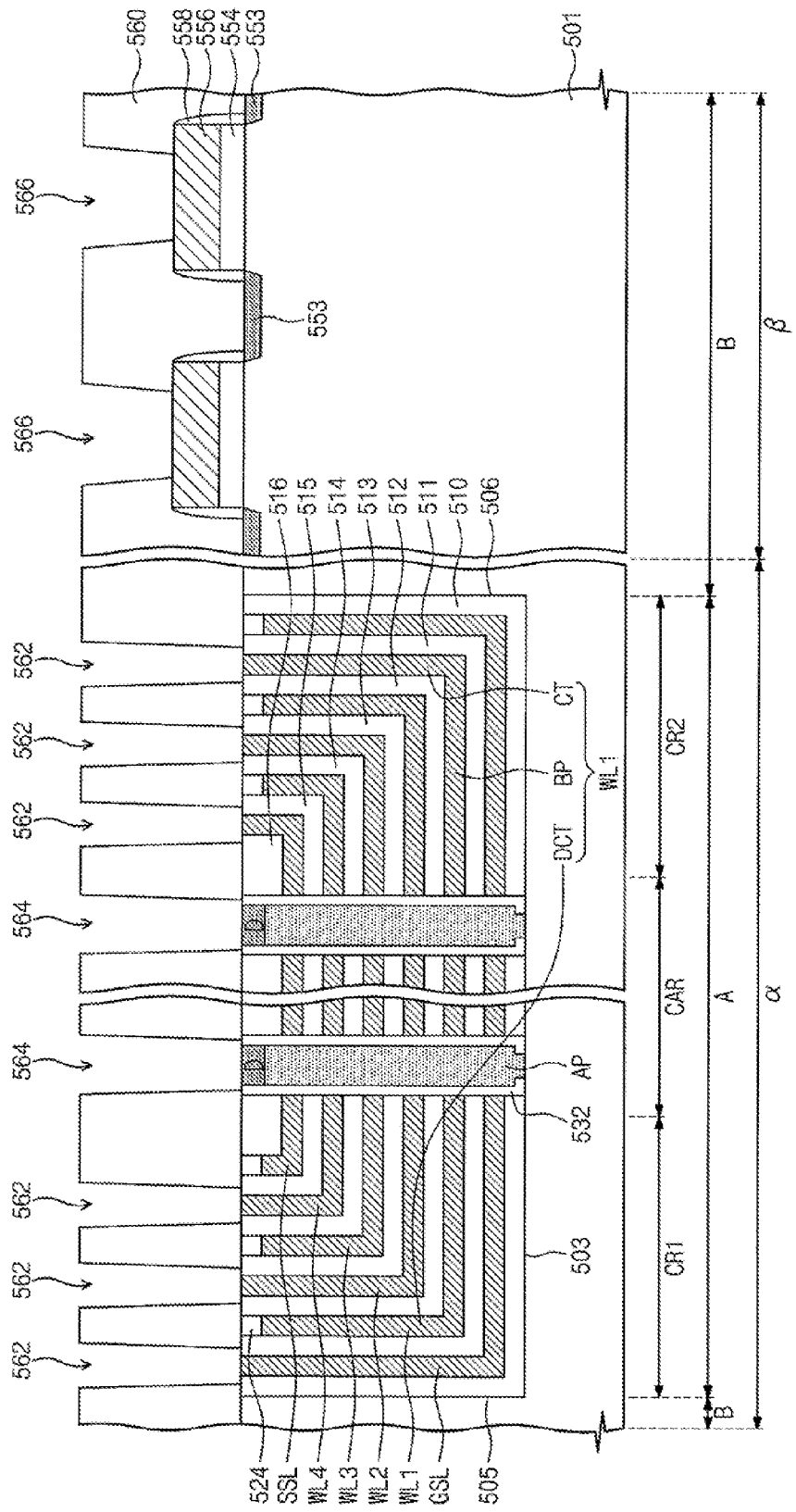

Referring to FIG. 13H, a gate spacer 558 may be formed on both sidewalls of the gate electrode 556. A first interlayer insulating layer 560 may be formed on the substrate 501. The first interlayer insulating layer 560 may cover a peripheral circuit on the convex portion B. The first interlayer insulating layer 560 may include a silicon oxide layer.

A contact opening 562, a bit line opening 564 and a peripheral circuit opening 566 respectively exposing the contact inclining portions CT of the conductive patterns GSL, WL1-WL4, the drain region D of the active and a top surface of the gate electrode 556 of the peripheral circuit may be formed by etching the first interlayer insulating layer 560. At this time, an opening exposing the source and drain regions 553 of the peripheral circuit region β may be also formed. The etching of the first interlayer insulating layer 560 may be performed by using an anisotropic etching.

As aforementioned, in the case where the gate insulating layer 554 is formed by a thermal oxidation process and thus an oxide layer is formed on the top surfaces of the contact inclining portions CT of the conductive patterns GSL, WL1-WL4, SSL of the cell region α, the mask layer may be etched to expose the contact inclining portions CT while the first interlayer insulating layer 560 is etched. Unlike this, in the case where the gate insulating layer 554 is formed by a thermal oxidation process but an oxide layer is formed on the top surfaces of the contact inclining portions CT of the conductive patterns GSL, WL1-WL4, SSL because a mask layer is not formed on the top surfaces of the contact inclining portions CT of the conductive patterns GSL, WL1-WL4, SSL, the oxide layer may be etched while the first interlayer insulating layer 560 is etched.

Again referring to FIG. 12A, contact plugs GCP, CP, bit line contact plugs BLCP and a peripheral circuit contact plug PCP respectively filling the contact opening 562, the bit line opening 564 and the peripheral circuit opening 566 may be formed.

The ground select contact plug GCP may be electrically connected with the contact inclining portion CT of the ground select line GSL. The word line contact plugs CP may be electrically connected with the word lines WL1-WL4. Each of the contact plugs GCP, CP may include a material having conductivity higher than the conductive patterns GSL, WL1-WL4. The peripheral circuit contact plug PCP may be electrically connected with the gate electrode 556. The peripheral circuit contact plug PCP may include a material having conductivity higher than the gate electrode 556. For example, the contact plugs GCP, CP, the bit line contact plug BLCP and the peripheral circuit contact plug PCP may include tungsten.

A second conductive line ML2 may be formed on the ground select contact plug GCP. A first conductive line ML1 may be formed on the word line contact plug CP. A bit line BL may be formed on the bit line contact plug BLCP. A fourth conductive line ML4 may be formed on the peripheral circuit contact plug PCP. The forming of the second conductive line ML2, the first conductive line ML1, the bit line BL and the fourth conductive line ML4 may include forming a conductive layer on the first interlayer insulating layer 560 and patterning the conductive layer.

A second interlayer insulating layer 570 covering the second conductive line ML2, the first conductive line ML1 and the fourth conductive line ML4 may be formed. The second interlayer insulating layer 570 may include the same material as the first interlayer insulating layer 560. A string select contact plug SCP penetrating the second interlayer insulating layer 570 and the first interlayer insulating layer 580 and filling an opening exposing the contact inclining portion of the string select line SSL may be formed. The string select contact plug SCP may include a material having conductivity higher than the string select line SSL. A third conductive line ML3 may be formed on the string select contact plug SCP. The forming of the third conductive line ML3 may include forming a conductive layer on the second interlayer insulating layer 570 and patterning the conductive layer. By doing so, the semiconductor device described with reference to FIG. 12A may be provided.

A method for forming a semiconductor device according to the modified example of the fifth embodiment of the inventive concept, described with reference to FIG. 12B will now be described.

Referring to FIG. 12B, in the method of forming a semiconductor device described with reference to FIGS. 13A to 13H, and FIG. 12A, the concave portion A and the convex portion B may be defined by forming an insulating layer 504 on the substrate 500, etching a portion of the insulating layer 504 corresponding to the concave portion A and leaving a portion of the insulating layer 504 corresponding to the convex portion B.

A semiconductor layer 552 may be formed on the convex portion B of the peripheral circuit region β. The forming of the semiconductor layer 552 may include bonding the semiconductor layer 552 on the top surface of the convex portion B or growing the semiconductor layer 552. The semiconductor layer 552 may include silicon. A gate insulating layer 554 may be formed on the semiconductor layer 552. Thereafter, a peripheral circuit may be formed by the method of forming the peripheral circuit described with reference to FIGS. 13G to 13H.

A method for forming a semiconductor device according to another modified example of the fifth embodiment of the inventive concept, described with reference to FIG. 12C will now be described.

Referring to FIG. 12C, in the method for forming a semiconductor device described with reference to FIGS. 13A to 13H and FIG. 12A, at least one of the first sidewall 505 and the second sidewall 506 may be formed inclined with respect to the bottom surface 503. In this case, the contact inclining portions CT and the dummy inclining portions DCT may be formed inclined with respect to the bottom surface 503 and the bottom portions BP. The sidewall portions of the insulating layers 510-516 may be formed inclined with respect to the bottom surface 503.

Figure 14A:
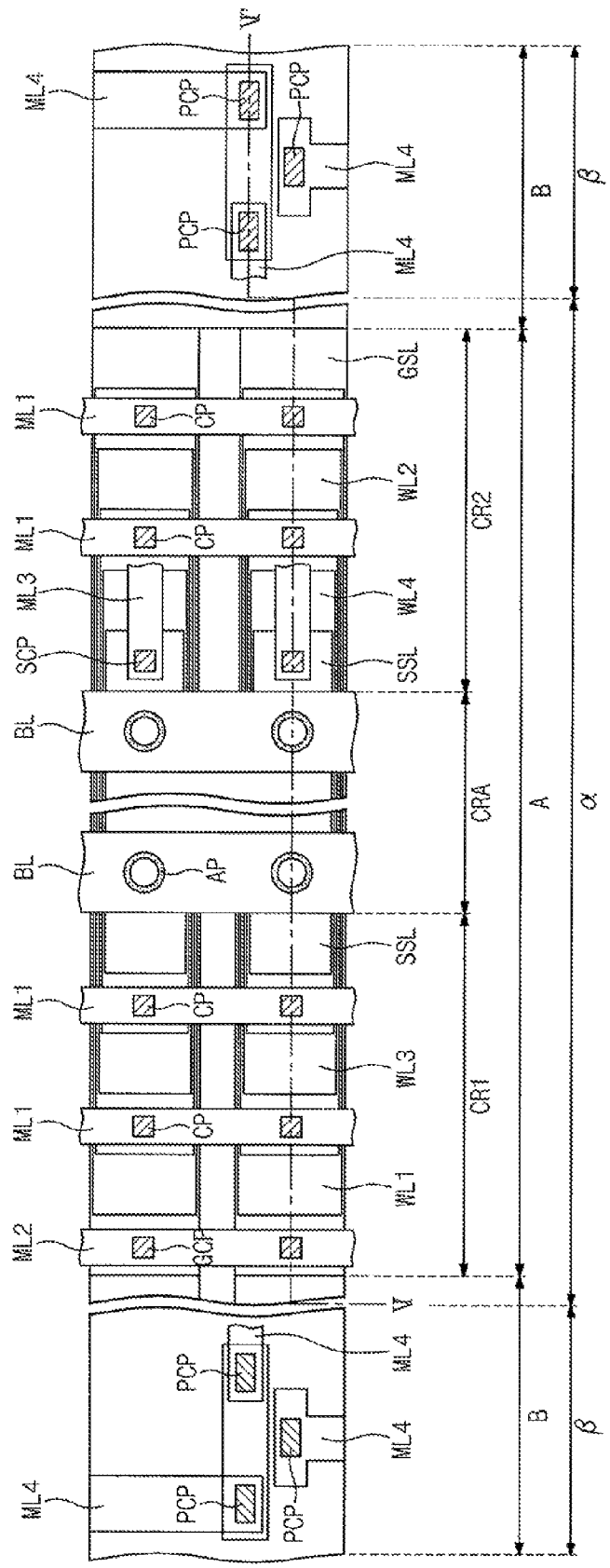
FIGS. 14A and 14B show schematic plan views for explaining a semiconductor device in accordance with an exemplary embodiment of the present disclosure.
Figure 14B:
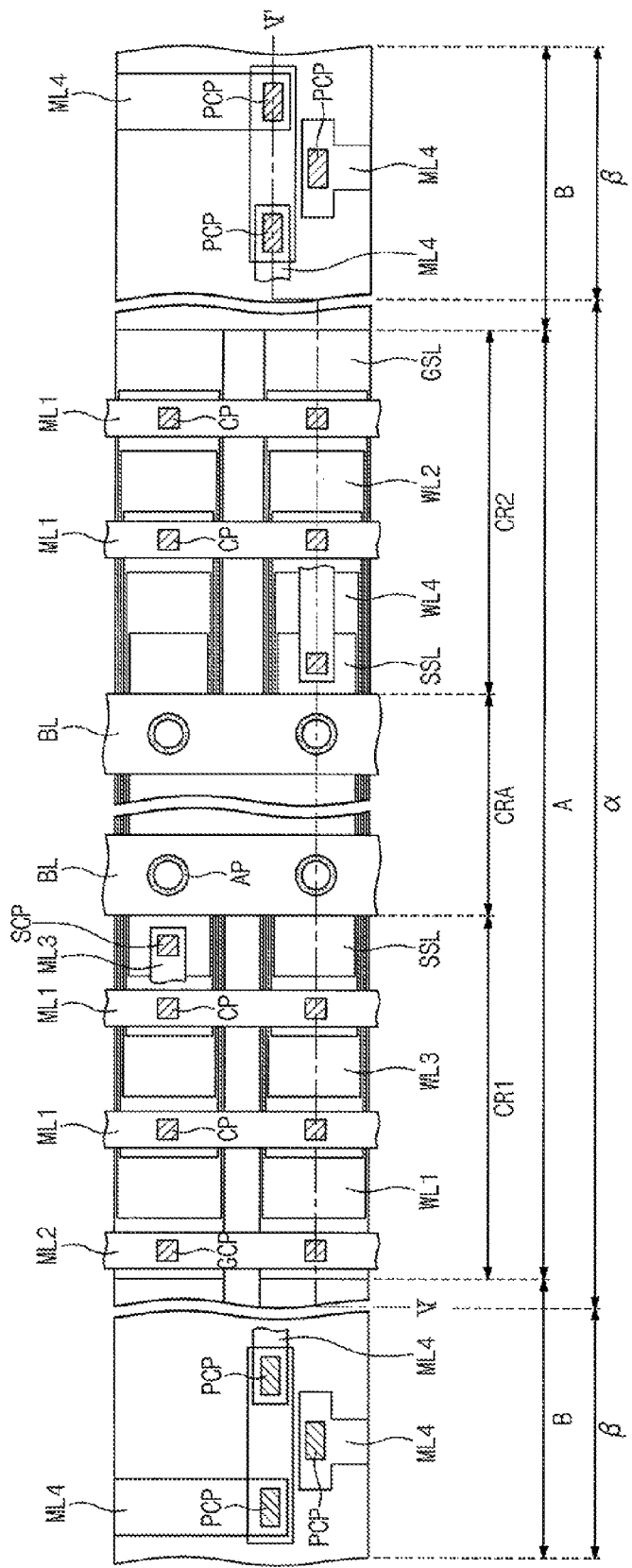

A semiconductor device according to a sixth embodiment of the inventive concept will now be described. FIG. 14A FIG. 14B is a plan view for explaining a semiconductor device according to a sixth embodiment of the inventive concept, and FIG. 15A is a sectional view taken along line VI-VI' of FIG. 14.

Figure 15A:
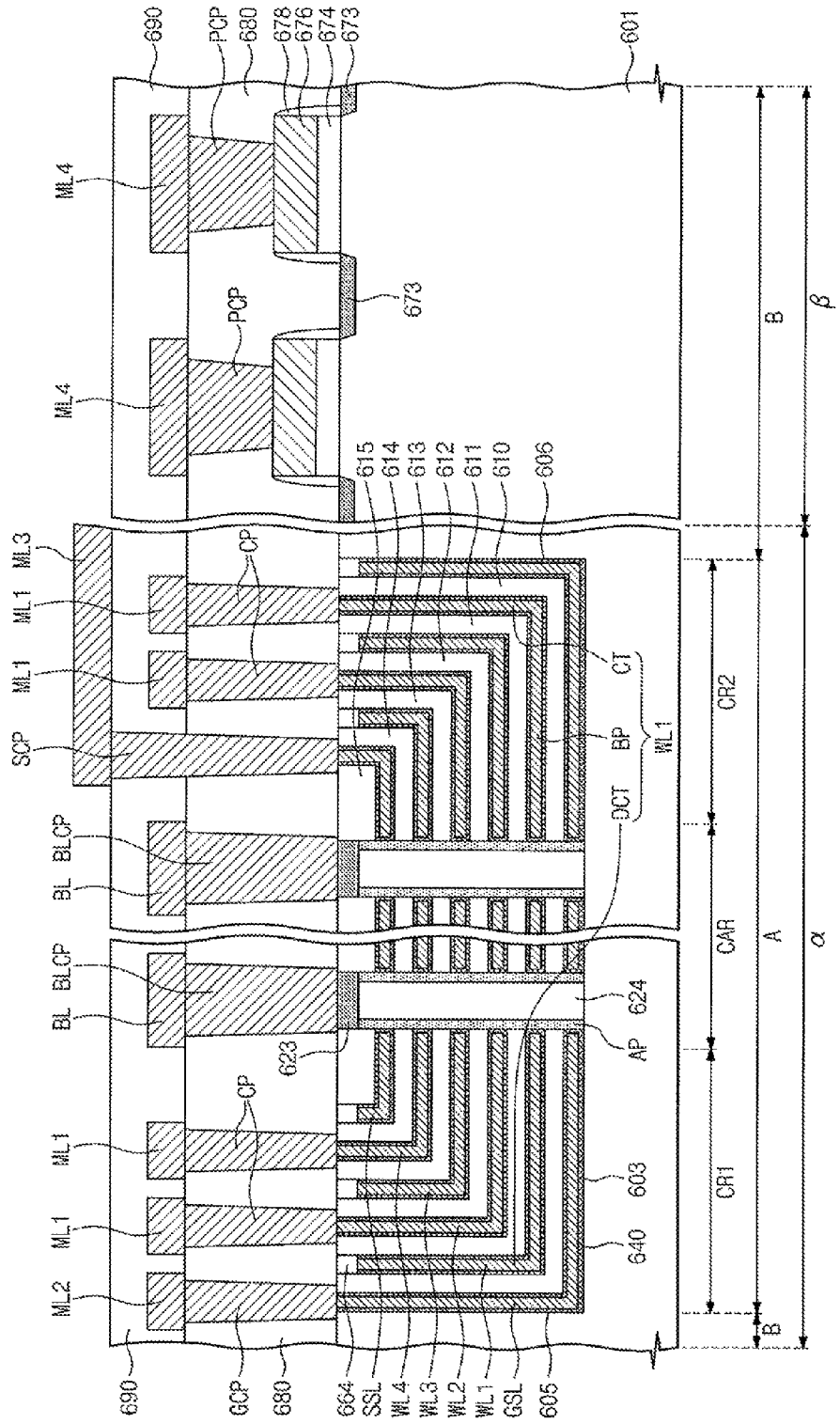
FIG. 15A shows a schematic sectional view taken along line VI-VI' of FIG. 14 in accordance with an exemplary embodiment of the present disclosure.

Referring to FIGS. 14A through 14B and 15A, a substrate 601 is provided. The substrate 601 may be a semiconductor-based substrate. The substrate 601 may include a well. The well may include a first conductive type dopant. A common source region 602 may be disposed in the substrate 601. The common source region 602 may be disposed in a plate form within a cell region of the substrate 601. Alternatively, the common source region may be of line type on the substrate. For example, the common source region may be formed by implanting a trench formed for gate replacement process. The common source region 602 may include a high concentration of dopant. The dopant included in the common source region 602 may have a second conductive type, which is different from the conductive type of the dopant included in the well. For example, in the case where the well includes a p-type dopant, the common source region 602 may include a high concentration of n-type dopant.

The substrate 601 may include a concave portion A. The concave portion A may include a bottom surface 603, and first and second sidewalls 605 and 606 facing each other. The substrate 601 may include a convex portion B extended from the first and second sidewalls 605 and 606. A top surface of the convex portion B may be in parallel with the bottom surface of the concave portion A. The concave portion A and the convex portion B may be formed by etching a portion of a semiconductor substrate corresponding to the concave portion A and leaving a portion of the semiconductor substrate corresponding to the convex portion B. In this case, the substrate 601 may be one body substrate.

The substrate 601 may include a cell region α and a peripheral circuit region β. In the cell region α, a memory cell may be disposed. The cell region α may include the concave portion A and the convex portion B. In the peripheral circuit region β, a peripheral circuit may be disposed.

The cell region α of the substrate 601 will now be described.

The cell region α may include a first contact region CR1 adjacent to the first sidewall 605 of the concave portion A, and a second contact region CR2 adjacent to the second sidewall 606. A cell array region CAR may be disposed between the first contact region CR1 and the second contact region CR2. That is, the first contact region CR1 and the second contact region CR2 may be spaced apart from each other with the cell array region CAR in-between.

Conductive patterns GSL, WL1-WL4, SSL spaced apart from one another may be disposed on the substrate 601. The conductive patterns GSL, WL1-WL4, SSL may include a ground select line GSL, word lines WL1-WL4, and a string select line SSL, which are sequentially stacked on the concave portion A of the substrate 601. The conductive patterns GSL, WL1-WL4, SSL may be spaced apart from one another with inter-gate insulating layers 610-614 in-between. For example, the ground select line GSL, the first inter-gate insulating layer 610, the first word line WL1, the second inter-gate insulating layer 611, the second word line WL2, the third inter-gate insulating layer 612, the third word line WL3, the fourth inter-gate insulating layer 613, the fourth word line WL4, the fifth inter-gate insulating layer 614 and the string select line SSL may be sequentially stacked. The insulating layers 610-614 may include bottom portions above the bottom surface 603 of the concave portion A of the substrate 601, and sidewall portions extended over the first sidewall 605 and the second sidewall 606 from the bottom portions thereof. A string select insulating layer 615 may be disposed on the string select line SSL. The conductive patterns GSL, WL1-WL4, SSL may have a line form extending in a first direction. The first direction may be a direction of line VI-VI'.

The conductive patterns GSL, WL1-WL4, SSL may include bottom portions BP disposed above the bottom surface 603 of the concave portion A. Lengths of the bottom portions BP may be shortened as it goes far from the concave portion A of the substrate 601. The bottom portions BP may be in parallel with the bottom surface 603. The bottom portions BP may be in parallel with the top surface of the convex portion B.

The conductive patterns GSL, WL1-WL4, SSL may include contact inclining portions CT extended over any of the first sidewall 605 and the second sidewall 606 from one ends of the bottom portions BP. A contact region where the contact inclining portion of any one of the conductive patterns is disposed may be different from a contact region where the contact inclining portion of another conductive pattern adjacent to the any one of the conductive patterns. For example, in the case where the contact inclining portion CT of the ground select line GSL is disposed in the first contact region CR1, the contact inclining portion CT of the first word line WL1 adjacent to the ground select line GSL may be disposed in the second contact region CR2.

An extended line of the contact inclining portion CT may cross the bottom surface 603. The extended line may cross the bottom surface 603 at a right angle. A length of the contact inclining portion CT may be decreased as it goes far from the concave portion A. A top surface of the contact inclining portion CT may be coplanar with the top surface of the convex portion B. An angle between the contact inclining portion CT and the bottom portion BP may be 90°.

The conductive patterns GSL, WL1-WL4, SSL may include dummy inclining portions DCT extended over the other one of the first sidewall 605 and the second sidewall 606 from the other ends of the bottom portions BP above the bottom surface 603. A contact region where the dummy inclining portion of any one of the conductive patterns GSL, WL1-WL4, SSL is disposed may be different from a contact region where the dummy inclining portion of another conductive pattern adjacent to the any one of the conductive patterns. For example, in the case where the dummy inclining portion DCT of the string select line SSL is disposed in the first contact region CR1, the dummy inclining portion DCT of the fourth word line WL4 adjacent to the string select line SSL may be disposed in the second contact region CR2.

Each of the conductive patterns GSL, WL1-WL4, SSL may include one contact inclining portion CT and one dummy inclining portion DCT. In one of the conductive patterns GSL, WL1-WL4, SSL, a length of the dummy inclining portion DCT may be shorter than that of the contact inclining portion CT. The contact inclining portion CT may be disposed between the dummy inclining portions DCT adjacent to each other. The contact inclining portions CT adjacent to one of the dummy inclining portions DCT may be spaced apart from each other by the sidewalls of the insulating layers interposed therebetween.

A dummy insulating layer pattern 664 may be disposed on the dummy inclining portion DCT. A top surface of the dummy insulating layer pattern 664 may be coplanar with the top surface of the convex portion B. The top surface of the dummy insulating layer pattern 664 may be coplanar with a top surface of the string select line insulating layer 615. Sidewalls of the dummy insulating layer pattern 664 may be coplanar with sidewalls of the dummy inclining portion DCT. The dummy insulating layer pattern 664 may include the same material as the insulating layers 610-615.

Conductive plugs may be disposed on the contact inclining portions CT of the word lines WL1-WL4, respectively. The conductive plugs may be word line contact plugs CP. The word lines WL1-WL4 may be electrically connected with the word line contact plugs CP, respectively. Widths of the word line contact plugs CP may be wider than those of the top surfaces of the contact inclining portions CT of the word lines WL1-WL4. The widths of the word line contact plugs CP may be greater than widths between the dummy inclining portions DCT adjacent to the contact inclining portions of the word lines WL1-WL4. The word line contact plugs may penetrate a first interlayer insulating layer 680. First conductive lines ML1 may be disposed on the word line contact plugs CP and the first interlayer insulating layer 680. The word line contact plugs CP may be electrically connected with the first conductive lines ML1. The first conductive lines ML1 may extend in a second direction crossing the first direction. The first conductive lines ML1 may be electrically connected with the word lines WL1-WL4 through the word line contact plugs CP. Unlike this, the first conductive lines ML1 may be directly connected with the word lines WL1-WL4. A second interlayer insulating layer 690 covering the first conductive lines ML1 may be disposed. The first and second interlayer insulating layers 680 and 690 may include the same material.

A conductive plug may be disposed on the contact inclining portion CT of the ground select line GSL. The conductive plug may be a ground select contact plug GCP. The ground select line GSL may be electrically connected with the ground select contact plug GCP. A width of the ground select contact plug GCP may be wider than a width of a top surface of the contact inclining portion CT of the ground select line GSL. The ground select contact plug GCP may penetrate the first interlayer insulating layer 680. A second conductive line ML2 may be disposed on the ground select contact plug GCP and the first interlayer insulating layer 680. The ground select contact plug GCP may be electrically connected with the second conductive line ML2. The second conductive line ML2 may extend in the second direction. The second conductive line ML2 may be electrically connected with the ground select line GSL through the ground select contact plug GCP. Unlike this, the second conductive line ML2 may be directly connected with the ground select line GSL. The second interlayer insulating layer 690 may cover the second conductive line ML2.

A conductive plug may be disposed on the contact inclining portion CT of the string select line SSL. The conductive plug may be a string select contact plug SCP. The string select line SSL may be electrically connected with the string select contact plug SCP. A width of the string select contact plug SCP may be wider than a width of a top surface of the contact inclining portion CT of the string select line SSL. The string select contact plug SCP may penetrate the first interlayer insulating layer 680 and the second interlayer insulating layer 690. A third conductive line ML3 may be disposed on the string select contact plug SCP and the second interlayer insulating layer 690. The string select contact plug SCP may be electrically connected with the third conductive line ML3. The third conductive line ML3 may extend in the first direction. Referring to the FIG. 14B, a plurality of the string select line SSL may dispose in the concave portion. And the third conductive lines ML3 of the string select lines SSL adjacent to each other may extend different direction.

The conductive lines ML1, ML2 may be disposed separated in both sides with the cell array region CAR in-between. The conductive line connected with one of the conductive patterns GSL, WL1-WL4 may be disposed in a contact region different from the conductive line connected with the conductive pattern adjacent to the one conductive pattern. For example, the first conductive line ML1 connected with the first word line WL1 may be disposed in the second contact region CR2, and the second conductive line ML2 and the first conductive line ML1 respectively connected with the ground select line GSL adjacent to the first word line WL1 and the second word line WL2 may be disposed in the first contact region CR1. In this embodiment, trenches for cutting the conductive patterns WL1-WL4, GSL and integrate layers are formed. The trenches will be used for gate replacement and filling layers including information storage layer.

An active memory string structure extending upward from the bottom surface 603 of the concave portion A may be disposed. The active memory string structure may extend perpendicular to the substrate 601. The active memory string structure may penetrate the conductive patterns GSL, WL1-WL4, SSL. Alternatively, the active memory string structure may face sidewalls of the conductive patterns GSL, WL1-WL4, SSL. One end of the active memory string structure may be electrically connected with the common source region 602. A drain region D may be disposed at the other end of the active memory string structure. The drain region D may be a region doped with a high concentration of dopant. The active memory string structure may include a single crystalline semiconductor.

A bit line contact plug BLCP may be disposed on the drain region 623 of the active memory string structure. The bit line contact plug BLCP may be electrically connected with the drain region 623 and penetrate the first interlayer insulating layer 680. A bit line BL may be disposed on the bit line contact plug BLCP. The bit line BL may be connected with the drain region 623 of the active memory string structure through the bit line contact plug BLCP. Unlike this, the bit line BL may be directly connected with the drain region 623. The bit line BL may extend in the second direction crossing the first direction. The bit line BL may cross the third conductive line ML3.

An information storage layer 640 may be disposed between the sidewall of the active memory string structure and the conductive patterns GSL, WL1-WL4, SSL. Layers containing the information storage layer 640 may be disposed between the conductive patterns GSL, WL1-WL4, SSL and the insulating layers 610-615.

The information storage layer 640 according to the sixth embodiment of the inventive concept may be the information storage layer described with reference to FIG. 6A or 6B.

The peripheral circuit region β of the substrate 601 will now be described.

A peripheral circuit may be disposed on a top surface of the convex portion B of the peripheral circuit region β. A gate insulating layer 654 may be disposed on the top surface of the convex portion B. The gate insulating layer 654 may include a silicon oxide layer. The gate insulating layer 654 may include a portion formed by thermally oxidizing the top surface of the convex portion B. A gate electrode 656 may be disposed on the gate insulating layer 654. The gate electrode 656 may include one selected from the group consisting of doped polysilicon, metal and metal silicide. A spacer 658 may be disposed on both sidewalls of the gate electrode 656. Source and drain regions 653 may be disposed in the convex portion B at both sides of the gate electrode 656. The source and drain regions 653 may be regions doped with a high concentration of dopant.

A peripheral circuit contact plug PCP penetrating the first interlayer insulating layer 680 may be disposed on the gate electrode 656 and the source and drain regions 653. A fourth conductive line ML4 may be disposed on the peripheral circuit contact plug PCP. A second interlayer insulating layer 690 may be disposed on the fourth conductive line ML4.

Figure 15B:
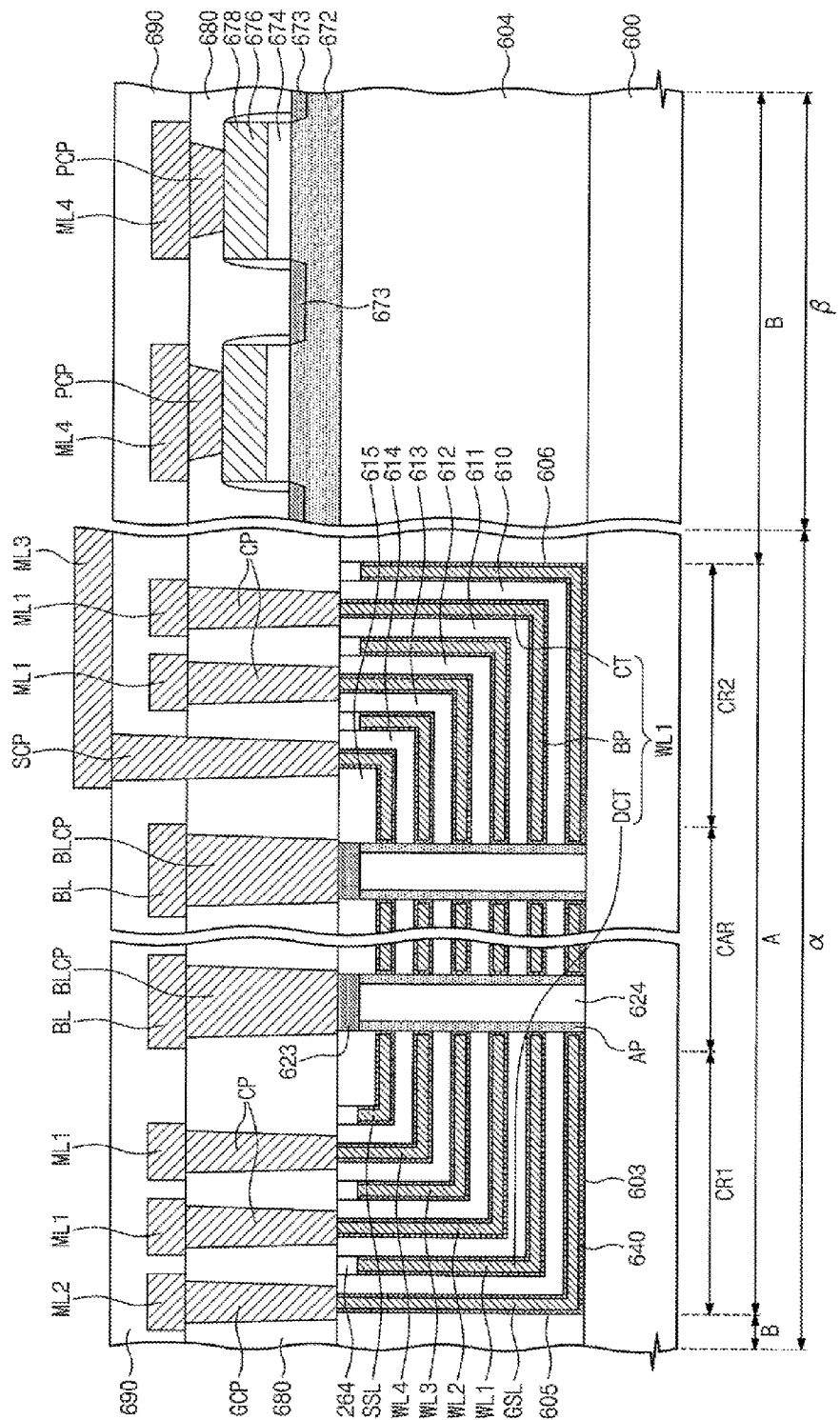
FIG. 15B shows a schematic sectional view taken along line VI-VI' of FIGS. 14A through 14B in accordance with an exemplary embodiment of the present disclosure.

A modified example of the sixth embodiment of the inventive concept will now be described. FIG. 15B is a sectional view taken along line VI-VI' of FIG. 14A through FIG. 14B, for explaining a modified example of the sixth embodiment of the inventive concept.

Referring to FIGS. 14A through 14B and 15B, a substrate 600 is provided. A common source region 602 may be disposed in the substrate 600. The substrate 600 may include a concave portion A. The concave portion A may include a bottom surface 603, and first and second sidewalls 605 and 606 facing each other. The substrate 600 may include a convex portion B extending from the first and second sidewalls 605 and 606. A top surface of the convex portion B may be in parallel with the bottom surface 603 of the concave portion A. The convex portion B may be defined by an insulating layer 604 disposed on the substrate 600.

Referring to FIGS. 14A and 14B, as in FIGS. 1A and 1B, an interconnection, extending outside one edge of the cell array portion, is electrically connected to contact inclining portion of a word line at one side, whereas another interconnection, extending outside the other edge of the cell array portion, is electrically connected to contact inclining portion of a word line at another side. According to FIG. 14A, all SSLs are connected to interconnections at either side, whereas some SSLs are connected to interconnections at one side, and some SSLs are connected to interconnections at another side for FIG. 14B. The word line may be chosen alternatingly. That is, odd numbered word lines from bottom to top direction of a string for example, first, third, fifth word lines are connected to interconnections at one side of a string, and even numbered word lines for example, second, fourth, sixth word lines connected to interconnections at the other side of a string.

The substrate 600 may include a cell region α and a peripheral circuit region β. In the cell region α, a memory cell may be disposed. In the peripheral circuit region β, a peripheral circuit may be disposed.

The cell region α of the substrate 600 will now be described.

The cell region α may include a first contact region CR1 adjacent to the first sidewall 605 of the concave portion A, and a second contact region CR2 adjacent to the second sidewall 606. The memory cell explained with reference to FIG. 15A may be disposed in the cell region α of the substrate 600.

The peripheral circuit region β of the substrate 600 will now be described.

A peripheral circuit may be disposed on a top surface of the convex portion B of the peripheral circuit region β. A semiconductor layer 672 may be disposed on a top surface of the insulating layer 604. The semiconductor layer 672 may be semiconductor materials including polysilicon, crystalline silicon and single crystalline silicon. A gate insulating layer 674 may be disposed on the semiconductor layer 672. The gate insulating layer 674 may include a silicon oxide layer. The gate insulating layer 674 may include a portion formed by thermally oxidizing the semiconductor layer 672. A gate electrode 676 may be disposed on the gate insulating layer 674. The gate electrode 676 may include one selected from the group consisting of doped polysilicon, metal and metal silicide. A gate spacer 678 may be disposed on both sidewalls of the gate electrode 676. Source and drain regions 673 may be disposed in the semiconductor layer 672 at both sides of the gate electrode 676. The source and drain regions 673 may be regions doped with a high concentration of dopant.

A peripheral circuit contact plug PCP penetrating the first interlayer insulating layer 680 may be disposed on the gate electrode 676 and the source and drain regions 673. A fourth conductive line ML4 may be disposed on the peripheral circuit contact plug PCP. A second interlayer insulating layer 690 may be disposed on the fourth conductive line ML4.

Figure 15C:
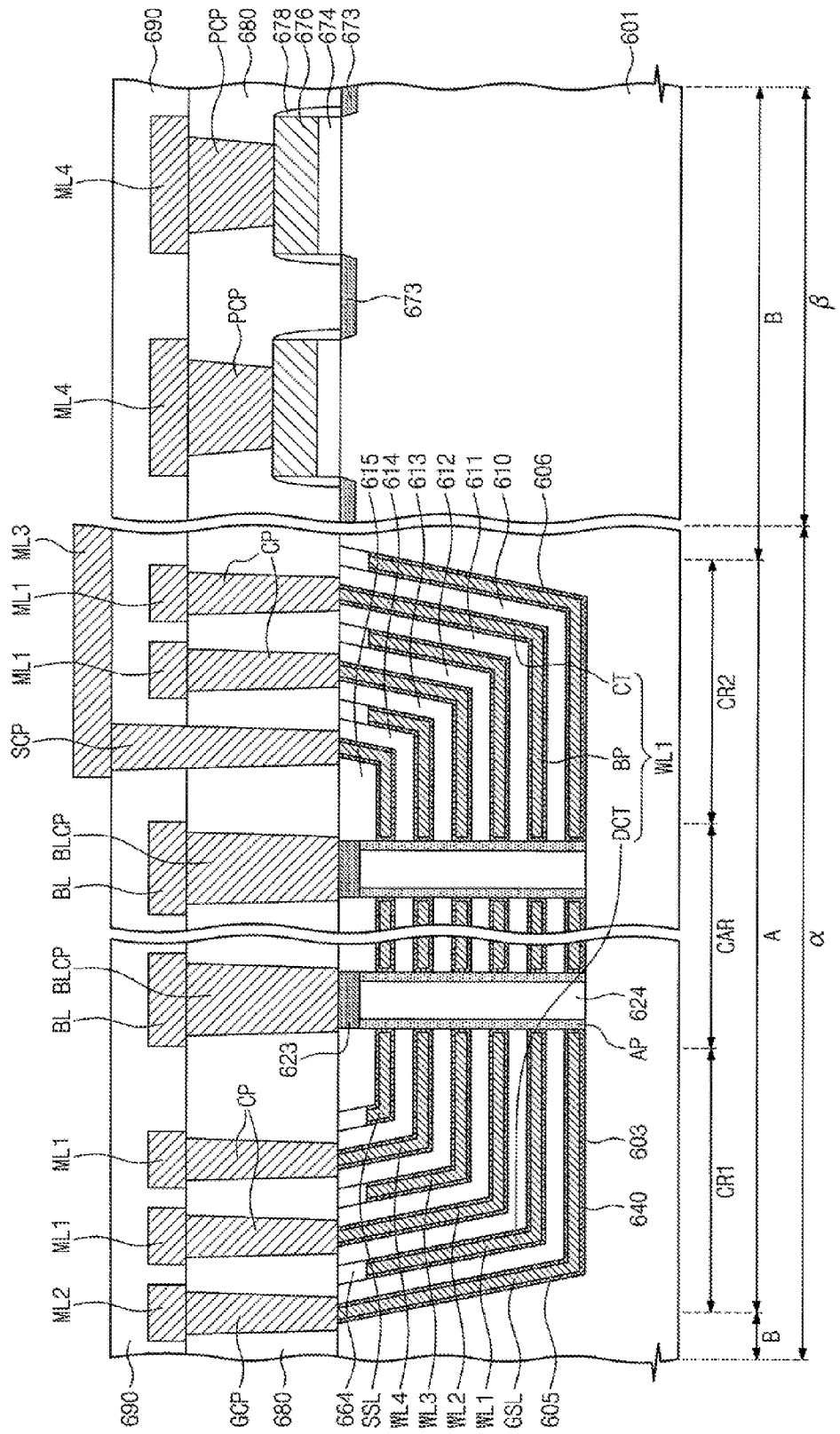
FIG. 15C shows a schematic sectional view taken along line VI-VI' of FIGS. 14A and 14B in accordance with an exemplary embodiment of the present disclosure.

A semiconductor device according to another modified example of the sixth embodiment of the inventive concept will now be described. This exemplary embodiment is modified to be inclined. FIG. 15C is a sectional view taken along line VI-VI' of FIG. 14, for showing this other modified example of the sixth embodiment of the inventive concept.

Referring to FIGS. 14 and 15C, a substrate 601 is provided. A common source region 602 may be disposed in the substrate 601. The substrate 601 may include a concave portion A. The concave portion A may include a bottom surface 603, and first and second sidewalls 605 and 606 facing each other. Any one of the first and second sidewalls 605 and 606 may be inclined to the bottom surface 603 of the concave portion A. For example, the first sidewall 605 and the second sidewall 606 may have an angle, which is 50 to 90 degrees with respect to the bottom surface 603. A slope of the first sidewall 605 with respect to the bottom surface 603 may be equal to that of the second sidewall 606 with respect to the bottom surface 603. Alternatively, the slope of the first sidewall 605 with respect to the bottom surface 603 may be different from that of the second sidewall 606 with respect to the bottom surface 603. The substrate 601 may include a convex portion B extending from the first and second sidewalls 605 and 606. A top surface of the convex portion B may be in parallel with the bottom surface 603 of the concave portion A. The concave portion A and the convex portion B of the substrate 601 may be defined through an etching process of the substrate 601. Alternatively, as described with reference to FIG. 15B, the convex portion B may be defined by the insulating layer 604 on the substrate 601.

The substrate 601 may include a cell region α and a peripheral circuit region β. In the cell region α, a memory cell may be disposed. The peripheral circuit region β may include a peripheral circuit.

The cell region α of the substrate 601 will now be described.

The cell region α may include a first contact region CR1 adjacent to the first sidewall 605 of the concave portion A, and a second contact region CR2 adjacent to the second sidewall 606. The memory cell explained with reference to FIG. 15A may be disposed in the cell region α of the substrate 601. A contact inclining portion CT and a dummy inclining portion DCT of any one of the conductive patterns GSL, WL1-WL4, SSL may have an inclined slope with respect to a bottom portion BP.

An angle between the sidewall adjacent to the contact region where the contact inclining portion CT is disposed, and the bottom surface 603 may be equal to an angle between the contact inclining portion CT and the bottom portion BP. For example, in the case of the first word line WL1, a slope of the contact inclining portion CT with respect to the bottom portion BP may be equal to a slope of the second sidewall 606 with respect to the bottom surface 603. When the slopes of the first sidewall 605 and the second sidewall 606 with respect to the bottom surface 603 are different from each other, the slope of the contact inclining portion with respect to the bottom portion BP in any one conductive pattern may be different from the slope of the dummy inclining portion DCT with respect to the bottom portion BP.

The peripheral circuit region β of the substrate 601 will now be described.

In the peripheral circuit region β of the substrate 601, the peripheral circuit described with reference to FIG. 15A may be disposed. Alternatively, as aforementioned, in the case where the substrate is the substrate described with reference to FIG. 15B, a semiconductor layer 672 may be added.

A method for forming a semiconductor device according to the sixth embodiment will now be described. FIGS. 16A to 16I are cross-sectional views for explaining a method for forming a semiconductor device according to the sixth embodiment of the inventive concept.

Figure 16A:
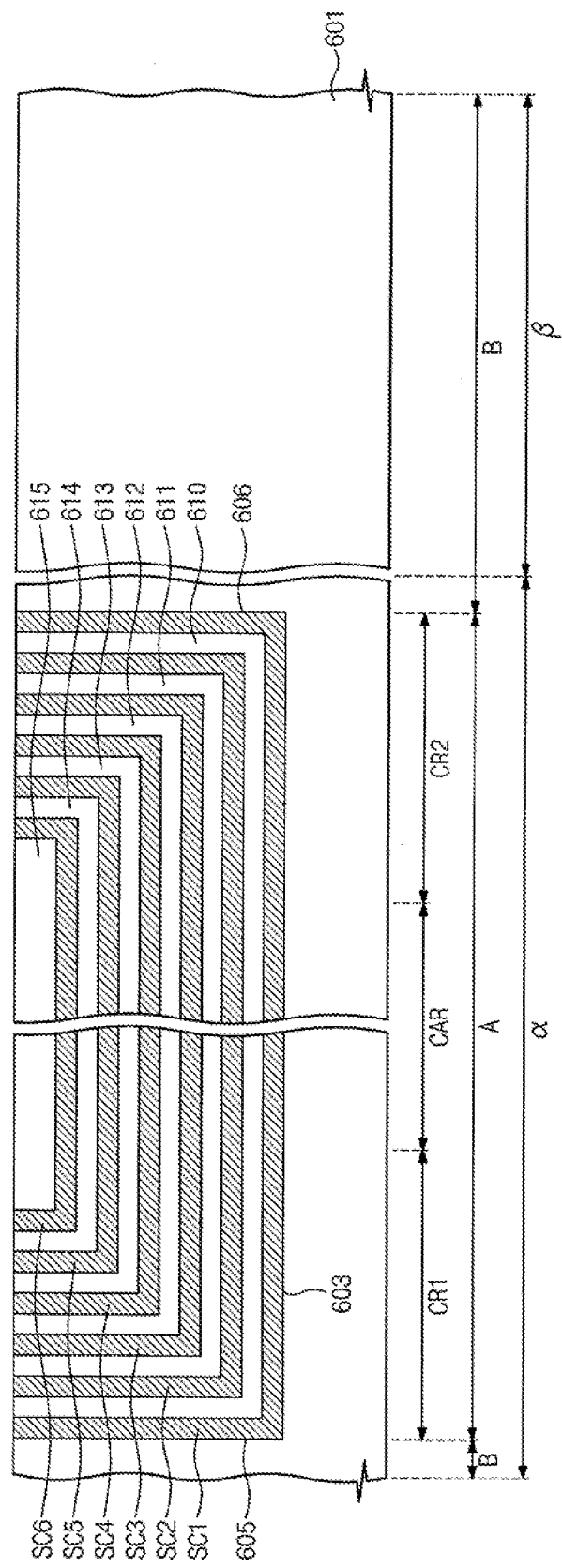

Referring to FIG. 16A, a substrate 601 is provided. The substrate 601 may include a concave portion A. The concave portion A may include a bottom surface 603, and first and second sidewalls 605 and 606 facing each other. The substrate 601 may include a convex portion B extended from the first and second sidewalls 605 and 606. A top surface of the convex portion B may be in parallel with the bottom surface of the concave portion A. The concave portion A and the convex portion B of the substrate 601 may be defined by partially etching a portion of a substrate corresponding to the concave portion A. In this case, the substrate 600 may be a single body substrate.

The substrate 601 may include a cell region α and a peripheral circuit region β. In the cell region α, a memory cell may be disposed. The cell region α may include the concave portion A and the convex portion B. The peripheral circuit region β may include a peripheral circuit. The peripheral circuit region β may include the convex portion B.

The cell region α may include a first contact region CR1 adjacent to the first sidewall 605 of the concave portion A, and a second contact region CR2 adjacent to the second sidewall 606. A cell array region CAR may be disposed between the first contact region CR1 and the second contact region CR2. That is, the first contact region CR1 and the second contact region CR2 may be spaced apart from each other with the cell array region CAR in-between.

The substrate 601 may be a single crystalline semiconductor substrate (e.g., p-type silicon wafer). The substrate 601 may include a well. The well may be formed by introducing a dopant into the substrate 601. The dopant may be introduced by a doping process including an ion implantation or a plasma implantation. A common source region 602 may be provided in an upper portion of the substrate 601. The common source region 602 may be formed by doping a dopant into the well. The common source region 602 may include a dopant having a conductive type, which is different from the conductive type of the well. In one embodiment of the present disclosure, the common source region may be formed in the bottomed region of the trench. For example, the well may include a p-type dopant and the common source region 602 may include an n-type dopant.

Sacrificial layers SC1-SC6 and insulating layers 610-615 may be alternatingly stacked on the concave portion A of the substrate 601. For example, the first sacrificial layer SC1, the first inter-gate insulating layer 610, the second sacrificial layer SC2, the second inter-gate insulating layer 611, the third sacrificial layer SC3, the third inter-gate insulating layer 612, the fourth sacrificial layer SC4, the fourth inter-gate insulating layer 613, the fifth sacrificial layer SC5, the fifth inter-gate insulating layer 614, the sixth sacrificial layer SC6 and the string select insulating layer 615 may be sequentially formed. The sacrificial layers SC1-SC6 and the insulating layers 610-615 may be also formed on the top surface of the convex portion B. Each of the sacrificial layers SC1-SC6 and the insulating layers 610-615 may include a bottom portion on the bottom surface 603 of the concave portion A, and a sidewall portion extended over the first sidewall 605 and the second sidewall 606. The material of the sacrificial layers may be a material that can be selectively removed. For example, the sacrificial layer comprises silicon nitride, which can be selectively removed by phosphoric acid or phosphor containing acid.

The insulating layers 610-615 may include a silicon oxide layer. The sacrificial layers SC1-SC6 may be formed of materials that can minimize an etching of the insulating layers 610-615 and be selectively etched. For example, the sacrificial layers SC1-SC6 may include a silicon nitride layer.

A planarizing process may be performed by using the top surface of the convex portion B as an etch stop layer. The planarizing process may be performed by using any of an etch-back or a chemical mechanical polishing (CMP). The top surface of the convex portion B may be coplanar with top surfaces of the sidewall portions of the insulating layers 610-615. Top surfaces of the sidewall portions of the sacrificial layers SC1-SC6 may be coplanar with the top surfaces of the sidewall portions of the insulating layers 610-615 and the top surface of the convex portion B.

Referring to FIG. 16B, first openings 620 exposing the bottom surface 603 of the concave portion A of the substrate 601 may be formed by patterning the alternatingly stacked insulating layers 610-615 and sacrificial layers SC1-SC6. The patterning for forming the openings 620 may be performed by an anisotropic etching technique. The first openings 620 may expose the bottom surface 603 of the concave portion A, sidewalls of the insulating layers 610-615, and sidewalls of the sacrificial layers SC1-SC6.

Figure 16C:
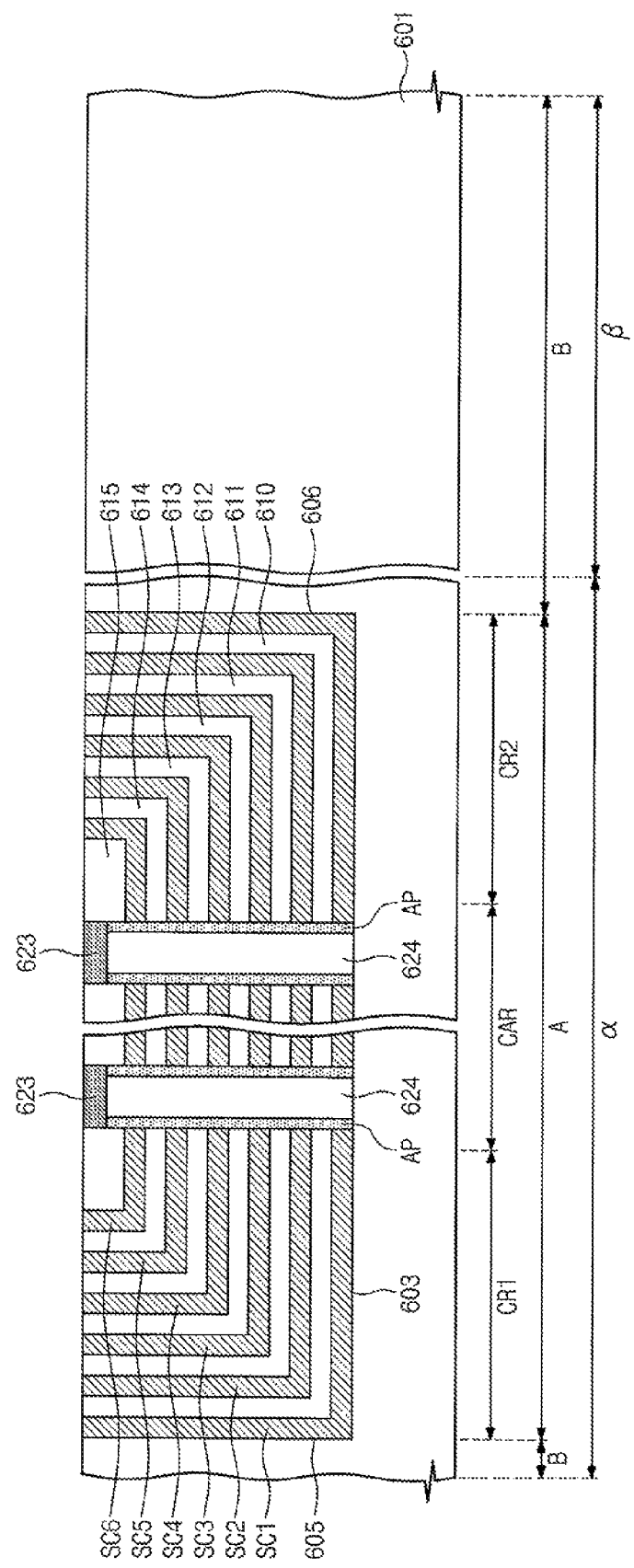

Referring to FIG. 16C, active memory string structures covering inner walls of the openings 620 may be formed. The active memory string structures may be formed by conformably covering the inner walls of the openings 620 using a chemical vapor deposition or atomic layer deposition (ALD). The active memory string structures may be formed in the same conductive type as the substrate 601 which the active memory string structures contact, so that the active memory string structures may be electrically connected with the substrate 601. For example, the active memory string structure may include a single crystalline silicon which is continuous with the substrate 601 without any crystal defect. For this purpose, the active memory string structures may be grown from the exposed substrate 601 by using one of epitaxial techniques. The remaining of the first openings 620 may be filled with an insulating material 624 (e.g., silicon oxide, silicon nitride or air). A drain region 623 may be formed at an upper portion of the active memory string structure. The shape of active may be pillar, tubular or bar-sided.

A preliminary gate separating region exposing the bottom surface 603 of the concave portion A of the substrate 601 may be formed by patterning the insulating layers 610-615 and the sacrificial layers SC1-SC6. The preliminary gate separating region may be formed between the active memory string structures adjacent in the second direction (See FIG. 14). Sidewalls of the insulating layers 610-615 and sidewalls of the sacrificial layers SC1-SC6 may be exposed by the preliminary gate separating region. The forming of the preliminary gate separating region may be the same as that of the first opening 620.

Figure 16D:
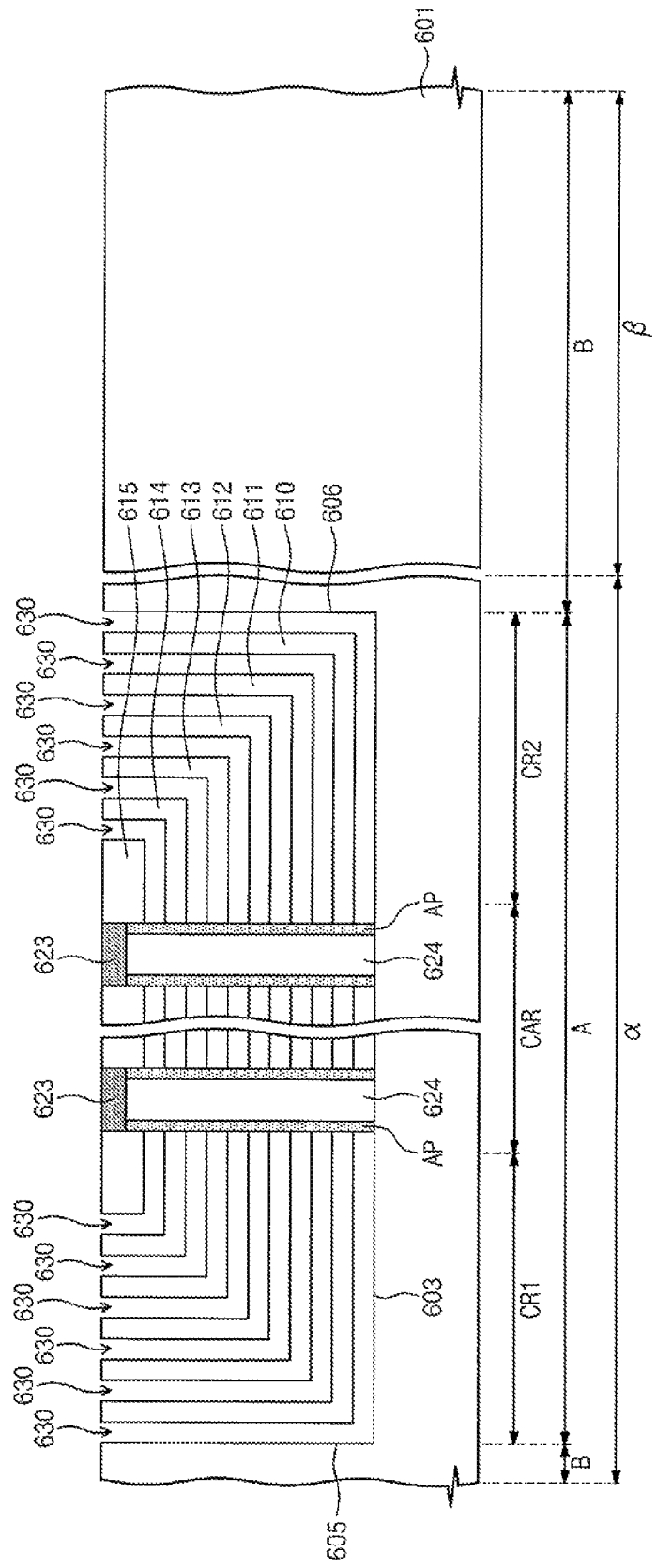

Referring to FIG. 16D, the sacrificial layers SC1-SC6 exposed by the preliminary gate separating region may be removed. Trenches for exposing sacrificial layers may be formed and removing the sacrificial layers is conducted by using the area formed by trenches. Gate regions 630 exposing the sidewalls of the active memory string structures may be formed between the insulating layers 610-615. The removing of the sacrificial layers SC1-SC6 may be performed by using an etch recipe having an etch selectivity with respect to the insulating material 624. The removing of the sacrificial layers SC1-SC6 may be performed by using a dry or wet etch, an isotropic etch, or both. At this time, filled active memory string structure and core portion of an insulating material may act as a supporter for sustaining insulating layers 610-615 for inter-gate layer.

Figure 16E:
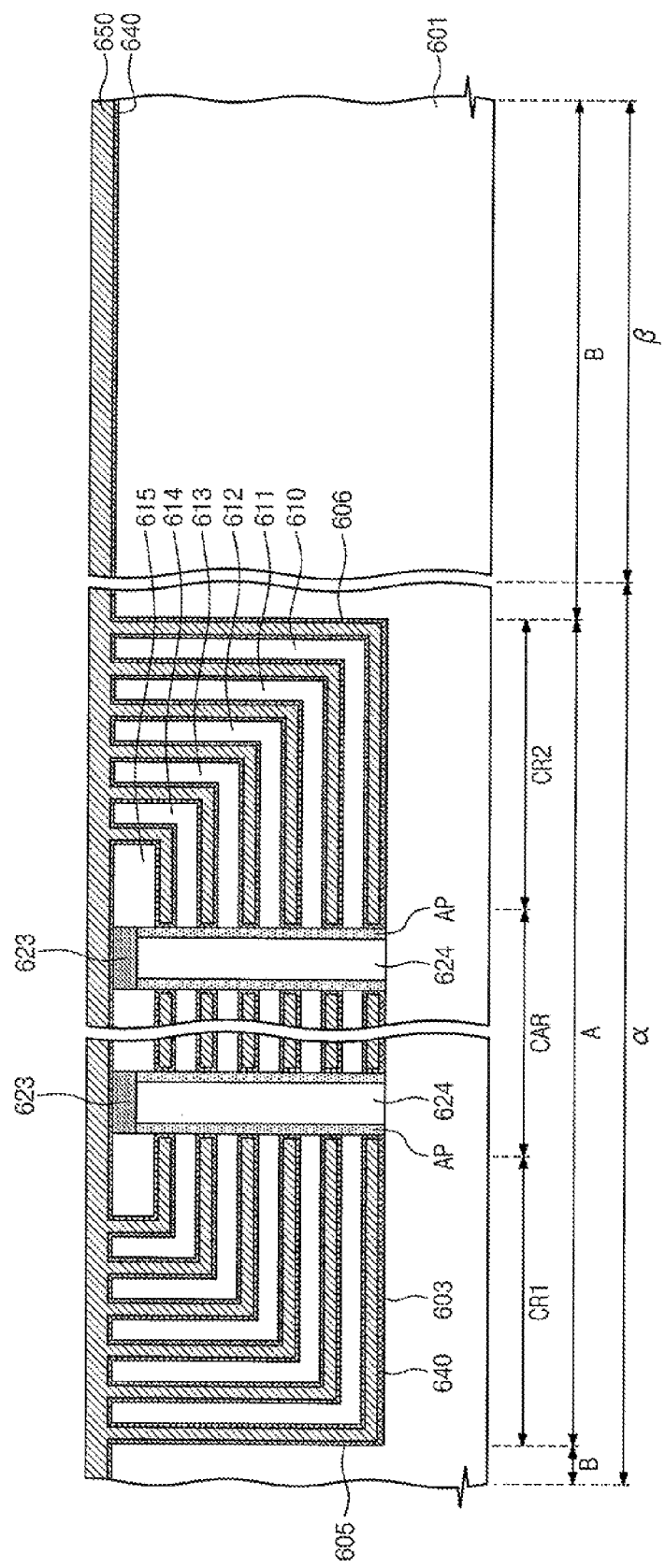

Referring to FIG. 16E, layers including an information storage layer 640 may be conformably formed on the resultant substrate in which the gate regions 630 are formed. The information storage layer 640 may be formed on the sidewalls of the active memory string structures exposed by the gate regions 630. Layers including the information storage layer 640 may be formed on the top surface of the convex portion B, the top surface of the string select insulating layer 615, and portions of the insulating layers 610-615 exposed by the gate regions 630.

A method for forming the information storage layer 640 will now be described again with reference to FIG. 6. The forming of the information storage layer 640 may include forming a tunnel insulating layer 242 covering the sidewalls of the active memory string structures, forming a charge storage layer 244 covering the tunnel insulating layer 242, and forming a blocking layer covering the charge storage layer 244.

Again referring to FIG. 16E, a preliminary gate conductive layer 650 filling the preliminary gate separating regions and the gate regions may be formed on the information storage layer 640. The preliminary gate conductive layer 650 may include at least one selected from the group consisting of a polycrystalline silicon layer, silicide layers and metal layers, which are formed by using a chemical vapor deposition (CVD) or atomic layer deposition (ALD) providing a superior step coverage. Meanwhile, since the information storage layer 640 is also formed on the substrate 601, the preliminary gate conductive layer 650 may be electrically separated from the substrate 601.

Figure 16F:
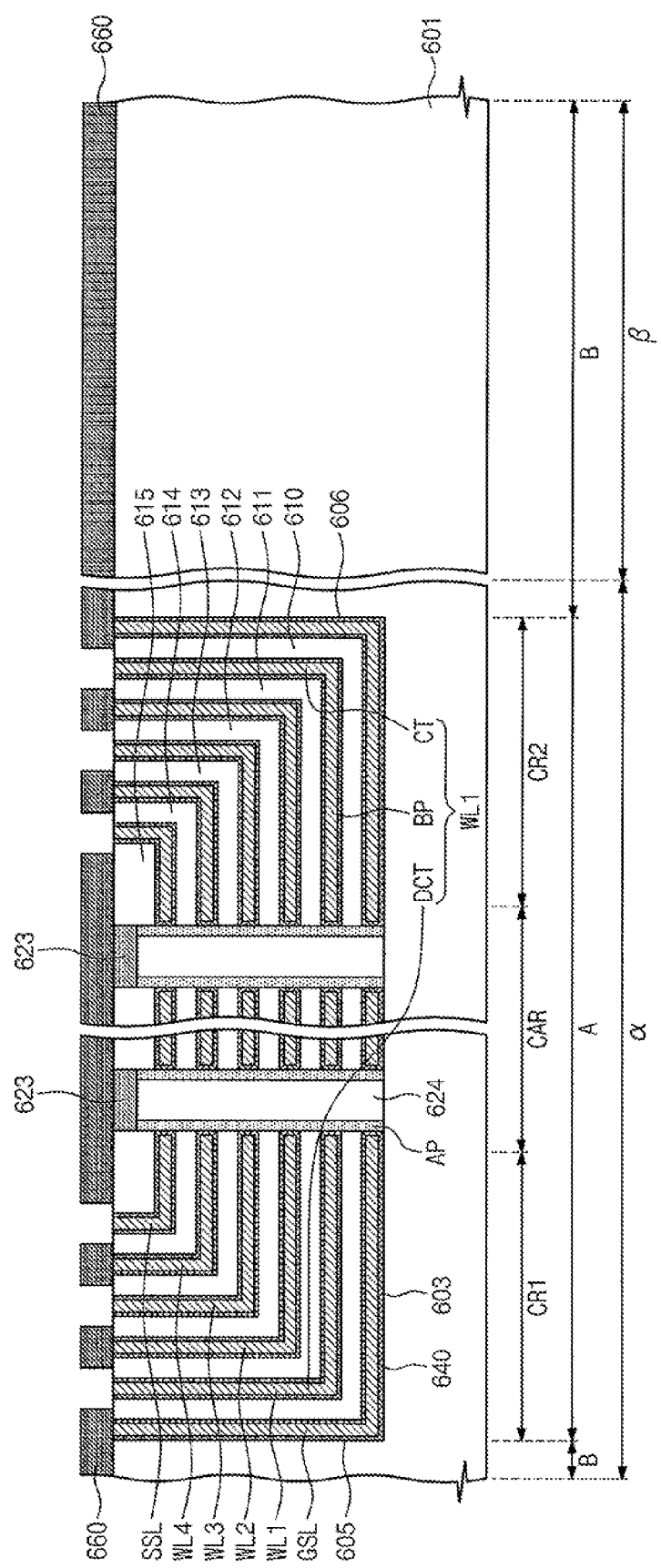

Referring to FIG. 16F, after the preliminary gate conductive layer 650 is formed, an etch process may be performed. The etch process may be performed by using a wet etch, dry etch or both. The preliminary gate conductive layer 650 and the information storage layer 640 on the top surface of the convex portion B may be removed. The preliminary gate conductive layer 650 of the preliminary gate separating region may be removed.

Next processes in this embodiment may be similar to those in the embodiment as demonstrated in FIGS. 13F to 13G.

By patterning the preliminary gate conductive layer 650, conductive patterns GSL, WL1-WL4, SSL may be formed.

The conductive patterns GSL, WL1-WL4, SSL may include bottom portions BP disposed above the bottom surface 603 of the concave portion A. The conductive patterns GSL, WL1-WL4, SSL may include contact inclining portions CT extended over one of the first sidewall 605 and the second sidewall 606 from one ends of the bottom portions BP. A contact region where the contact inclining portion of any one of the conductive patterns is disposed may be different from a contact region where the contact inclining portion of another conductive pattern adjacent to the any one of the conductive patterns. An exposed top surface of the contact inclining portion CT may be coplanar with the top surface of the convex portion 8.

The conductive patterns GSL, WL1-WL4, SSL may include dummy inclining portions DCT extended over the other one of the first sidewall 605 and the second sidewall 606 from the other ends of the bottom portions BP above the bottom surface 603. A contact region where the dummy inclining portion of any one of the conductive patterns GSL, WL1-WL4, SSL is disposed may be different from a contact region where the dummy inclining portion of another conductive pattern adjacent to the any one of the conductive patterns. Each of the conductive patterns GSL, WL1-WL4, SSL may include one contact inclining portion CT and one dummy inclining portion DCT.

A mask pattern 660 covering the exposed top surface of the contact inclining portions may be formed. The mask pattern 660 may expose the dummy inclining portions DCT. The forming of the mask pattern 660 may include forming a mask layer on the substrate 601, and patterning the mask layer. The mask pattern 660 may include a material having an etch selectivity with respect to the conductive patterns GSL, WL1-WL4, SSL and the insulating layers 610-615. For example, the mask pattern 660 may include a silicon nitride layer or a photoresist pattern.

Figure 16G:
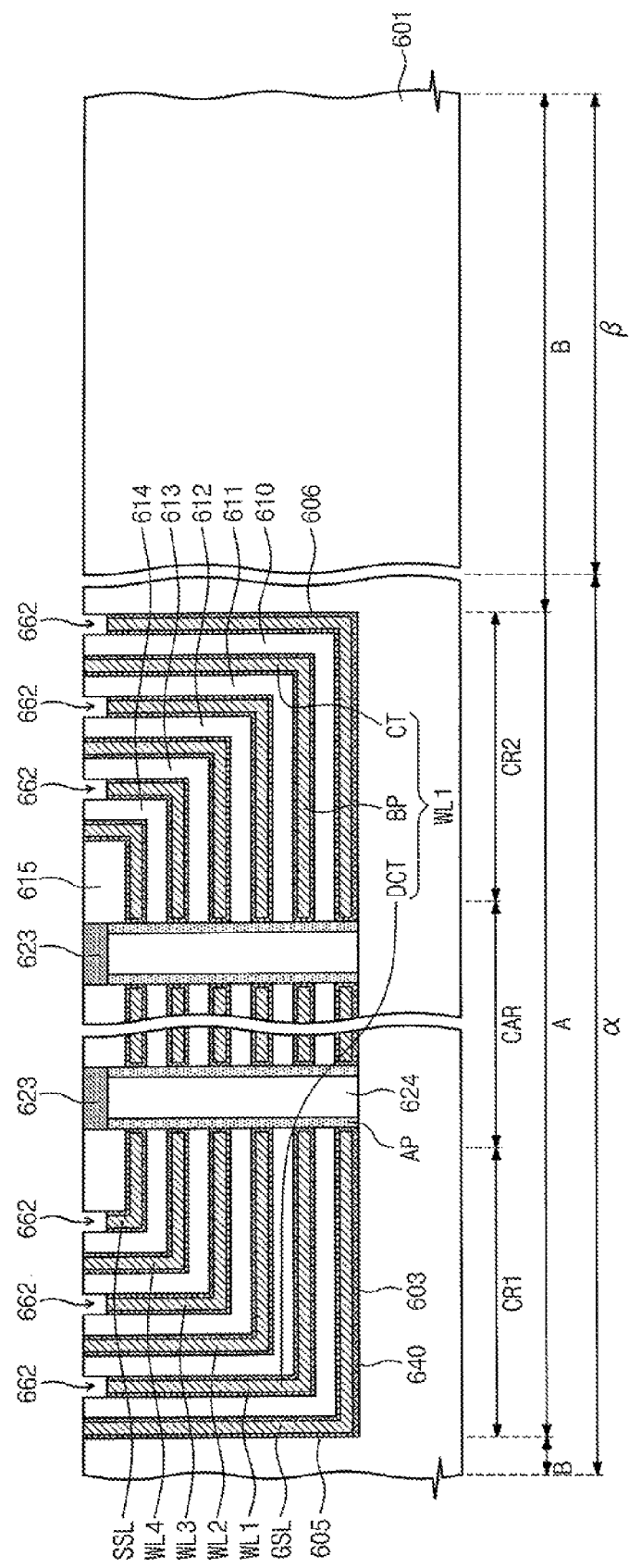

Referring to FIG. 16G, the dummy inclining portions DCT may be partially etched by using the mask pattern 660 as an etch mask. As a result, dummy recess portions 662 may be formed. Lengths of the dummy inclining portions DCT may be shorter than lengths of the contact inclining portions CT. Due to the dummy recess portions 522, sidewalls of the insulating layers 610-615 may be partially exposed. The etching of the dummy inclining portions DCT may be performed by using an etch recipe in which the etch rate of the conductive patterns GSL, WL1-WL4, SSL is higher than that of the mask pattern 660 and the insulating layers 610-615. Thereafter, the mask pattern 660 may be removed.

Referring to FIG. 16H, a dummy insulating layer pattern 664 filling the dummy recess portions 662 may be formed. The forming of the dummy insulating layer pattern 664 may include forming a dummy insulating layer on the substrate 601, and performing a planarizing process by using the top surface of the convex portion B or a top surface of the string select insulating layer 615 as an etch stop layer. A top surface of the dummy insulating layer pattern 664 may be coplanar with the top surface of the convex portion B. The top surface of the dummy insulating layer pattern 664 may be coplanar with the top surfaces of the string select insulating layer 615 and the contact inclining portion CT.

A gate insulating layer 674 may be formed on the top surface of the convex portion B. The gate insulating layer 674 may be formed through a thermal oxidation process. The gate insulating layer 674 may include a silicon oxide layer having a thickness ranging from about 40 angstroms to about 300 angstroms. In the case where the gate insulating layer 674 is formed by a thermal oxidation process, an oxide layer may be formed on the top surface of the contact inclining portion CT of the conductive patterns GSL, WL1-WL4, SSL of the exposed cell region α. Therefore, prior to forming of the gate insulating layer 674, a mask layer covering the concave portion A and exposing the convex portion B may be additively formed. The mask layer may be an insulating layer.

A gate electrode 676 may be formed on the gate insulating layer 674. Source and drain regions 673 may be formed in the convex portion B at both sides of the gate electrode 676. The source and drain regions 673 may be regions doped with a high concentration of dopant.

Referring to FIG. 16I, a gate spacer 678 may be formed on both sidewalls of the gate electrode 676. A first interlayer insulating layer 680 covering an entire surface of the substrate 601 may be formed. The first interlayer insulating layer 680 may include a silicon oxide layer. A contact opening 686 exposing the top surface of the contact inclining portions CT, a bit line opening 684 exposing the drain region 623 and a peripheral circuit opening 686 exposing the gate electrode 676 of the peripheral circuit region β may be formed by etching the first interlayer insulating layer 680. An opening exposing the source and drain regions 673 of the peripheral circuit region β may be also formed. The etching of the first interlayer insulating layer 680 may include etching the first interlayer insulating layer 680 using an anisotropic etching.

As aforementioned, in the case where the gate insulating layer 674 is formed by a thermal oxidation process and the mask layer is formed on the top surface of the contact inclining portions CT of the conductive patterns GSL, WL1-WL4, SSL of the cell region α, the mask layer may be etched to expose the contact inclining portions CT while the first interlayer insulating layer 680 is etched. Unlike this, in the case where the gate insulating layer 674 is formed by a thermal oxidation process but an oxide layer is formed on the top surfaces of the contact inclining portions CT of the conductive patterns GSL, WL1-WL4, SSL because a mask layer is not formed on the top surfaces of the contact inclining portions CT of the conductive patterns GSL, WL1-WL4, SSL, the oxide layer may be etched to expose the contact inclining portion CT while the first interlayer insulating layer 680 is etched.

Again referring to FIG. 15A, contact plugs GCP, CP, bit line contact plugs BLCP and a peripheral circuit contact plug PCP respectively filling the contact opening 682, the bit line opening 684 and the peripheral circuit opening 686 may be formed.

The ground select contact plug GCP may be electrically connected with the contact inclining portion CT of the ground select line GSL. The word line contact plugs CP may be electrically connected with the word lines WL1-WL4. Each of the contact plugs GCP, CP may include a material having conductivity higher than the conductive patterns GSL, WL1-WL4. The peripheral circuit contact plug PCP may be electrically connected with the gate electrode 676. The peripheral circuit contact plug PCP may include a material having conductivity higher than the gate electrode 676. For example, the contact plugs GCP, CP, the bit line contact plug BLCP and the peripheral circuit contact plug PCP may include tungsten.

A second conductive line ML2 may be formed on the ground select contact plug GCP. A first conductive line ML1 may be formed on the word line contact plug CP. A bit line BL may be formed on the bit line contact plug BLCP. A fourth conductive line ML4 may be formed on the peripheral circuit contact plug PCP. The forming of the second conductive line ML2, the first conductive line ML1, the bit line BL and the fourth conductive line ML4 may include forming a conductive layer on the first interlayer insulating layer 680 and patterning the conductive layer.

A second interlayer insulating layer 690 covering the second conductive line ML2, the first conductive line ML1 and the fourth conductive line ML4 may be formed. The second interlayer insulating layer 690 may include the same material as the first interlayer insulating layer 680. A string select contact plug SCP penetrating the second interlayer insulating layer 690 and filling an opening exposing the contact inclining portion of the string select line SSL may be formed. The string select contact plug SCP may include a material having conductivity higher than the string select line SSL. A third conductive line ML3 may be formed on the string select contact plug SCP. The forming of the third conductive line ML3 may include forming a conductive layer on the second interlayer insulating layer 690 and patterning the conductive layer. By doing so, the semiconductor device described with reference to FIG. 15A may be provided.

Methods for forming semiconductor devices according to modified examples are now addressed.

A method for forming a semiconductor device according to the modified example of the six embodiment of the inventive concept, described with reference to FIG. 15B will now be described.

Referring to FIG. 15B, in the method of forming a semiconductor device described with reference to FIGS. 16A to 16I, and FIG. 15A, the forming of the concave portion A and the convex portion B of the substrate 600 may include forming an insulating layer 604 on the substrate 600, etching the insulating layer 604 on the concave portion A, and leaving the insulating layer 604 on the convex portion B.

In the method for forming the peripheral circuit described with reference to FIG. 15B, a semiconductor layer 672 may be formed on the convex portion B of the peripheral circuit region β. For example, the semiconductor layer 672 may be formed by bonding the semiconductor layer 672 on the insulating layer 604 of the convex portion B or growing the semiconductor layer 672. For example, the semiconductor layer 672 may include a single crystalline silicon or polycrystalline silicon. A gate insulating layer 674 may be formed on the semiconductor layer 672.

A method for forming a semiconductor device according to another modified example of the sixth embodiment of the inventive concept, described with reference to FIG. 15C will now be described.

Referring to FIG. 15C, in the method for forming a semiconductor device described with reference to FIGS. 16A to 16I and FIG. 15A, at least one of the first sidewall 605 and the second sidewall 606 may be formed inclined with respect to the bottom surface 603. In this case, the contact inclining portions CT and the dummy inclining portions DCT may be formed inclined with respect to the bottom surface 603 and the bottom portions BP. The sidewall portions of the insulating layers 510-615 may be formed inclined with respect to the bottom surface 603.

The semiconductor devices according to the first to third embodiments of the inventive concept may be formed with reference to the methods for forming a semiconductor device described with reference to the foregoing FIGS. 12A to 12C and FIGS. 13A to 13H.

The semiconductor devices according to the second embodiment and the fourth embodiment of the inventive concept may be formed with reference to the methods for forming a semiconductor device described with reference to the foregoing FIGS. 15A to 15C and FIGS. 16A to 16I.

Application examples of the inventive concept will now be described.

Figure 17:
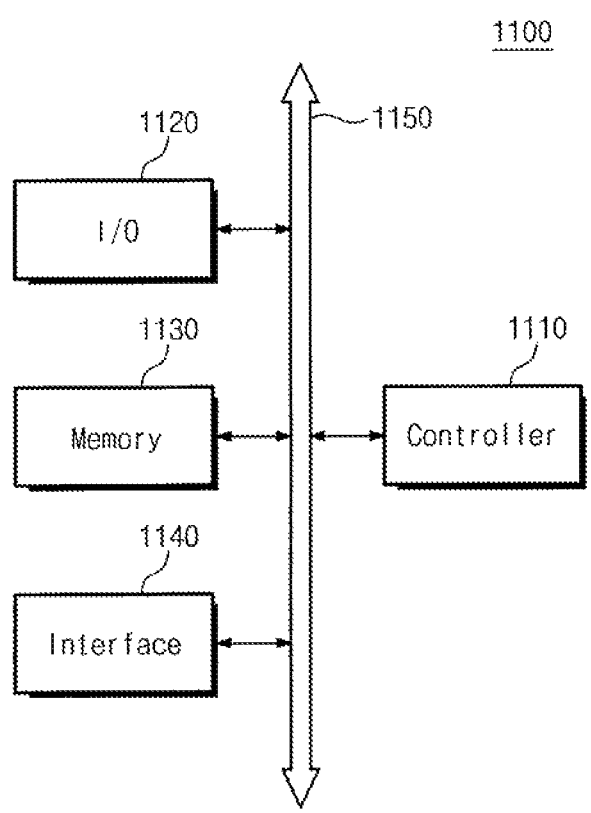
FIG. 17 shows a schematic block diagram of a memory system including a semiconductor device in accordance with an exemplary embodiment of the present disclosure.

FIG. 17 is a block diagram of a memory system including a semiconductor device according to embodiments of the inventive concept.

Referring to FIG. 17, a memory system 1100 is applicable to personal data assistants (PDAs), portable computers, web tablets, wireless phones, mobile phones, digital music players, memory cards, and any other device capable of transmitting and/or receiving data wireless environments.

The memory system 1100 includes a controller 1110, an input/output device 1120 (e.g., a keypad, keyboard, and a display), a memory 1130, an interface 1140, and a bus 1150. The memory 1130 and the interface 1140 communicate with each other through the bus 1150.

The controller 1110 includes at least one microprocessor, a digital signal processor, a microcontroller, or other similar processor devices. The memory 1130 may be used to store commands executed by the controller 1110. The input/output device 1120 may receive/output data or signals from/to an external device of the memory system 1100. For example, the input/output device 1120 may include a keyboard, a keypad, or a display device.

The memory 1130 includes a nonvolatile memory device according to the embodiments of the inventive concept. The memory 1130 may further include random-access nonvolatile memories and other types of memories.

The interface 1140 serves to transmit/receive data to/from a communication network.

Figure 18:
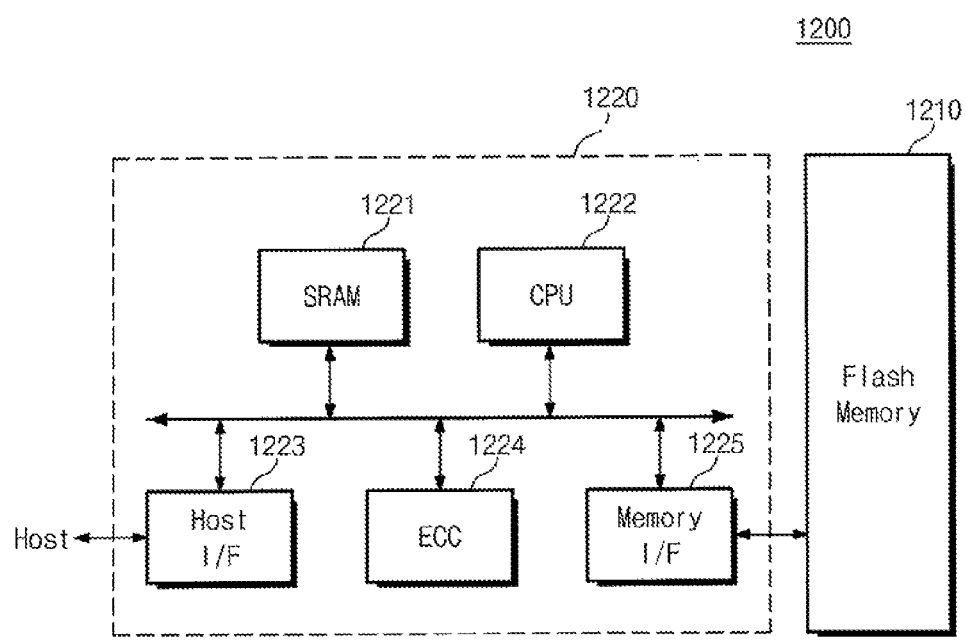
FIG. 18 shows a schematic block diagram of a memory card having a semiconductor device in accordance with an exemplary embodiment of the present disclosure.

FIG. 18 is a block diagram of an example of a memory card having a semiconductor device according to embodiments of the inventive concept.

Referring to FIG. 18, a memory card 1200 for supporting high-capacity data storage is mounted with a flash memory device 1210 according to the inventive concept. The memory card 1200 includes a memory controller 1220 for controlling data exchange between a host and the flash memory device 1210.

An SRAM 1221 is used as a working memory of a processing unit 1222. A host interface 1223 has a data exchange protocol for the host connected to a memory card 1200. An error correction block 1224 detects and corrects an error in data read from the multi-bit flash memory device 1210. A memory interface 1225 interfaces with the flash memory device 1210. The processing unit 1222 performs control operations for data exchange of the memory controller 1220. Although not illustrated in FIG. 18, those skilled in the art will readily understand that the memory card 1200 may further include a ROM storing code data for interfacing with the host.

Figure 19:
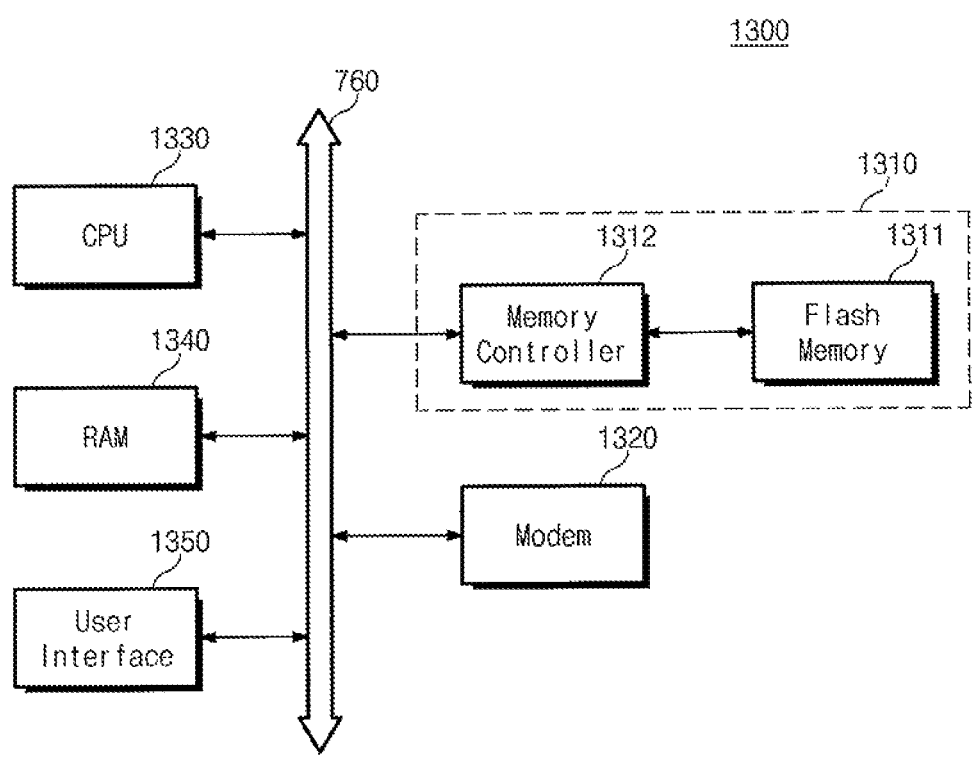
FIG. 19 shows a schematic block diagram of an information processing system mounted with a semiconductor device in accordance with an exemplary embodiment of the present disclosure.

FIG. 19 is a block diagram of an example of an information processing system mounted with a semiconductor device according to the inventive concept.

Referring to FIG. 19, a flash memory device 1310 of the inventive concept is mounted on an information processing system 1300 such as a mobile device or a desktop computer. The information processing system 1300 includes a flash memory system 1310, a modem 1320, a central processing unit (CPU) 1330, a random access memory (RAM) 1340, and a user interface 1350 that are electrically to a system bus 1360. The flash memory system 1310 may be configured in substantially the same structure as the afore-mentioned memory system or flash memory system. Data, which are processed by the CPU 1330 or received from an external device, are stored in the flash memory system 1310. Herein, the flash memory system 1310 may be configured to include a solid state drive (SSD). In this case, the information processing system 1300 can stably store a large amount of data in the flash memory system 1310. According to an increase in reliability, the flash memory system 1310 can reduce resources taken for error correction, thus providing a high-speed data exchange function to the information processing system 1300. Although not illustrated in FIG. 19, those skilled in the art will readily understand that the information processing system 1300 may further include an application chipset, a camera image processor (CIS), and an input/output device.

Furthermore, the flash memory or flash memory system according to embodiments of the inventive concept may be mounted in various types of packages. Examples of the packages of the flash memory or flash memory systems according to embodiments of the inventive concept may include package on package (PoP), ball grid arrays (BGAs), chip scale packages (CSPs), a plastic leaded chip carrier (PLCC), a plastic dual in-line package (PDIP), a multi chip package (MCP), a wafer-level package (WP), a wafer-level fabricated package (WFP), a wafer-level processed stack package (WSP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP) and so on.

Figure 20:
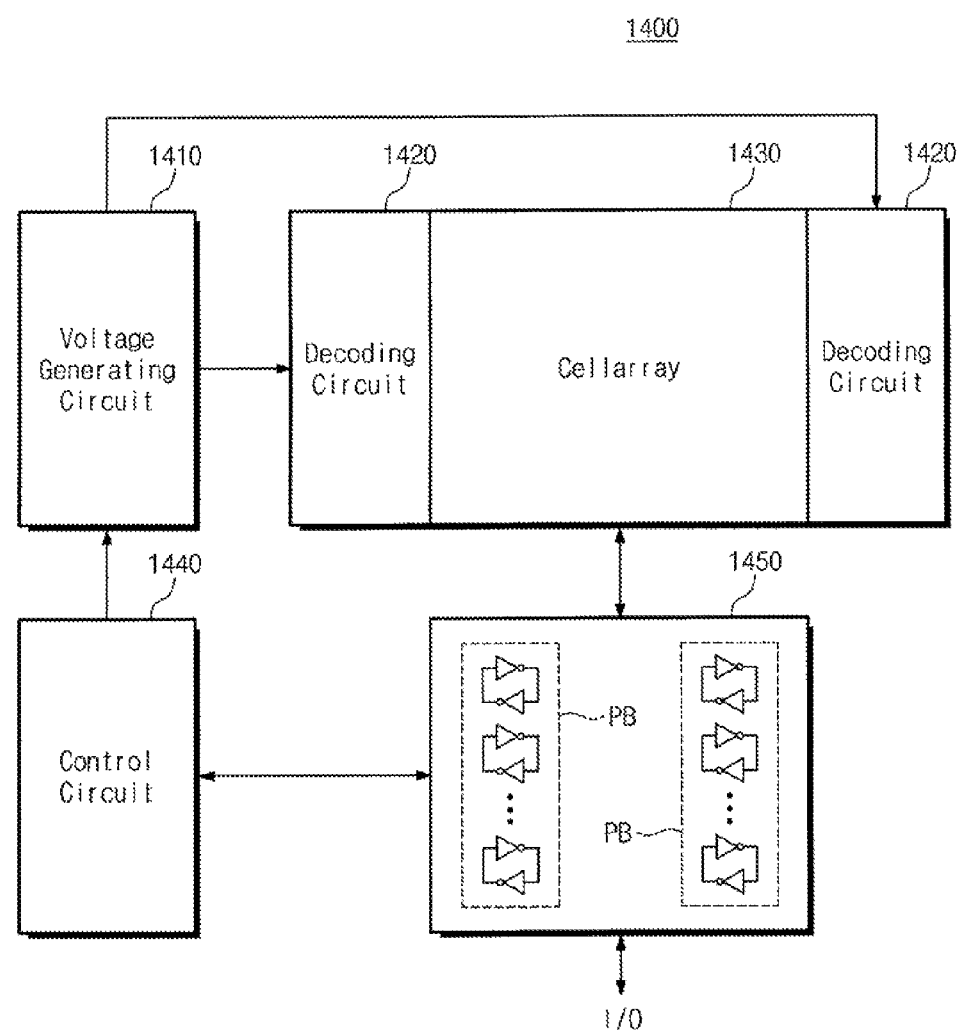
FIG. 20 shows a schematic block diagram of a nonvolatile memory device in accordance with an exemplary embodiment of the present disclosure.

FIG. 20 is a block diagram of a nonvolatile memory device according to the inventive concept. Referring to FIG. 20, a nonvolatile memory device 1400 according to the inventive concept includes a memory cell array 1430, a control logic circuit 1440, a voltage generator 1410, a decoding circuit 1420 (e.g., a row decoder) disposed on each side of the cell array 1430, and a page buffer 1450. The semiconductor memory device may comprises a substrate, a memory string disposed on and substantially normal to the substrate, the memory string comprising a plurality of storage cells, a plurality of word lines; and at least two row decoders. The plurality of word lines have a first group of word lines electrically connected to one row decoder at a first side of the memory string and a second group of word lines electrically connected to the other row decoder at a second side of the memory string. The interconnections, extending outside one edge of the cell array portion at one and the other side may be connected to row decoders at both sides. In this regard, the first row decoder may be connected to one group of string select lines (SSLs) at a first side of the memory string, and the second row decoders is connected to another group of SSLs at a second side of the memory string. Alternatively, either one of the two row decoders is connected to all of the string select lines (SSLs). The memory cell array 1400 includes memory cells that are arranged in a matrix configuration of rows or word lines and columns or bit lines. The memory cells may be arranged to have a NAND or a NOR structure. In the NAND structure, each memory cell string includes transistors that are connected in series. It will be easily understood that this inventive concept may be applied to a semiconductor device having word lines WL1-WLn, the edge of which are formed in staircase form so as to the conductive plug to connect each word line.

The control logic circuit 1440 is configured to control an overall operation of the nonvolatile memory device 1400. In an exemplary embodiment, the control logic circuit 1440 controls a series of program-related operations. For example, the control logic circuit 1440 may be a state machine storing a program sequence. However, it will be apparent to those skilled in the art that the control logic circuit 1440 is not limited to the contents disclosed herein. For example, the control logic circuit 1440 may be configured to control an erase operation and a read operation.

Under the control of the control logic circuit 1440, the voltage generator 1410 generates voltages to be applied to a selected word line, an unselected word line, a string select line SSL, a ground select line GSL, and a common source line CSL. Also, the voltage generator 1410 may generate a program voltage Vpgm, a pass voltage Vpass, a read voltage Vread, and a verify read voltage Vvfy.

Under the control of the control logic circuit 1440 drives a selected word line, unselected word lines, a string select line SSL, a ground select line GSL, and a common source line CSL in response to a row address.

The decoding circuit 1420 drives the above lines by using the voltages generated by the voltage generator 1410. For example, in a program operation, the decoding circuit 1420 applies a program voltage Vpgm and a pass voltage Vpass respectively to a selected word line and an unselected word line.

The page buffer 1450 operates as a sense amplifier or a write driver. In a read operation, the page buffer 1450 reads data from the memory cell array 1430. Specifically, the page buffer 1450 senses a bit line voltage, discriminates data according to the level of the bit line voltage, and stores the discriminated data therein.

According to the embodiments of the inventive concept, at least two active bars can be uniformly stacked on a semiconductor substrate without an electrical connection failure. Accordingly, dispersion of a plurality of cells formed in such a structure can be improved. In other words, nonvolatile memory devices configured to be suitable for high integration and having enhanced electrical characteristics can be realized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description of preferred embodiments.

What is claimed is:

1. A method of forming a semiconductor memory device, the method comprising:
   providing a substrate;
   forming a chamber on the substrate, the chamber including a first contact region, a second contact region and a cell array region between the first contact region and the second contact region;
   depositing a plurality of alternating insulating layers and conductive layers in the chamber, the conductive layers forming a plurality of even and odd word lines, each layer having a horizontal first portion and at least one inclined second portion; and
   recessing top surfaces of the inclined second portions of the even word lines at the first contact region and top surfaces of the second portions of the odd word lines at the second contact region.

2. The method of claim 1, wherein the recessing includes:
   forming a mask pattern exposing top surfaces of the second portions of the even word lines at the first contact region and top surfaces of the second portions of the odd word lines at the second contact region;
   etching the conductive layers by using the mask pattern as an etch mask to form recess portions exposing portions of sidewalls of the insulating layers; and
   forming insulating caps filling the recess portions.

3. The method of claim 2, wherein top surfaces of the insulating caps are coplanar with the top surfaces of the second portions of the even word lines at the second contact region.

4. The method of claim 1, wherein lengths of the second portions of the even word lines are shorter than lengths of the second portions of the odd word lines, at the first contact region, and lengths of the second portions of the odd word lines are shorter than lengths of the second portions of the even word lines, at the second contact region.

5. The method of claim 1, further comprising:
   forming first conductive lines disposed on the first contact region and electrically connected to top surfaces of the second portions of the odd word lines; and
   forming second conductive lines disposed on the second contact region and electrically connected to top surfaces of the second portions of the even word lines.

6. The method of claim 1, wherein the second portions of the even and odd word lines are disposed at an inclination angle between about 50 and about 90 degrees relative to the substrate.

7. The method of claim 1, wherein the chamber is recessed directly into the substrate.

8. The method of claim 1, wherein the chamber is formed on top of the substrate by forming insulating sidewalls thereon.

9. The method of claim 1, further comprising:
   forming a hole substantially normal to the substrate and extending through the layers to the substrate at the cell array region; and
   depositing a vertically inclined memory string into the hole, the memory string comprising a plurality of storage cells.

* * * * *